US010125931B2

(12) United States Patent
Livesay et al.

(10) Patent No.: US 10,125,931 B2
(45) Date of Patent: *Nov. 13, 2018

(54) BARRIER WITH INTEGRATED SELF COOLING SOLID STATE LIGHT SOURCES

(71) Applicants: William R. Livesay, San Diego, CA (US); Scott M. Zimmerman, Basking Ridge, NJ (US); Richard L. Ross, Del Mar, CA (US); Eduardo DeAnda, San Diego, CA (US)

(72) Inventors: William R. Livesay, San Diego, CA (US); Scott M. Zimmerman, Basking Ridge, NJ (US); Richard L. Ross, Del Mar, CA (US); Eduardo DeAnda, San Diego, CA (US)

(73) Assignee: Goldeneye, Inc.

( * ) Notice: Subject to any disclaimer, the term of this patent is extended or adjusted under 35 U.S.C. 154(b) by 48 days.

This patent is subject to a terminal disclaimer.

(21) Appl. No.: 14/071,636

(22) Filed: Nov. 4, 2013

(65) Prior Publication Data
US 2014/0226317 A1    Aug. 14, 2014

Related U.S. Application Data

(63) Continuation-in-part of application No. 13/572,608, filed on Aug. 10, 2012, now Pat. No. 8,575,641, and
(Continued)

(51) Int. Cl.
*F21V 29/00*    (2015.01)
*F21S 8/02*    (2006.01)
(Continued)

(52) U.S. Cl.
CPC .............. *F21S 8/026* (2013.01); *E04B 9/006* (2013.01); *E04B 9/04* (2013.01); *E04B 9/18* (2013.01);
(Continued)

(58) Field of Classification Search
CPC . F21V 29/70; F21V 9/16; F21V 11/14; F21V 21/041; F21V 21/048;
(Continued)

(56) References Cited

U.S. PATENT DOCUMENTS 6,234,643 B1 * 5/2001 Lichon, Jr. ............... F21S 8/02
                                                                                  362/147
6,457,844 B2 * 10/2002 Hess ........................ F21S 8/04
                                                                                  362/290
(Continued)

FOREIGN PATENT DOCUMENTS

DE        102009042434 A1 * 9/2011 ............ F21V 29/004

OTHER PUBLICATIONS

EPO Patent Translate 102009042434-Desc-en (English machine translation document) of DE 102009042434 A1 to Preuschl, Thomas, published Sep. 8, 2011, pp. 1-7.*

*Primary Examiner* — Alan Cariaso
(74) *Attorney, Agent, or Firm* — William Propp, Esq.

(57) ABSTRACT

An integrated barrier or partition (e.g. suspended ceiling, wall, etc.) containing lightweight solid state light sources wherein the light emitting surface of the light sources are the primary heat dissipating surfaces of the light sources. The light sources consisting of light emitting diodes (LED) in thermal contact to light transmitting thermally conductive elements and combined with a reflector element to form a light recycling cavity, provide both convective and radiative cooling from their light emitting surfaces, eliminating the need for external appended heat sinks. Seismically safe suspended ceilings contain integrated lighting where the lighting adds less than one gram per square foot to the structure. The lighting, integrated into but without penetrating the barrier (suspended ceiling, ceiling, wall, floor, etc.), is nonflammable and does not promote flame spread or
(Continued)

smoke generation. The lighting is easily incorporated into ceiling tiles, sheetrock, grid elements, painted and/or wallpapered surfaces.

14 Claims, 57 Drawing Sheets

Related U.S. Application Data a continuation-in-part of application No. 13/986,793, filed on Jun. 5, 2013, now abandoned, and a continuation-in-part of application No. 12/380,439, filed on Feb. 27, 2009, now Pat. No. 8,558,438.

(60) Provisional application No. 61/957,768, filed on Jul. 10, 2013, provisional application No. 61/574,925, filed on Aug. 11, 2011, provisional application No. 61/067,934, filed on Mar. 1, 2008.

(51) Int. Cl.

| | |
|---|---|
| *F21V 7/00* | (2006.01) |
| *F21V 29/506* | (2015.01) |
| *H01L 33/64* | (2010.01) |
| *H01L 23/00* | (2006.01) |
| *F21V 29/70* | (2015.01) |
| *F21V 29/503* | (2015.01) |
| *E04B 9/04* | (2006.01) |
| *F21V 25/12* | (2006.01) |
| *E04B 9/00* | (2006.01) |
| *E04B 9/18* | (2006.01) |
| *E04B 9/24* | (2006.01) |
| *H01L 33/50* | (2010.01) |
| *F21V 33/00* | (2006.01) |
| *F21Y 115/10* | (2016.01) |

(52) U.S. Cl.
CPC ............ *E04B 9/241* (2013.01); *F21V 7/0008* (2013.01); *F21V 25/12* (2013.01); *F21V 29/503* (2015.01); *F21V 29/506* (2015.01); *F21V 29/70* (2015.01); *H01L 24/73* (2013.01); *H01L 33/641* (2013.01); *F21V 33/006* (2013.01); *F21Y 2115/10* (2016.08); *H01L 33/501* (2013.01); *H01L 33/502* (2013.01); *H01L 33/644* (2013.01); *H01L 2224/16225* (2013.01); *H01L 2224/45144* (2013.01); *H01L 2224/48091* (2013.01); *H01L 2224/49107* (2013.01); *H01L 2224/8592* (2013.01); *H01L 2924/01322* (2013.01); *H01L 2924/12041* (2013.01); *H01L 2924/12042* (2013.01); *H01L 2924/181* (2013.01); *H01L 2924/1815* (2013.01)

(58) Field of Classification Search
CPC ...... F21V 21/049; F21V 29/86; F21V 29/503; F21V 29/506; F21V 7/0008; F21S 8/026; F21S 8/04; F21S 8/043; F21S 8/046; F21S 8/06; F21S 8/061; F21S 8/063; F21S 8/068; H01L 33/64; H01L 33/641; H01L 33/642; H01L 33/644; E04B 9/006; E04B 9/04; E04B 9/18; E04B 9/241
See application file for complete search history.

(56) References Cited

U.S. PATENT DOCUMENTS

| | | | |
|---|---|---|---|
| 6,481,173 B1* | 11/2002 | Roy | H04R 1/02 181/150 |
| 7,361,938 B2 | 4/2008 | Mueller et al. | |
| 7,422,801 B2 | 9/2008 | Yamashita | |
| 7,494,246 B2* | 2/2009 | Harbers | F21S 8/04 362/223 |
| 7,579,629 B2* | 8/2009 | Inoguchi | H01L 25/0753 257/98 |
| 7,722,220 B2* | 5/2010 | Van De Ven | F21V 29/2212 362/294 |
| 7,736,019 B2* | 6/2010 | Shimada | F21S 8/026 362/231 |
| 7,855,449 B2 | 12/2010 | De Graff et al. | |
| 7,915,627 B2* | 3/2011 | Li | F21K 9/135 257/98 |
| 7,922,351 B2* | 4/2011 | Welker | F21S 8/02 362/147 |
| 8,071,997 B2* | 12/2011 | Scotch | H01L 33/641 257/707 |
| 8,481,977 B2 | 7/2013 | Beeson et al. | |
| 8,851,716 B2* | 10/2014 | Bertram | F21V 3/02 313/44 |
| 9,062,838 B1* | 6/2015 | Merrill, Jr. | F21S 8/026 |
| 2004/0242290 A1* | 12/2004 | Keeling | H04W 88/08 455/575.1 |
| 2006/0262521 A1* | 11/2006 | Piepgras | E04B 9/006 362/149 |
| 2009/0140271 A1* | 6/2009 | Sah | F21K 9/00 257/88 |
| 2009/0217970 A1 | 9/2009 | Zimmerman et al. | |
| 2010/0290208 A1* | 11/2010 | Pickard | B60Q 1/0052 362/84 |
| 2011/0175533 A1* | 7/2011 | Holman | E04B 9/32 315/130 |
| 2014/0049957 A1* | 2/2014 | Goelz | F21V 29/763 362/235 |

* cited by examiner

BARRIER WITH INTEGRATED SELF COOLING SOLID STATE LIGHT SOURCES

REFERENCE TO PRIOR APPLICATION

This application is a continuation-in-part of U.S. patent application Ser. No. 13/572,608, filed Aug. 10, 2012, which is herein incorporated by reference, and which claimed the benefit of U.S. Provisional Patent Application No. 61/574,925, filed Aug. 11, 2011, which is also herein incorporated by reference. This application also claims the benefit of U.S. Provisional Patent Application No. 61/957,768, filed Jul. 10, 2013, which is also herein incorporated by reference. This application also claims the benefit of U.S. patent application Ser. No. 13/986,793 filed Jun. 5, 2013, which is a continuation-in-part of U.S. patent application Ser. No. 12/380,439 filed on Feb. 27, 2009, which claimed the benefit of U.S. Provisional Patent Application 61/067,934 filed on Mar. 1, 2008, which is also herein incorporated by reference.

BACKGROUND OF THE INVENTION

Installing lighting in rooms, industrial spaces, suspended ceilings, walls, etc. has been problematic due the weight of the light sources and the need to penetrate the barriers creating these enclosed illuminated spaces. Solid state light sources have offered the promise of more light weight lighting fixtures however that promise has not been fully fulfilled. LEDs unlike conventional light sources such as incandescent bulbs cannot effectively cool themselves.

As such additional appended heatsinks or cooling means are required to prevent overheating. This increases the cost of not only the light sources due to shipping costs and materials costs but also the fixtures that use those light sources. It also results in heavy light source fixtures. In general, the need exists for articles and means which allow LEDs to be used without the need for additional heatsinking means. These appended heatsinks due to the size and unattractive appearance are typically hidden in the barrier or other side of the barrier (ceiling, wall, etc.)

It is desirable to minimize the temperature difference between the junction or active region of the semiconductor device and the ambient atmosphere to effectively cool small semiconductor devices. It is also desirable to minimize the surface area needed to dissipate the heat generated by the semiconductor devices to the ambient atmosphere. While high thermal conductivity materials can be used to spread the heat out over a very large area, these high thermal conductivity materials come with the addition of significant weight and cost. In conventional LED devices several layers of interconnect exist between the LED die and the final light source. This approach is used because the lighting fixture manufacturers have historically not been required or had the capability to wirebond, flip chip attach or even solder components into their fixtures. Also the need to regularly replace light sources such as incandescent bulbs has led to a wide range of quick change interconnects like sockets and pin based connector.

Lightweight self cooling solid state light sources would offer significant benefits to fixture manufacturers. Incandescent bulbs for instance are very lightweight generating over 1000 lumens while weighing only 50 grams and as such can be easily held in place using even simple pins and sockets. For the typical LED sources, this is not the case. The added weight of the heatsink and the need for a low resistance thermal connection between the LED package and the heatsink necessitates the use of complex multiple level interconnects. The need exists for LED light sources which are lightweight and easily incorporated into a wide range of lighting fixtures without the need for additional heatsinking or cooling means.

Historically, light sources have cooled themselves as stated earlier. In the case of incandescent and fluorescent tubes, the glass envelope surrounding the sources, and the filament or arc itself transfers the excess heat generated via convection and radiation. An incandescent bulb glass envelope can exceed 150° C. and a halogen's quartz envelope may exceed several hundred degrees Celsius. Radiative power scales as the fourth power of the temperature. A naturally convectively cooled surface with a surface temperature of 50° C. in a 25° C. ambient will transfer only about 5% of its energy to the surrounding ambient radiatively. A naturally convectively cooled surface with a surface temperature of 100° C. can transfer 20% of its energy to the surrounding ambient radiatively. The typical LED junction temperature for high powered devices can be over 120° C. and still maintain excellent life and efficiency. For surfaces with temperatures less than 120° C. the majority of the radiated energy is in the infrared with a wavelength greater than 8 microns.

Heat generated within the LEDs and phosphor material in typical prior art solid state light sources is transferred via conduction means to a much larger heatsink usually made out of aluminum or copper. The temperature difference between the LED junction and heatsink can be 40 to 50° C. The temperature difference between ambient and heatsink temperature is typically very small given the previously stated constraints on the junction temperatures of LEDs. This small temperature difference not only eliminates most of the radiative cooling but also requires that the heatsink be fairly large and heavy to provide enough surface area to effectively cool the LEDs. This added weight of the heatsink increases costs for shipping, installation and poses a safety risk for overhead applications. For example lighting in a typical industrial or office building will use troffers. These troffers which are typically 2 foot by 4 foot house fluorescent tubes and weigh as much as 30 pounds including the electronic ballasts. The four foot fluorescent tubes by themselves weigh 200 grams each. These troffers have to be separately rigged and supported independent of the suspended ceiling. They pose a safety hazard in the event of a severe earthquake. They also typically pose a fire hazard as the diffusing elements which interface to the occupant side of the room are made out of flammable materials (e.g. plastic). In newer installations light emitting diode (LED) based solid state troffers are being use to replace fluorescent troffers. These solid state troffers however still require large and heavy appended heatsinks to dissipate the excess heat from the LEDs. They also use large plastic diffusers to spread the light out over a larger surface.

Surprisingly, much like conventional incandescent, halogen and fluorescent light sources, conventional solid-state light source are not typically flame resistant or even conform to Class 1 or Class A building code requirements. There are two types of fire hazards indirect (where lamp/fixture is exposed to flames) and direct (where the lamp/fixture creates the flames). Conventional solid-state lamps and fixtures can pose both indirect and direct fire threats because they use large quantities of organic materials that can burn.

Even though the LED die are made using inorganic material such as nitrides or AlInGaP which are not flammable, these LED die are typically packaged using organic materials or mounted in fixtures which contain mostly organic materials. Organic LEDs or OLEDs not only are mostly organic but also contain toxic materials like heavy metals like ruthenium which can be released if burned. Smoke generated from the burning of these materials is not only toxic but one of the leading causes of death in fires due to smoke inhalation. Incandescent and fluorescent lighting fixtures typically are composed of sheet metal parts and use glass or flame retardant plastics designed specifically to meet building code requirements. It is therefore advantageous that solid state light sources be constructed of non-flammable and non-toxic materials especially in commercial applications like suspended ceilings. This is for the benefit of both for occupants and firefighters. Organic materials containing heavy metals and nanoparticles such as quantum dots are especially problematic.

As an example, solid-state panel lights typically consist of acrylic or polycarbonate waveguides which are edge lit using linear arrays of LEDs. A couple of pounds of acrylic can be in each fixture. Integrating these fixtures into a ceiling can actually lead to increased fire hazard. Other troffer designs rely on large thin organic films to act as diffusers and reflectors as seen in recent LED troffer designs. During a fire these organic materials pose a significant risk to firefighters and occupants due to smoke and increased flame spread rates. In many cases, the flame retardant additives typically used to make polymers more flame retardant that were developed for fluorescent and incandescent applications negatively impacts the optical properties of waveguides and light transmitting devices. Class 1 or Class A standards cannot be met by these organic materials. As such a separate standard for optical transmitting materials UL94 is used in commercial installations. The use of large amounts of these organic materials in conventional solid-state light sources greatly increases the risks to firefighters and occupants due to their high smoke rate and tendency to flame spread when exposed to the conditions encountered in a burning structure. A typical commercial installation with a suspended ceiling contains 10% of the surface area as lighting fixtures. The ceiling tiles are specifically designed to act as a fire barrier between the occupants and the plenum above the suspended ceiling. The lighting fixtures compromise the effectiveness of this fire barrier by providing a pathway for flames to bypass the ceiling tiles. For this reason even incandescent and fluorescent fixtures are typically required to have additional fire resistant covers on the plenum side of the ceiling. These fire enclosures increases costs and eliminates the ability to effectively cool the light fixture from the plenum side of the ceiling. Given that most solid state troffers depend on backside cooling these fire enclosures lead to higher operating temperatures on the LED die and actually increase the direct fire hazard for solid state light sources. The large amount of organics in the solid state light fixtures can directly contribute to the flame spread once exposed to flames either indirectly or directly. The need therefore exists for solid state lighting solutions which are Class 1 rated which can reduce the risks to occupants and firefighters during fires and minimize the direct fire hazard associated with something failing with the solid state light bulbs.

The recent recalls of solid-state light bulbs further illustrate the risks based on the solid-state light sources themselves being a direct fire hazard. In the recalls, the drive electronics over-heated, which then ignited the other organic materials in the light source. The need exists for solid state light sources which will not burn or ignite when exposed to high heat and even direct flames. Existing incandescent and fluorescent lighting fixtures have over the last several decades found that the ideal solution is to construct the majority of the fixture using inorganic materials and to maximize the lumens per gram of the source. A typical incandescent source emits greater than 30 lumens per gram and the source is self cooling based on both convective cooling and radiative cooling. A conventional solid-state light bulb emits less than 5 lumens per gram and requires heatsinking means to transfer the heat generated by the LEDs and drive electronics to the surrounding ambient. The heatsink surfaces must be exposed to the ambient. In many cases such as recessed can lights the heatsink surfaces are enclosed which dramatically reduces the heat that can be transferred to the ambient. The high lumen per gram in the incandescent and fluorescent bulbs also translates directly into less material to burn both indirectly and directly. Also, in solid-state light bulbs the drive electronics and light source have the same cooling path and therefore heat generated in the drive electronics is added to the heat generated by the LEDs. The added heat from the LEDs elevates the temperature of the drive electronics and vice versa. In the recalls this has led to catastrophic results igniting the organic materials used in the solid state light sources. The coupling of the heat from the drive electronics and the LEDs combined with the large quantity of organic materials used creates a direct fire hazard when components like polymer capacitors and organic coated wiring overheat and burn. Based on years of effort the incandescent and fluorescent sources have moved away from organic based materials for exactly the reasons illustrated above. The solid state lighting industry needs to develop high lumen per gram solid state light sources which not only improve efficiency but also do not represent a fire hazard either indirectly or directly.

Commercial light applications are also subject to seismic, acoustic, and aesthetic requirements. Seismic standards require that suspended ceilings withstand earthquake conditions and more recently these same requirements are being used to address terrorist attacks. In general, lighting fixtures must be separately suspended from the overhead deck in suspended ceiling applications because of their weight and size. The need exists for solid state lighting solutions which can be integrated and certified with suspended ceilings. Regarding acoustics the suspended ceiling dampens noise levels by forming a sound barrier in a manner similar to the fire barrier previously discussed. The lighting fixtures again compromise the barrier created by the ceiling tiles because they cannot be directly integrated into the ceiling tiles or grid work. The need exists for solid state lighting sources which do not degrade the acoustic performance of the ceilings. Lastly, lighting is aesthetic as well as functional. Market research indicates that troffers while functional are not desirable from an aesthetic standpoint. The need therefore exists for solid state lighting sources which provide a wider range of aesthetically pleasing designs.

Suspended ceiling represent a large percentage of the commercial, office and retail space. In this particular application 2 ft×2 ft and 2 ft×4 ft grids are suspended from the ceiling and acoustic/decorative tiles are suspended by the t shaped grid pieces. Lighting has typically been 2×2 or 2×4 troffers which similarly are suspended on the t shaped grid pieces. The troffers are wired to the AC bus lines above the suspended ceiling. Each troffer consists of a sheet metal housing, driver, light sources, and reflective and diffusive elements. In the case of solid state troffers additional heatsinking means or cooling means may also be incorporated into each troffer. To comply with building codes most fixtures require additional fire containment housings which isolate the lighting fixture from the plenum space above the suspended ceiling. In general a standard troffer requires a minimum volume of 1 cubic foot for a 2×2 and 2 cubic feet for a 2×4. The typical lumen output is 2000 lumens for a 2×2 troffer and 4000 lumens for a 2×4. In many instances the location of the light fixtures are put on a regular spacing even though uniform lighting throughout the area may not be required or desirable. This is driven by the difficulty and costs associated with relocating the troffers once installed. This leads to excess lighting with its associated energy losses. The need exists for lightweight diffuse and directional lighting fixtures for suspended ceilings that can be relocated easily and upgraded or changed as technology advances.

Recently Armstrong World Industries has introduced its 24 VDC DC FlexZone™ grid system. The T-shaped grid pieces provide 24 VDC connections on both the top and bottom of the grid pieces. The availability of 24 VDC eliminates the need for a separate drivers and ballasts for solid state lighting. The elimination or simplification of the driver allows for very lightweight and low volume light fixtures especially for the cases where self cooling solid state light sources are employed. Lightweight and low volume, translate directly into reduced raw material usage, fixture cost, warehousing costs, and shipping costs. By eliminating fixed metal housings and replacing them with modular and interchangeable optical and lighting elements that directly attach to an electrical grid system like Armstrong's DC FlexZone system costs can be reduced not only for the fixture itself but also for the cost associated with changing the lighting. Close to 2 billion square feet of commercial and retail suspended ceiling space is remodeled or created each year. The need exists for more flexibility in how this space can be reconfigured.

Present fixtures require addition support to the deck of the building due to weight and size constraints per seismic building codes. The need exists for field installable and user replaceable lighting fixtures that can be seismically certified with the grid so that the end user can adjust and reposition fixtures as the need arises. Under the present requirements, any changes to the lighting require that the ceiling panels be removed and at a minimum additional support wires must be installed to the building deck before the fixture can be repositioned. This may also require a reinspection of the ceiling in addition to the added cost for the change. The need exists for lightweight, robust lighting that can be easily adjusted by the end user without the need for recertification and outside labor.

In evaluating the weight of light modules it is useful to utilize the concept of lumens per gram. The lumens per gram of light fixtures can have a major impact on manufacturing costs, shipping costs, and storage costs due to reduce materials costs and handling costs. It could also allow for fixtures which can be directly attached to the grid of a suspended ceiling and still meet seismic standards without requiring additional support structures which are commonly needed for existing troffer type light sources The need also exists for aesthetically pleasing high lumen per gram light fixtures. For many applications, the lighting should be present but not draw attention to itself. This is not the case with troffers which immediately draw attention away from the other parts of the ceiling. Therefore, there is a need for lightweight and compact lighting fixtures which address the above needs in suspended ceiling applications. Again the thickness of the lighting module has a direct impact on the aesthetics of the installation. Existing linear solid state sources require large light mixing chambers to spread the light emitted by the LEDs. This dramatically increases the depth of these light sources. In order for light panel modules to have a an emitting surface close to the plane of the ceiling and not to protrude into the room or office space below, the major portion of the light source module must be recessed into the suspension ceiling. The need exists for low profile, or thin lighting panels with thicknesses under 10 mm, which are attachable to the electrified grids. Ideally these lighting panels would be field replaceable from the office space side of the installation by end users (and not require custom installers) and present an aesthetically pleasing and monolithic and uniform appearance. Essentially the ideal suspension ceiling lighting system would "disappear" into the ceiling from an aesthetic standpoint.

Finally the need exists for solid state lighting source which can meet or exceed Class 1 or Class A standards, meet seismic requirements, meet acoustic standards, be field adjustable, and be easily integrated in an aesthetically pleasing manner into commercial lighting applications.

Intelligent lighting allows for integration of lighting and sensors into the lighting system. Lighting is required for all occupied areas and active control of lighting via light harvesting and occupancy actually can lead to larger energy savings than the conversion from incandescent to solid state lighting. Presently lighting is a separate market and supply chain from security, point of sale, and HVAC. As intelligent systems permeate into retail, offices, manufacturing, and homes existing lighting suppliers may well be replaced by network suppliers. The need exists for lighting solutions which enable the integration of sensors and networking in a wide range of installations.

As a large portion of the lighting market is based on upgrades, the need exists for retrofit systems that can be attached, mounted or otherwise adhered to a wide range of barriers or barrier surfaces. Incandescent and halogen lighting require thermal isolation from combustible surfaces, fluorescent requires high voltage operation and is susceptible to overheating and cold temperature issues. Existing solid state solutions either have limited lumen output or require heatsinking or other cooling means such as fans to operate. Alternately panel based solid state lighting uses waveguide or led array approaches to create distributed light sources. Waveguides are inherently flammable and represent a significant flame spreading issue along with high cost and weight. LED arrays transfer the heat generated into the mounting surface, which can present a significant fire hazard. The need exist for retrofittable solid state light sources which overcome the deficiencies listed above.

In general, integration of lighting into intelligent digital networks is beginning to occur. There is a need for an intelligent solid state element which also emits light thereby bypassing the conventional lighting supply chain and enabling network companies the ability to use the lighting grid, which must be in virtually every occupied area, as the network grid. This solid state element needs to be aesthetically pleasing, lightweight, low cost, and compatible with both active and passive electronics as well as emit light. Ideally this solid state element would be movable, retrofittable, and upgradeable as well as emit light. The network companies use technology which is almost entirely direct current power. As such solid state lighting and network based technology such as wireless, RFID, data, IR, and optical links have similar power needs. Unlike incandescent, fluorescent, and halogen light sources the power requirements of solid state lighting can utilize low voltage power effectively.

Historically, lighting has been integrated into barriers or partition systems like suspended ceilings, walls, etc. as separate lighting fixtures. In suspended ceilings these are typically 2 foot by 4 foot troffers which are built to accommodate 4 foot long fluorescent tubes. The troffers emit 3000 to 4000 lumens and weigh several kilograms each. As such the troffers must be supported by separate support wires to the deck above the suspended ceiling because the suspended ceiling cannot support the weight of the troffers using only the support grid itself. In addition, troffers because their supports are independently wired to the deck and cannot be integrated into the suspended ceiling they are typically set on a regular a spaced interval irregardless of the lighting needs of the room. As such many rooms are overlit leading to significant unnecessary energy usage. The troffers severely limit the aesthetic look of the suspended ceiling. Existing troffers and conventional lighting also require certified electricians for installation and maintenance. The need exists for barrier or partition systems which have integrated lighting where the light sources can be easily removed, retrofitted, and redistributed on the barrier to adjust for changes in light needs.

This invention discloses how these needs can be met with self cooling solid state light sources which enable lower cost lighter weight barrier or partition systems for ceilings, walls, and floors.

SUMMARY OF THE INVENTION

This invention discloses a barrier or partition to form suspended ceilings, ceilings, floors, and walls etc. containing integrated solid state lighting. Most preferably low voltage grid systems based on self cooling light sources are integrated into the partitions disclosed. The self cooling light sources are based on LEDs and other semiconductor elements mounted onto or within light transmitting thermally conductive elements such that the light emitting and cooling surfaces are substantially the same surfaces. The self cooling light source have common light emitting and cooling surfaces which eliminates the need for additional heatsinking means. Appended heatsinks increases weight and costs of not only the light fixture but the other structures needed to support the light fixture (e.g. supporting grid). The heat generated in the self cooling light sources is dissipated through the light emitting surface into the illuminated space of the installation. The light weight of the self cooling light sources enable lighter weight and lower cost suspension grids compared to conventional troffers and lighting fixtures. Because the light emitting surface and cooling surfaces are substantially the same the self cooling light sources can be mounted and integrated into a wide range of barrier elements and or surfaces including those which may be considered combustible such as painted surfaces, wood, wallpapered surfaces and ceiling tiles. The self cooling light sources are constructed of non-flammable materials being substantially all inorganic such as alumina. The barriers may or may not contain separate barriers elements like ceiling tiles, panels, floor tiles or other construction materials. Barrier as used in this disclosure refers to panels, partitions, ceilings, floors, walls, etc.

This invention discloses a barrier with integrated lighting incorporating a non-flammable light recycling cavity light source comprising, at least one reflector element and at least one light transmitting thermally conductive element wherein at least one light emitting diode (LED) is within the light recycling cavity and in thermal contact with and cooled by at least one light transmitting thermally conductive element and optionally at least one wavelength conversion element is also within the light recycling cavity formed by at least one reflector, element and at least one light transmitting thermally conductive element. These light recycling cavity solid state light sources are cooled using substantially the same surfaces as the light emitting surfaces. These light sources are particularly well suited for suspended ceiling applications where the majority of the heat is dissipated into the occupant or office side of the suspended ceiling installation. Using this approach a substantially contiguous fire barrier can be maintained in the suspended ceiling especially for the cases where fire resistant ceiling tiles are used. This eliminates the need for additional fire resistant shrouding.

The elimination of appended external heatsinks reduces weight and cost of all the components within the suspended ceiling or barrier. The light recycling cavity light sources may be mounted onto the barrier supports (e.g. supporting grid for a ceiling) or and integrated directly into the barrier element (e.g. ceiling tile). Using this approach self cooling light sources outputting more than 30,000 lumens weigh less than 1 Kilogram. This compares to a conventional solid state troffer which may weigh more than 5 Kilograms and output only 4000 lumens. Waveguide based troffers or light panels weigh even more and also contain highly flammable plastic materials which may increase flame spread and greatly increase smoke generation during fires. These conventional lighting sources must be separately suspended from the deck by support wires in suspended ceilings due to seismic and fire requirements. The lightweight self cooling nature of the light sources enables the direct integration of the lighting into ceilings, suspended ceilings, walls, and floors without the need for additional support wires or cooling means. A preferred embodiment is that the light sources connect to a distributed DC grid, however remote power sources may also be used to power the light source. The light sources may also be configured for direct AC input using anti-parallel or internal power converters.

The light recycling cavity light typically consists of a light recycling envelope formed using at least one strongly scattering light transmitting thermally conductive element, at least one LED in thermal contact with the at least one strongly scattering light transmitting thermally conductive element wherein at least one wavelength conversion element and at least one interconnect for the at least one LED are within the recycling cavity envelope.

Alternately or simultaneously a substantially contiguous acoustical barrier suspended ceiling may be formed comprising light recycling cavity light sources which dissipate the majority of their heat into the office side of the installation. The active control of the acoustics including but not limited to noise blanking, background noise, and ambience noise within the office side of the suspended ceiling may be integrated into the recycling cavity light source in the form of an embedded speaker. In particular, low profile piezoelectric speakers can be integrated into the light source. Alternately, alerts, music, and fire warnings can be integrated as well. Lightweight self cooling solid state light sources with surface temperatures less than the building code of 90° C. are disclosed. These sources enable designers to move away from standard 2 foot×2 foot or 2 foot×4 foot grid patterns dictated by fluorescent troffers and eliminates the need for additional support wires. The lightweight self cooling light sources may be movable and remounted by the end user as required when used in conjunction with a low voltage power distribution system.

Disclosed are barriers with both lambertian and directional light recycling light sources wherein the light emission surface and cooling surfaces are substantially the same.

DETAILED DESCRIPTION OF DRAWINGS

Figure 1A:
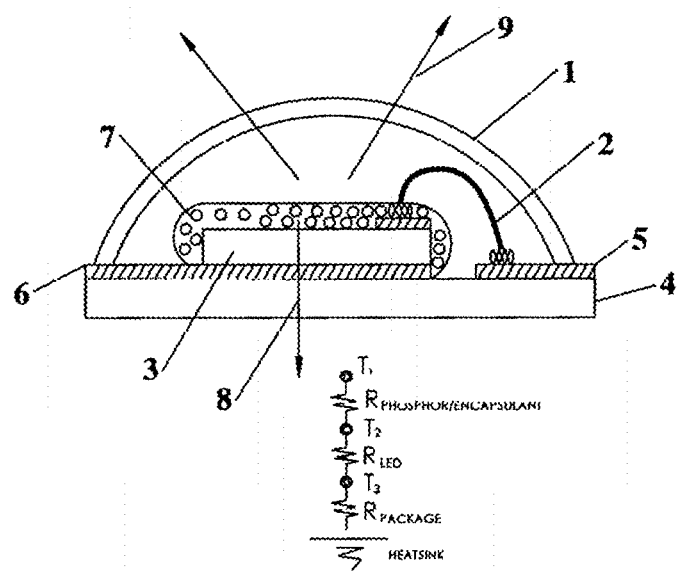
FIGS. 1A and 1B depict side views of prior art vertical and flip chip mounted LED packages and thermal schematics where the optical emission is substantially in the opposite direction of the heat removal.

This invention relates to a solid state light sources based on LEDs mounted on or within thermally conductive luminescent elements. The thermally conductive luminescent elements provide a substantial portion of the cooling of the LEDs using both convective and radiative cooling from the light emitting surfaces of the thermally conductive luminescent elements. At least one thermally conductive luminescent element and at least one reflector element form a recycling cavity which contains at least one LED, at least one interconnect, a contact means, and optionally at least one wavelength conversion means. The light source is structured such that light emitted by the LED is emitted into the recycling cavity, bounces around within the recycling cavity and passes through and exits the light source through the at least one thermally conductive luminescent element. The recycling within the light source creates a very uniform emission from the surface of the at least one thermally conductive luminescent element. Wavelength conversion if used may occur within the recycling cavity, within or on a surface of the at least one thermally conductive luminescent element, or external to the light source. Recycling allows for the use of lower cost, lower in-line transmission materials such as white body color alumina while still maintaining high efficiency. The recycling creates an efficient white body color volume emitter which luminesces uniformly while also providing sufficient cooling to operate at high light output levels. The recycling combined with a strongly scattering thermally conductive luminescent element allows for the formation of thin lightweight distributed light sources. Specifically, white body color thermally conductive luminescent elements like alumina with in-line transmissions less than 50% (1 mm thickness) are preferred to enhance intensity uniformity, enable large area light sources with thicknesses less than 10 mm, and provide sufficient thermal spreading to enable natural convection and radiative cooling of sources emitting more than 100 lumens per square inch off the light emitting surface alone. Even more preferred is a strongly scattering thermally conductive luminescent element with an in-line transmission less than 20% (1 mm thickness). Body color refers to the visual appearance of the light source when the LEDs are not emitting.

In general, this invention discloses an efficient, lightweight, thin, self cooling solid state light source based on strongly scattering light transmitting elements which are used to form a recycling cavity around at least one LED. The strongly scattering light transmitting elements form a partially transmitting aperture, which increases the optical pathlengths of the rays within the recycling cavity. Further the strongly scattering light transmitting elements provide thermal spreading for the heat generated by the at least one LED, any wavelength conversion losses, electrical resistance heating, or optical absorption and transfers that heat to the surrounding ambient environment via convection, conduction, fluid transport, and/or radiative means. This creates a self cooling light source in which substantially all the heat generated in the light source is dissipated using the light emitting surface. By using the recycling cavity approach and low optical loss elements, low cost materials like alumina can form light sources with greater than 70% efficiency (LED optical watts to light source output optical watts) while simultaneously providing substantially all the cooling for the light source.

Electrical interconnect of the LEDs and other semiconductor devices are based on opaque and/or transparent conductors to create low cost self-cooling solid state light sources. The low cost self-cooling solid state light sources can have printed thick film printed silver conductors with a reflectivity greater than 30%. The light emitted by the LEDs and/or LED packages is redirected by optical elements including but not limited to reflectors, reflective diffuse elements, and other thermally conductive luminescent elements. For clarity it should be noted that luminescence is defined as allowing the emission of light. This can be based on simple transmission of the light emitted from the LEDs or LED packages, wavelength conversion of the light emitted from the LEDs or LED packages or some combination of both transmission or wavelength conversion. However, it is noted that virtually all materials exhibit some level of wavelength conversion to UV and blue wavelengths. As an example, standard alumina ($Al_2O_3$) typically has chromium doping which when exposed to 450 nm blue light emits narrowband red light. This in fact formed the basis of the first laser, which was chromium doped sapphire (ruby). A key attribute of this invention is the formation of efficient recycling cavities as disclosed in Zimmerman U.S. Pat. No. 7,040,774 included by reference.

In recycling optical cavities multiple bounces or reflections are purposefully caused to occur. If the cavity is formed using materials with low enough optical absorption losses, the efficiency can be very high even though the material may be strongly scattering. This invention discloses the formation of recycling optical cavities in which at least a portion of the recycling cavity is constructed of translucent thermally conductive elements. This is based on the recognition that even materials typically considered opaque can be used to form efficient emitters if optical absorption is minimized. The importance of this discovery is that low cost materials such as white body color alumina can now function as translucent thermally conductive emitters with or without wavelength conversion. The ability to form white body color or even off-white body color light sources is important from both an aesthetic and marketing standpoint. Consumers prefer white body color or off-white body color light sources for mainly applications due to their familiarity with incandescent and fluorescent lamps. As such thermally conductive luminescent elements with white or off-white body colors when they are not emitting light from the LEDs and/or LED packages are preferred. This can be further extended to include a wide range of body colors and patterns when non-homogenous thermally conductive luminescent elements are used such as reflectors with arrays of holes. The use of texture and other outer surface treatments to create various aesthetic looks is also disclosed. In particular, the creation of thermally conductive luminescent elements which match or are aesthetically similar to ceiling tiles is disclosed. In general, the ability to create a wide range of body colors for the thermally conductive luminescent element is a preferred embodiment of this invention.

In this configuration the light emitting surfaces also function as the cooling surfaces. As an example, alumina, TPA, or single crystal sapphire are all $Al_2O_3$ with simply different crystal structures. Alumina because of scatter elements (porosity and crystal size) is not considered an optical material due to its low in-line transmission and is generally considered opaque. However because of it usage in substrate materials it is available in high volume for less than 10 cents per square inch in thickness ranging from hundreds of microns to a couple mm. At these thicknesses in-line transmission is typically less than 20% (1 mm thickness). TPA is a polycrystalline version that requires significantly different firing conditions and material purity and a host of filings exist on how to make this material economically especially for halogen and metal halide lamps. In similar thicknesses to alumina TPA has in-line transmission greater than 80%. Sapphire is still another form of $Al_2O_3$ based on single crystal growth which is even more expensive than TPA and orders of magnitude more expensive than alumina. In line transmission for sapphire is similarly greater than 80% again for similar thickness. Using the recycling cavity approach disclosed in this invention overall light source efficiency using alumina is greater than 70% with TPA and sapphire being only 5% higher at 75% even though there is a 4× difference in in-line transmission efficiency. This is due to the understanding that scatter does not necessarily lead to an absorption loss if recycling is allowed to occur. It should be noted that the intensity uniformity is very poor for the TPA and sapphire specifically because there is very little recycling occurring compared to the strongly scattering alumina when identical source geometries are used.

Also disclosed is a self cooling light source of the invention, which comprises at least one light-emitting diode (LED) die and at least one thermally conductive luminescent element. In this case the at least one thermally conductive luminescent element forms an envelope around the at least one light emitting LED. The luminescent element includes an electrical interconnect and can perform multiple functions: as a wavelength converter, converting at least a portion of the light emitted by said LED die to a different wavelength range, as an optical waveguide for light emitted by said LED die, and as a heat spreading element, spreading heat generated by said LED die over a greater cross-sectional area. Finally the luminescent element provides a high emissivity layer, for optimal coupling of emitted light from the light source.

The thermally conductive luminescent element can be used to completely or partially eliminate the need for any additional heatsinking means by efficiently transferring and spreading out the heat generated in LED and luminescent element itself over an area sufficiently large enough such that convective and radiative means can be used to cool the device. In other words, the surface emitting light also convectively and radiatively cools the device. The thermally conductive luminescent element can also provide for the efficient wavelength conversion of at least a portion of the radiation emitted by the LEDs.

The present invention may also be defined as a self cooling solid state light source comprising at least one light-emitting diode (LED) die and at least one thermally conductive luminescent element bonded to the at least one LED die; wherein heat is transmitted from the light source in basically the same direction as emitted light. More specifically, light is emitted from the LED die principally in a direction through the at least one luminescent element, and heat generated in the light source is transmitted principally in the same direction as the direction of light emission. Heat is dissipated from the light source by a combination of radiation, conduction and convection from the at least one luminescent element, without the need for a device heatsink.

Optionally, the luminescent thermally conductive element can provide light spreading of at least a portion of the radiation from the LEDs and/or radiation converted by the thermally conductive luminescent elements via waveguiding. A thermally conductive luminescent element acts as a waveguide with alpha less than 10 $cm^{-1}$ for wavelengths longer than 550 nm. In this case, the LEDs with emission wavelengths longer than 550 nm can be mounted and cooled by the thermally conductive luminescent elements and also have at least a portion of their emission efficiently spread out via waveguiding within the thermally conductive luminescent element as well.

Thermally conductive luminescent elements with wavelength conversion elements used with InGaN and AlInGaP LEDs can convert at least a portion of the InGaN spectrum into wavelengths between 480 and 700 nm. Single crystal, polycrystalline, ceramic, and/or flamesprayed Ce:YAG, Strontium Thiogallate, or other luminescent materials emitting light between 480 and 700 nm and exhibiting an alpha below 10 $cm^{-1}$ for wavelengths between 500 nm and 700 nm can be a thermally conductive solid luminescent light spreading element.

The mounting of InGaN and AlInGaP LEDs can form solid state extended area light sources with correlated color temperatures less than 4500 K and efficiencies greater than 50 L/W and optionally color rendering indices greater than 80 based on these thermally conductive light spreading luminescent elements.

One embodiment of this invention is a luminescent thermally conductive translucent element having a thermal conductivity greater than 1 W/mK consisting of one or more of the following materials, alumina, ALN, Spinel, zirconium oxide, BN, YAG, TAG, composites, porous metal reflectors and YAGG. Optionally, electrical interconnects maybe formed on at least one surface of the luminescent thermally conductive translucent element to provide electrical connection to the LED.

The luminescent thermally conductive element can have a thermal conductivity greater than 1 W/mK and have an emissivity greater than 0.2. A self cooling solid state light source can have at least one luminescent thermally conductive element with a thermal conductivity greater than 1 W/mK and an emissivity greater than 0.2. A self cooling solid state light source can have an average surface temperature greater than 50° C. and a luminous efficiency greater than 50 L/W. Optionally, a self-cooling solid state light source can have an average surface temperature greater than 50° C. and a luminous efficiency greater than 50 L/W containing at least one luminescent thermally conductive element with a thermal conductivity greater than 1 W/mK and an emissivity greater than 0.2. A self-cooling solid state light source can dissipate greater than 0.3 W/cm2 via natural convection cooling and radiation cooling.

Luminescent thermally conductive elements can be formed via the following methods: casting, metal forming, laser cutting, stamping, crystal growth, sintering, coating, fusible coating, injection molding, flame spraying, sputtering, CVD, plasma spraying, melt bonding, and pressing. Pressing and sintering of oxides with substantially one phase will improve translucency based on a luminescent powder. Alternately, a translucent element with a thermal conductivity greater the 1 W/mK and an alpha less than 10 $cm^{-1}$ can be coated with a luminescent layer formed during the sintering process or after the sintering process. Single crystal or polycrystalline materials, both luminescent and non-luminescent, can be the thermally conductive luminescent element. Specifically TPA (transparent polycrystalline alumina), Spinel, cubic zirconia, quartz, and other low absorption thermally conductive materials with a luminescent layer can be formed during or after fabrication of these materials. Techniques such as pressing, extruding, and spatial flame spraying can form near net shape or finished parts. Additional luminescent layers can be added to any of these materials via dip coating, flame spraying, fusing, evaporation, sputtering, CVD, laser ablation, or melt bonding. Controlled particle size and phase can improve translucency. In the case of metal films with holes the size of the hole and spacing can be uniform or non-uniform. Non-homogenous thermally conductive luminescent elements may consist of metal foils with highly reflective inner surfaces with holes. A non-homogenous array of holes, where the open hole area represents 20% of the surface area is roughly equivalent to a piece of alumina with an in-line transmission of 20%. The higher thermal conductivity of the metal foils allow for much thinner thickness while still retaining reasonable lateral thermal conductivity.

Coatings can improve the environmental and/or emissivity characteristics of the self-cooling light source, particularly if the coating is a high emissivity coating with and without luminescent properties. Single crystal, polycrystalline, ceramic, coating layers, or flame sprayed can be used both as a coating and as the bulk material Ce:YAG, with a high emissivity or environmental protective coating. In particular, polysiloxanes, polysilazanes and other transparent environmental overcoats can be applied via dip coating, evaporative, spray, or other coating methods, applied either before or after the attachment of the LEDs. Additional luminescent materials can be added to these overcoats such as but not limited to quantum dots, luminescent dyes (such as Eljen wavelength shifter dyes), and other luminescent materials. A wide range of the coatings for aesthetic and improved radiation are possible with non-homogenous thermally conductive luminescent elements, because the inner and outer surfaces of the element are isolated from each other. It is preferred that the non-homogenous thermally conductive luminescent elements have a high reflectivity surface for the surface, which forms the inner walls of the recycling cavity. The outer surface of the non-homogenous thermally conductive luminescent elements can be any color up to and including black.

Wireless power transfer elements, power conditioning element, drive electronics, power factor conditioning electronics, infrared/wireless emitters, and sensors can be integrated into the self-cooling solid state light source.

A self-cooling solid-state light source can have a luminous efficiency greater than 50 L/W at a color temperature less than 4500K and a color rendering index greater than 70. The self-cooling solid-state light source can have a surface temperature greater than 40° C., convectively and radiatively cooling more than 0.3 $W/cm^2$ of light source surface area, and having a luminous efficiency greater than 50 L/W.

A self-cooling solid-state light source can have a luminous efficiency greater than 50 L/W at a color temperature less than 4500K and a color rendering greater than 85 containing both blue and red LEDs. At least one luminescent thermally conductive element with an alpha less than 10 $cm^{-1}$ for wavelengths longer than 500 nm is used in the self cooling solid state light source containing at least one blue and at least one LED with emission wavelengths longer than 500 nm. Additional luminescent materials in the form of coatings and/or elements including, but not limited, to phosphor powders, fluorescent dies, wavelength shifters, quantum dots, and other wavelength converting materials, can further improve efficiency and color rendering index.

Aspect ratios and shapes for the solid state light source can be, including but not limited to, plates, rods, cylindrical rods, spherical, hemispherical, oval, and other non-flat shapes. Die placement can mitigate edge effects and form more uniform emitters. Additional scattering, redirecting, recycling, and imaging elements can be attached to and/or in proximity to the solid state light source designed to modify the far field distribution. Additional elements can be attached to the solid state light source with a thermally conductivity greater than 0.1 W/mK such that additional cooling is provided to the solid state light source via conduction of the heat generated within the solid state light source to the additional element and then to the surrounding ambient. An external frame can provide mechanical support, can be attached to the solid state light source, and/or can provide an external electrical interconnect. Multiple solid state sources arranged with and without additional optical elements can generate a specific far field distribution. In particular, multiple solid state sources can be arranged non-parallel to each other such that surface and edge variations are mitigated in the far field. A separation distance between solid state light sources faces of greater than 2 mm is preferred to facilitate convective cooling. Mounting and additional optical elements can enhance convective cooling via induced draft effects.

In this invention, thermally conductive luminescent elements on to which semiconductor devices are mounted are used to effectively spread the heat out over a sufficient area with a low enough thermal resistance to effectively transfer the heat generated by the semiconductor devices and the thermally conductive luminescent element itself to the surrounding ambient by both convection and radiative means. In this invention, the surface emitting light convectively and radiatively cools the device.

The thermally conductive luminescent element can also provide for the efficient wavelength conversion of at least a portion of the radiation emitted by the LEDs. Optionally, the luminescent thermally conductive element can provide light spreading of at least a portion of the radiation from the LEDs and/or radiation converted by the thermally conductive luminescent elements. The thermally conductive luminescent elements act as waveguides with alpha less than 10 $cm^{-1}$ for wavelengths longer than 550 nm. In this case the LEDs with emission wavelengths longer than 550 nm can be mounted and cooled by the thermally conductive luminescent elements and also have at least a portion of their emission efficiently spread out via waveguiding within the thermally conductive luminescent element as well.

Disclosed is a self cooling solid state light source containing an optically transmitting thermally conductive element with a surface temperature greater than 50° C. and a surface area greater than the semiconductor devices mounted on the optically transmitting thermally conductive element. Even more preferably a self cooling solid state light source containing at least one optically transmitting thermally conductive element with a surface temperature greater than 100° C. and a surface area greater than the surface area of the mounted semiconductor devices. The optically transmitting thermally conductive element may be coupled with a reflector to form a recycling cavity. In this case at least one LED is mounted to the optically transmitting thermally conductive element such the heat generated by the LED is distributed laterally by the optically transmitting thermally conductive element and thereby transmitted off the surface of the optically transmitting thermally conductive element to the surrounding ambient. Optionally, a wavelength conversion element is also used within the recycling cavity formed by the optically transmitting thermally conductive element and reflector to convert at least a portion of the emission generated by the LED also within the recycling cavity to a different wavelength range. The emission from the LEDs and any optional wavelength conversion element exits the recycling cavity through the optically transmitting thermally conductive element and the heat generated within the light source is dissipated to the office side of the installation off the surface of the optically transmitting thermally conductive element. The formation of reflective interconnects for providing power to the LEDs on the optically transmitting thermally conductive element is also disclosed. Silver is a preferred material for the reflective interconnect. It should be noted that by using a recycling cavity approach and high reflectivity materials within the recycling cavity, what would typically be considered opaque materials like alumina can be used in thicknesses up to 1 mm for the optically transmitting thermally conductive element because multiple reflections are possible without significant losses. As an example, 500 micron 96% alumina substrates have an in-line transmission of less than 20% but when used as an aperture to a recycling cavity light source has an efficiency of over 70%. Even though only 20% is transmitted each time rays impinge on the alumina within the recycling cavity if the absorption losses are minimized by having a highly reflective reflector (such as Alanod™), reflective interconnect traces, reflective LEDs, low loss wavelength conversion elements, and low loss alumina 10s if not 100s bounces can occur within the recycling cavity. This approach not only creates high efficiency solid state light sources, it also improves the brightness uniformity of the source, allows for indirect positioning of the LEDs, lower color temperature for a given amount of wavelength conversion material, and the ability to generate a wide range of external body colors.

Also preferred is a self cooling solid state light source containing at least one optically transmitting thermally conductive luminescent element with an average thermal conductivity greater than 1 W/mK. As an example, YAG doped with 2% Cerium at 4 wt % is dispersed into an alumina matrix using spray drying. The powders are pressed into a compact and then vacuum sintered at 1500° C. for 8 hours, followed by hot isostatic pressing at 1600° C. for 4 hours under argon. The material is diamond saw diced into 1 mm thick pieces which are ½ inch×1 inch in area. The parts are laser machined to form interconnect trenches into which silver paste is screen printed and fired. The fired silver traces are then lapped to form smooth surface to which direct die attach LED die are soldered. Pockets are cut using the laser such that two pieces can be sandwiched together thereby embedding the direct die attach LED die inside two pieces of the ceramic Ce:YAG/alumina material. In this manner, a self cooling light source is formed. The direct die attached LED(s) are electrically interconnected via the silver traces and thermally connected to the ceramic Ce:YAG/alumina material. The heat generated within the LEDs and the ceramic Ce:YAG/alumina material is spread out over an area greater than the area of the LEDs. In this example, power densities greater than 1 $W/cm^2$ can be dissipated while maintaining a junction temperature less than 120° C. and surface temperature on the ceramic Ce:YAG/alumina material of 80 to 90° C. based on natural convection and radiative cooling. As such a ¼ inch×½ inch solid state light source can emit over 100 lumens without any additional heatsinking or cooling means.

Materials with emissivities greater than 0.3 are preferred to enhance the amount of heat radiated of the surface of the solid state light source. Even more preferable is an emissivity greater than 0.7 for surface temperatures less than 200° C. A naturally convectively cooled surface with a natural convection coefficient of 20 W/m2/k with a surface temperature of 50° C. in a 25° C. ambient will transfer about 25% of its energy to the surrounding ambient radiatively if the surface emissivity is greater than 0.8 and can dissipate approximately 0.08 $W/cm^2$ of light source surface area. A similar naturally convectively cooled surface with a surface temperature of 100° C. can transfer 30% of its energy to the surrounding ambient radiatively and dissipate greater than 0.25 watts/$cm^2$ of surface area. A similar naturally convectively cooled surface with a surface temperature of 150° C. can transfer 35% of the heat radiatively and dissipate greater than 0.4 watts/$cm^2$. Given that solid state light sources can approach 50% electrical to optical conversion efficiency and that the typical spectral conversion is 300 lumens/optical watt, using this approach a self cooling solid state light source can emit 75 lumens for every 1.0 $cm^2$ of light source surface area. As an example, a ¼ inch×½ inch×2 mm thick self cooling light stick can generate more than 150 lumens while maintaining a surface temperature less than 100° C. The typical LED junction temperature for high powered devices can be over 120° C. and still maintain excellent life and efficiency. For surfaces with temperatures less than 120° C., the majority of the radiated energy is in the infrared with a wavelength greater than 8 microns. As such, high emissivity coatings, materials, and surfaces which are substantially transparent in the visible spectrum are preferred embodiments of self cooling light sources.

The emissivity of the materials in the infrared varies between 0 and 1. Glass has an emissivity of approximately 0.95 while aluminum oxide may be between 0.5 and 0.8. Organics such as polyimides can have fairly high emissivity in thick layers. This however will negatively affect the transfer of heat due to the low thermal conductivity of organics. As such high thermal conductivity high emissivity materials and coating are preferred. High emissivity/low visible absorption coatings are described in J. R. Grammer, "Emissivity Coatings for Low-Temperature Space Radiators", NASA Contract NAS 3-7630 (30 Sep. 1966). Various silicates are disclosed with emissivity greater than 0.85 and absorptions less than 0.2.

In order to maximize heat transfer to the ambient atmosphere, the need exists for luminescent thermally conductive materials which can effectively spread the heat generated by localized semiconductor and passive devices (e.g. LEDs, drivers, controller, resistors, coils, inductors, caps etc.) to a larger surface area than the semiconductor die via thermal conduction and then efficiently transfer the heat generated to the ambient atmosphere via convection and radiation. At the same time, these luminescent thermally conductive materials must efficiently convert at least a portion of the LED emission to another portion of the visible spectrum to create a self cooling solid state light source with high L/W efficiency and good color rendering. Conventional wavelength converters in both solid and powder form are substantially the same size as the LED die or semiconductor devices. This minimizes the volume of the luminescent material but localizes the heat generated within the luminescent element due to Stokes losses and other conversion losses. In present day solid state light sources approximately 50% of the heat generated is within the luminescent material. By using a thermally conductive luminescent element with low dopant concentration which also acts as a waveguide to the excitation light emitted by the LEDs the heat generated by the luminescent conversion losses can be spread out over a larger volume. In addition a more distributed light source can be generated rather localized point sources as seen in conventional LED packages. In this manner the need for addition diffusing and optical elements can be eliminated or minimized. As such the use of luminescent thermally conductive elements with surface area greater than the semiconductor devices mounted on the luminescent elements is a preferred embodiment.

Heat generated within the LEDs and phosphor material in typical solid state light sources is transferred via conduction means to a much larger heatsink usually made out of aluminum or copper. The temperature difference between the LED junction and heatsink can be 40 to 50° C. The temperature difference between ambient and heatsink temperature is typically very small given that significant temperature drop occurs from the LED junction and the heatsink surfaces. This small temperature difference not only eliminates most of the radiative cooling but also requires that the heatsink be fairly large and heavy to provide enough surface area to effectively cool the LEDs. The larger the heatsink, the larger the temperature drop between the LED junction and the surface of the heatsink fins. For this reason, heatpipes and active cooling is used to reduce either the temperature drop or increase the convective cooling such that a smaller heatsink volume can be used. In general, the added weight of the heatsink and/or active cooling increases costs for shipping, installation, and in some cases poses a safety risk for overhead applications.

Ideally, like incandescent, halogen, sodium, and fluorescent light sources, the emitting surface of the solid-state light source would also be used to cool the source. Such a cooling source would have an emitting surface that was very close to the temperature of the LED junctions to maximize both convective and radiative cooling. The emitting surface should be constructed of a material that exhibited sufficient thermal conductivity to allow for the heat from small but localized LED die to be spread out over a sufficiently large enough area to effectively cool the LEDs. In this invention this is accomplished by spreading the heat generated within the luminescent element out over a larger volume, using a thermal conductivity luminescent element that spreads the heat generated in the semiconductor devices used via conduction over a larger surface area than the semiconductor devices, and maximizing the radiative and convective cooling by high emissivity coatings, increased surface area, and higher surface temperatures created by efficient coupling of the heat to the surface of the self cooling light source.

As stated earlier, the need exists for non-flammable solid state light sources. The techniques to reduce the fire hazard of organics not only can not meet Class 1 or Class A requirements due to flame spread and smoke but also degrade optical properties of the materials. This disclosure cites inorganic materials and their use in self cooling solid state lights sources which are non-flammable. Not only do these light sources not contribute to the spread of flames and increase smoke during a fire they also enable the maintenance of a contiguous fire, acoustic, and aesthetic suspended ceiling by eliminating and/or reducing the number of breaks in the ceiling. The lightweight nature of the sources defined by high lumens per gram allow for direct attachment, suspension, and embedding of the light sources on, from, or in the suspended ceiling. This allows for seismic certification with the suspended ceiling and eliminates the need for additional support wires. The elimination of support wires enables the user within the office space the ability to change, alter, replace, or otherwise move the lighting as needed. This is also enabled by the use of magnetic, clip and other releasable forms of electrical and physical connectors to the grid, ceiling tiles, or power grids attached to or embedded in to the grid and/or ceiling tiles.

The use of the ceiling tile outer layer or scrim to form recycling cavities or depressions which can then be used in conjunction with self-cooling light sources wherein the emitting surface and cooling surface is substantially the same is also disclosed. In general the self cooling solid state light fixtures disclosed transfer the majority of their heat to the office space side not the plenum side because the emitting/cooling surface is directly exposed the ambient within the office space. Electrical and physical connections to drivers in the plenum space can occur via push pin connects, embedded traces, surface traces, and other interconnect means. In general, the use of this approach to create thin, lightweight solid state light sources which aesthetically blend into suspended ceilings wherein the surface which emits also provides the cooling for the light source is a preferred embodiment of this invention.

FIG. 1A depicts a prior art vertical LED die 3 mounted on a substrate 4. The vertical LED die 3 is typically coated with an inorganic/organic matrix 7 consisting of phosphor powder such as, but not limited to, Ce:YAG in a silicone resin material. The wire bond 2 is used to electrically connect vertical LED die 3 to interconnect 5, which is then coated with the inorganic/organic matrix 7. The other side of vertical LED die 3 is contacting interconnect 6 usually via eutectic solder or conductive adhesives. A lens 1 is further attached to substrate 4 to environmentally seal the assembly, enhance light extraction from vertical LED die 3, and modify the far field optical pattern of the light emitted by the device. In this case, emitted rays 9 are substantially traveling in the opposite direction of the heat ray 8.

As shown in the thermal schematic in FIG. 1A, cooling of the inorganic/organic matrix 7 occurs almost exclusively via thermal conduction through the vertical LED die 3 and into the substrate 4 via interconnect 6. The heat generated within inorganic/organic matrix 7 due to Stokes losses and scattering absorption is thermally conducted to the vertical LED die 3 at a rate determined by the thermal resistance determined by the bulk thermal conductivity of the inorganic/organic matrix 7. As shown in the simplified thermal schematic, the average temperature of the inorganic/organic matrix 7 is determined by the thermal resistance R (phosphor/encapsulant) and T2 the average temperature of the vertical LED die 3. In order for heat generated within the inorganic/organic matrix 7 to be dissipated to the ambient, it must move the thermal resistance of LED die 3 (RLED) and substrate 4 (RPackage) before it can be dissipated to the ambient. This is a simplified thermal schematic which lumps bulk and interface thermal resistances and spatial variations within the device. But in general, heat generated within the inorganic/organic matrix 7 must be dissipated mainly through the vertical LED die 3 due to low thermal conductivity of the other materials (e.g. Lens) which surround inorganic/organic matrix 7. Additional heatsinking means can further increase the surface area using metal, composite, or ceramic elements to enhance the dissipation of heat to ambient but the flow of heat is still basically the same. The lens 1 acts as an extraction element for the emitted light rays 9 but also acts as a barrier to thermal rays 8. Typically constructed of silicone or epoxy resins with thermal conductivity less than 0.1 W/mK, Lens 1 acts as a thermal insulator. Lens 1 also can limit thermal radiation from vertical LED 3 and inorganic/organic matrix 7 due to low emissivity. In general this design requires that approximate 50% of the isotropic emission from the active region within vertical LED 1 must be reflected off some surface within the device and that the far field output of the device be substantially directional or lambertian in nature. Even with the use of highly reflective layers, this represents a loss mechanism for this approach. These extra losses are associated with the added pathlength that the optical rays must go through and multiple reflections off the back electrodes. This added pathlength and reflections, which are required to extract the light generated in the active region of vertical LED 1, fundamentally reduces the efficiency of the LED based on the absorption losses of the LED itself. A significant portion of the light generated within the inorganic/organic matrix 7 must also pass through and be reflected by vertical LED 1. Since vertical LED 1 is not a lossless reflector, the added pathlength of these optical rays also reduce overall efficiency.

Figure 1B:
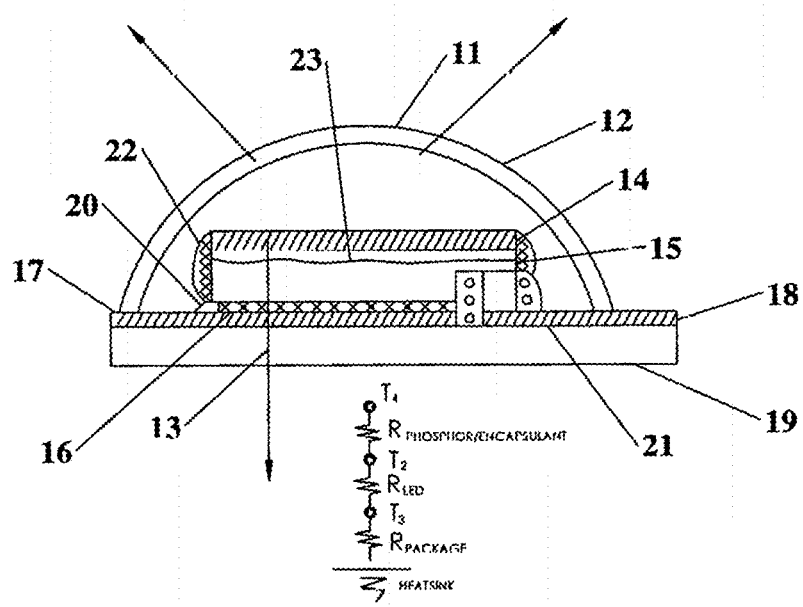

FIG. 1B depicts a prior artchip mounted LED 15. Solder or thermocompression bonding attaches flip chip mounted LED 15 via contacts 16 and 21 to interconnects 17 and 18 respectively on substrate 19. Luminescent converter 14 may be an inorganic/organic matrix as discussed in FIG. 1A or solid luminescent element such as a Ce:YAG ceramic, single crystalline Ce:YAG, polycrystalline Ce:YAG or other solid luminescent materials as known in the art. In either case, the same cooling deficiency applies with this design. Virtually all the cooling of the luminescent converter 14 must be through the flip chip mounted LED 15. Again, emission rays 12 travel in a direction substantially opposite to thermal rays 13 and once again approximately 50% the isotropic emission of the active region of the flip chip mounted LED 15 must to redirected within the device requiring the use of expensive metals like Ag, specialized coating methods and even nanolithography as in the case of photonic crystals.

The formation of contacts which are both highly reflective over a large portion of the LED die area and still forms a low resistivity contact has been a major challenge for the industry due to reflectivity degradation of Ag at the temperature typically required to form a good ohmic contact. This high light reflectivity and low electrical resistivity leads to added expense and efficiency losses. Because both the contacts must be done from one side typically an underfill 20 is used to fill in the voids created by the use of flip chip contacts. Lens 11 forms a barrier to heat flow out of the device from both convectively and radiatively. The luminescent converter 14 is typically attached after the flip chip mounted die 15 is mounted and interconnected to substrate 19. A bonding layer 23 between the flip chip mounted die 15 and luminescent element 14 further thermally isolates the luminescent element 14. Typically, InGaN power LED UV/Blue chips exhibit efficiencies approaching 60% while White InGaN power LED packages are typically 40%. The loss within the luminescent converter 14 therefore represents a substantial portion of the total losses within the device. In the case of an inorganic/organic matrix luminescent converter of FIG. 1A, the conversion losses are further localized within the individual phosphor powders due to the low thermal conductivity of the silicone or epoxy matrix. The solid luminescent converter 14 has more lateral spreading due to the higher thermal conductivity of the solid material. Both cases are typically Cerium doped YAG with an intrinsic thermal conductivity of 14 W/mK. However since the silicone matrix has a thermal conductivity less than 0.1 W/mK and surrounds substantially all the phosphor powders, the inorganic/organic matrix has a macro thermal conductivity roughly equivalent to the silicone or epoxy by itself. Very high loading levels of phosphor powder can be used but lead to efficiency losses due to higher scatter.

There is simply nowhere for the heat generated in luminescent converter 14 to go except be thermally conducted into the flip chip mounted LED 15 via the bonding layer 23. In most cases, solid luminescent converters 14 must have an additional leakage coating 22 that deals with blue light that leaks out of the edge of the flip chip mounted LED 15. An inorganic/organic matrix suffers from the same issues in FIG. 1A. In both FIGS. 1A and 1B, the emission surfaces are substantially different from the cooling surfaces. The thermal schematic for FIG. 1B is similar to FIG. 1A in that heat generated within the luminescent converter 14 is substantially dissipated through the flip chip mounted LED 15. With the advent of high powered LEDs, a substantially portion of the heat generated within the device can be localized within luminescent converter 14. This localization has led to a variety of solutions including the use of remote phosphors. In general, luminescent converter 14 efficiency reduces as its average temperature T4 increases. In the prior art the luminescent converter 14 dissipates the majority of its heat through the flip chip mounted LED 15 with an average temperature of T5. This is an inherently higher temperature than the ambient. The need exists for techniques whereby the heat generated within luminescent converter 14 can be reduced for higher efficiency devices.

Figure 2A:
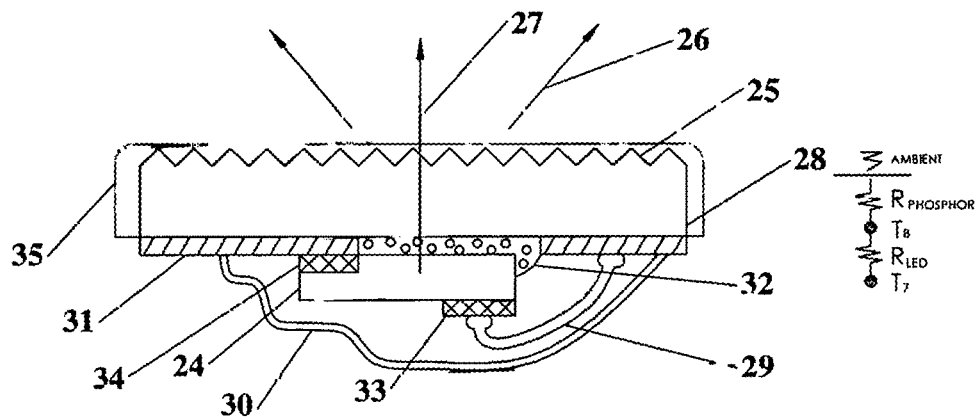
FIGS. 2A, 2B and 2C depict side views of self-cooling solid state light sources using luminescent thermally conductive luminescent elements and interconnects with thermal schematics of the present invention.

FIG. 2A depicts a vertical LED 24 of the present invention in which the optical emission rays 26 travel substantially in the same direction as the thermal rays 27. A thermally conductive luminescent element 25 provides wavelength conversion for at least a portion of the light emitted by vertical LED 24 and acts as an optical and thermal spreading element, extraction means, and a substrate for the electrical interconnect. In FIG. 2A, overcoat 30 may be reflective, transparent, partially reflective and exhibit reflectivity which is wavelength and/or polarization dependent.

Wire bond 29 connects interconnect 28 to contact pad 33 with contact 34 attached via conductive ink or eutectic solder to interconnect 31. A transparent/translucent bonding layer 32 maximizes optical and thermal coupling into thermally conductive luminescent element 25 and eventually out of the device. The transparent/translucent bonding layer 32 may consist of, but is not limited to, glass fit, polysiloxane, polysilazane, silicone, and other transparent/translucent adhesive materials. Transparent/translucent bonding layer 32 has a thermal conductivity greater than 0.1 W/mK and even more preferably greater than 1 W/mK. Thermally conductive luminescent element 25 may consist of, but is not limited to, single crystal luminescent materials, polycrystalline luminescent materials, amorphous luminescent materials, thermally conductive transparent/translucent materials such as Sapphire, TPA, Nitrides, Spinel, cubic zirconia, quartz, and glass coated with a thermally conductive luminescent coating, and composites of thermally conductive transparent/translucent material and thermally conductive luminescent materials.

In FIG. 2A a high emissivity layer 35 may be applied to the thermally conductive luminescent element 25 to enhance radiative cooling. In addition, high emissivity layer 35 may also provide enhanced extraction efficiency by acting as an index matching layer between the surrounding air and the thermally conductive luminescent element 25, especially in the case where extraction elements are used to increase extraction from the thermally conductive luminescent element 25. Unlike the previous prior art thermal schematic, the flow of heat generated in the thermally conductive luminescent element 25 is directly coupled to the ambient via convective and radiative cooling off the surface of the thermally conductive luminescent element 25 itself. This direct coupling approach can only be effectively accomplished if the bulk thermal conductivity of the thermally conductive luminescent element 25 is high enough to effectively spread the heat out over an area sufficiently large enough to effective transfer the heat to the surrounding ambient. As such, a thermally conductive luminescent element has a surface area greater than the attached LED with an average bulk thermal conductivity greater than 1 W/mK wherein the heat generated within the Vertical LED 24 and thermally conductive luminescent element 25 are substantially transferred to the surrounding ambient via convection and radiation off the surface of thermally conductive luminescent element 25. High emissivity layer 35 most preferably has an emissivity greater than 0.8 at 100° C. and an absorption less than 0.2 throughout the visible spectrum. Alternately, the emissivity of the thermally conductive luminescent element 25 may be greater than 0.8 at 100° C. and have absorption less than 0.2 throughout the visible spectrum.

Figure 2B:
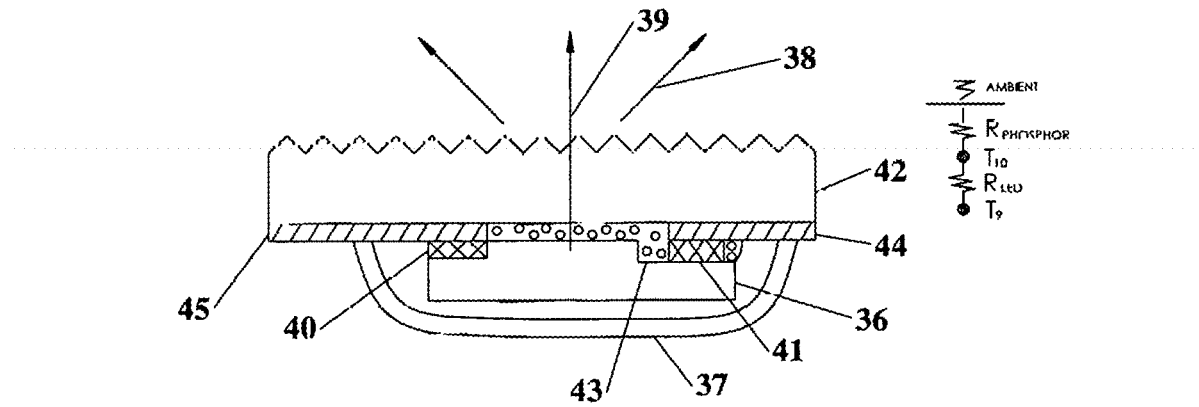

FIG. 2B depicts a flip chip mounted LED 36 mounted on thermally conductive luminescent element 42 via a transparent/translucent bonding layer 43 and electrically connected via contacts 41 and 40 to interconnects 44 and 45 on thermally conductive luminescent element 25. Interconnects 44 and 45 are thick film silver conductors formed via screen printing, inkjet printing, lithographic means, or combinations of these other methods. As an example, thermally conductive luminescent element 42 may contain a laser cut trench approximately 5 micron deep into which silver paste is screen printed and fired. The surface of conductive luminescent element 42 is then optionally lapped to create a smooth surface for interconnect 44 and 45. The resulting surface is now smooth enough for thermo compression bonded die, direct die attach die with integral eutectic solders, and other direct attach bonding methods. Interconnects 44 and 45 are typically fired at a temperature greater than 400° C. Interconnects 44 and 45 are thick film or inkjet silver traces with line widths less than or greater than the width of the flip chip mounted LED 36. Optical losses within the device can be minimized by minimizing the amount of silver used, minimizing the width of the interconnect traces and maximizing the reflectivity of the silver traces. Alternately, the thermal resistance between flip chip mounted LED 36 and the thermally conductive luminescent element 42 may be minimized by increasing amount of silver thickness or area. Overcoat 37 may consist of, but is not limited to, glass frit, polysiloxane, polysilazanes, flame sprayed ceramics, and evaporative/CVD coatings. A highly reflective layer in overcoat 37 is optional. In this manner, a compact directional light source can be formed. Transparent/translucent bonding layer acts as an environmental and shorting barrier for the device. The reflector in overcoat 37 can be applied after all the high temperature processing thereby maximizing reflectivity of the layer. The thermal schematic shown in FIG. 2B again shows that there is a much different thermal conduction path than FIG. 1 devices. Thermally conductive luminescent element 42 provides the cooling surfaces for the device as well as conversion of light from LED 36. The emitting surface of the device is also the cooling surface of the device.

Figure 2C:
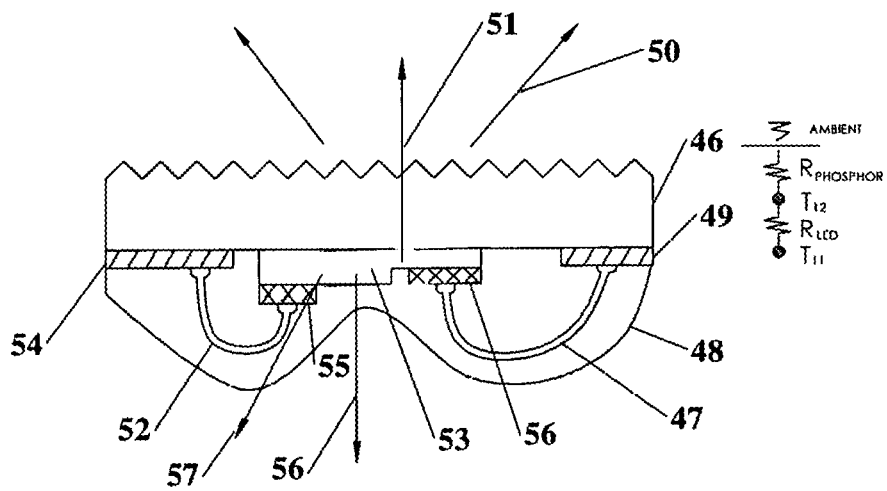

FIG. 2C depicts a lateral LED 53 mounted onto thermally conductive luminescent element 46. As in FIG. 2A and FIG. 2B, the optical emission 50 and thermal rays 51 travel in substantially the same direction. In this configuration, a transparent/translucent overcoat 48 couples thermal rays 56 and optical emission 57 out the backside of the device. Optical emission 50 and optical emission 57 may be the same or different from each other regarding emission spectrum, intensity, or polarization. Additives, coatings, and combinations of both can affect the emission spectrum, intensity and polarization within overcoat 48. Interconnect 49 and 54 may consist of, but are not limited to, electrically conductive materials in a dielectric matrix. A silver flake thick film paste screen can be printed and fired at greater than 400° C. with a reflectivity greater than 50% to form an electrically conductive material in a dielectric matrix. Wire bond 47 and 52 connect LED contacts 56 and 55 to interconnect 49 and 54 respectively. Gold wire is preferred but the wire bond can be silver, silver coated gold, and aluminum in wire, foil, and tape form. The thermal schematic illustrates the flow of heat through the device to ambient. Transparent/translucent overcoat 48 may also contain luminescent materials. As an example, transparent/translucent overcoat 48 may consist of inorganic/organic matrix material such as but not limited to HT 1500 Polysilazane (Clariant Inc.) containing at least one luminescent materials such as, but not limited to, Eljen EJ-284 fluorescent dye for conversion of green and yellow emission into red. Luminescent coatings can be applied via dip coating, spraying, inkjet, and other deposition techniques to form transparent/translucent overcoat 48 on a light emitting device containing at least one thermally conductive luminescent element 46.

Figure 3A:
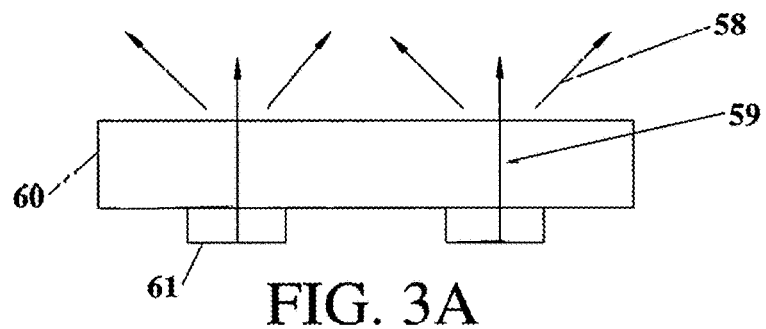
FIGS. 3A, 3B and 3C depict side views of a self-cooling solid state light source with multiple die of the present invention.

FIG. 3A depicts a self cooling light source consisting of a single thermally conductive luminescent element 60 attached both thermally and optically onto at least one LED 61. LED 61 may consist of InGaN, GaN, AlGaN, AlInGaP, ZnO, AlN, and diamond based light emitting diodes. Both blue and red light emitting diodes such as, but not limited to, InGaN and AlInGaP LEDs are attached optically and thermally to at least one thermally conductive luminescent element 60. Heat 59 and emission 58 generated by the LED 61 and the thermally conductive luminescent element 60 are spread out over a substantially larger area and volume than the LED 61. In this manner the heat generated can be effectively transferred to the surrounding ambient.

Ce:YAG in single crystal, polycrystalline, ceramic, and flame sprayed forms are preferred materials choices for thermally conductive luminescent element 60. Various alloys and dopants may also be used consisting of but not limited to gadolinium, gallium, and terbium. The thermally conductive luminescent element 60 can be single crystal cerium doped YAG grown via EFG with a cerium dopant concentration between 0.02% and 2%, preferably between 0.02% and 0.2% with a thickness greater than 500 microns. Alternatively, the thermally conductive luminescent element 60 can be flamesprayed Ce:YAG with an optional post annealing. The thermally conductive luminescent element 60 can be formed by flame spraying, HVOF, plasma spraying under a controlled atmosphere directly onto the LED 61. This approach maximizes both thermal and optical coupling between the thermally conductive luminescent element and LED 61 by directly bonding to LED 61 rather than using an intermediary material to bond the LED 61 to thermally conductive luminescent element 60. Alternately, the thermally conductive luminescent element 60 maybe formed using at least one of the following methods; hot pressing, vacuum sintering, atmospheric sintering, spark plasma sintering, flame spraying, plasma spraying, hot isostatic pressing, cold isostatic pressing, forge sintering, laser fusion, plasma fusion, and other melt based processes. Thermally conductive luminescent element 60 may be single crystal, polycrystalline, amorphous, ceramic, or a melted composite of inorganics. As an example, 100 grams alumina and Ce doped Yag powder which have been mixed together are placed into a container. The powders are melted together using a 2 Kw fiber laser to form a molten ball within the volume of the powder. In this manner the powder acts as the crucible for the molten ball eliminating any contamination from the container walls. The use of the fiber laser allows for formation of the melt in approximately 4 seconds depending on the beam size. While still in a molten state the ball may optionally be forged between SiC platens into a plate. Most preferably the molten ball is greater than 10 mm in diameter to allow sufficient working time as a molten material for secondary processing The plate may be further processed using vacuum sintering, atmospheric sintering, or hot isostatic pressing to form a translucent thermally conductive luminescent element 60. The use of fiber laser based melt processing is a preferred method for the formation of luminescent oxides, nitrides, and oxynitrides as a method of reducing energy costs compared to hot pressing or vacuum sintering. The use of controlled atmospheres including vacuum, oxygen, hydrogen, argon, nitrogen, and ammonia during the laser based melting processes is disclosed. While fiber lasers are preferred the use of localized actinic radiation to form a molten mass within a powder mass to form thermally conductive luminescent element 60 is disclosed.

Figure 3B:
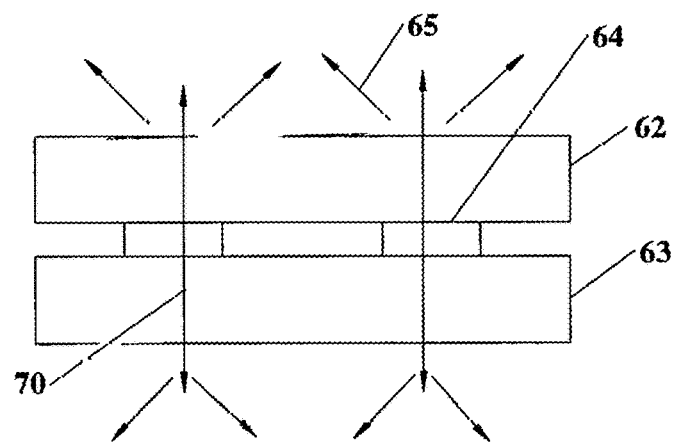

FIG. 3B depicts a self cooling light source consisting of at least two thermally conductive luminescent elements 62 and 63 attached to at least one LED 64. In this case, both thermal emission 64 and optical emission 65 can be spread out and extracted from both sides of LED 64. In all cases, multiple LEDs allow for parallel, series, anti-parallel, and combinations of all three with the appropriate electrical interconnect. In this case, optical emission 65 can be substantially similar or different on the two sides of the devices. As an example, thermally conductive luminescent element 62 can be 1 mm thick single crystal Ce doped YAG formed via EFG bottle which is then sliced into 19 mm.times.6 mm wafers. The sliced surface enhances extraction of the Ce:YAG emission out of the high index of refraction Ce:YAG material. Alternately, thermally conductive luminescent element 63 may be a pressed and sintered translucent polycrystalline alumina with a thermally fused layer of Mn doped Strontium Thiogallate and a layer of Eu doped Strontium Calcium Sulfide within a glass frit matrix. In this manner, a wide range of optical emission spectrums can be created.

In this particular case, the two sides of the devices will emit slightly different spectrums. In general, unless an opaque reflector is placed between thermally conductive luminescent elements 62 and 63 there will be significant spectral mixing within this device. This configuration can be used for quarter lights, wall washers, chandeliers, and other light fixtures in which a substantial portion of the optical emission 65 is required to occur in two separate directions. Directional elements such as BEF, microoptics, subwavelength elements, and photonic structures impart more or less directionality to the optical emission 65 of either thermal conductive luminescent elements 62 and/or 63.

In another example, Cerium doped YAG is formed via flame, HVOF, or plasma spraying and then optionally annealed, spark plasma sintered, microwave sintering, or HIP to improve its luminescent properties for one or both thermally conductive luminescent element 62 and/or 63. At least one InGaN LED and at least one AlInGaP LEDs are used for at least one LED 64.

In yet another example, high purity aluminum oxide is flamesprayed directly onto at least one LED die 64 for thermally conductive luminescent element 62 forming a translucent reflector. The emissivity of flame sprayed aluminum oxide is typically 0.8 allowing for enhanced radiative cooling from that surface. Thermally conductive luminescent element 63 is single crystal Ce:YAG formed via skull melting and sliced into 0.7 mm thick wafers 0.5 inch×1 inch in area with a cerium doping concentration between 0.1% and 2%. In this case, thermally conductive luminescent element 62 does not necessarily contain a luminescent material but acts as diffuse reflector and thermal spreading element for the heat generated by both LED 64 and thermally conductive luminescent element 62. By embedding LED 64 directly into thermally conductive luminescent element 62 it is possible to eliminate pick and place, die attachment processes and materials, and maximize both thermal transfer 64 and optical emission 65 by eliminating unnecessary interfaces. Additional luminescent materials and opaque reflectors can be positioned within or coating onto either thermally conductive luminescent elements 62 or 63. Pockets or embedded die can recess the die such that printing techniques including but not limited to inkjet, silkscreen printing, syringe dispensing, and lithographic means.

Figure 3C:
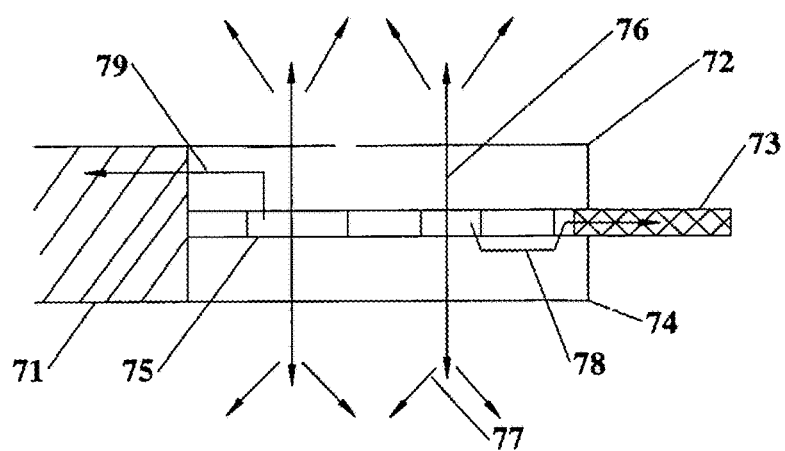

FIG. 3C depicts two thermally conductive luminescent elements 72 and 74 providing thermal conduction paths 74 and 79 to additional cooling means 71 and 73. In this case, thermally conductive luminescent elements 72 and 74 allow for thermal emission 76 and optical emission 77 and also provide for thermal conduction paths 74 and 79. Additional cooling means 71 and 73 may also provide for electrical connection to LED 75 via interconnect means previously disclosed in FIG. 2. One or more additional cooling means 71 and 73 further enhance the amount of heat that can be dissipated by the device. As an example, a typical natural convection coefficient is 20 W/m2/K and Ce:YAG has an emissivity of 0.8 near room temperature. A self cooling light source consisting of two ¼ inch×½ inch×1 mm thick pieces of Ce:YAG 72 and 74 with four direct attach LEDs 75 soldered on silver thick film interconnect traces has a surface area of approximately 2.3 cm$^2$. Using natural convection and radiative cooling approximately 500 milliwatts of heat can be dissipated off the surface of the self cooling light source if the surface temperature is approximately 100° C. and the ambient is 25° C. and the emissivity is 0.8. Of the 500 milliwatts, 350 milliwatts of heat is dissipated via natural convection cooling and 150 milliwatts are dissipated via radiation. A typical 4000K spectrum output has an optical efficiency of 300 lumens per optical watt. If the solid state light source has a electrical to optical conversion efficiency of 50%, 500 milliwatts of optical output is generated for every 500 milliwatts of heat generated. Under these conditions a ¼ inch×½ inch solid state light source operating with a surface temperature of approximately 100° C. can output 150 lumens without the need for additional heatsinking means.

The use of additional cooling means 71 and 73 can be used to significantly increase this output level by increase the surface area that heat can be convectively and radiatively transferred to the ambient. As is easily seen in the example, increasing the surface area is directly proportional to amount of heat that can be dissipated. It is also clear that the electrical to optical conversion efficiency dramatically affects the amount of heat generated, which is a key attribute of this invention. Unlike conventional LED packages light generated within this self cooling solid state light source is extracted out of both sides of the device. Isotropic extraction as shown has a 20% theoretical higher efficiency than lambertian extraction. Also using this approach, the temperature difference between the LED 75 junction and the surfaces of thermally conductive luminescent elements 72 and 74 can be very low if the thermal conductivity is greater than 10 W/mK and the LEDs 75 are attached such that there is low thermal resistance to the surrounding thermally conductive luminescent elements 72 and 74. In addition, cooling means 71 and 73 may be physically different to allow for the device to connect to different external power sources correctly. As an example, cooling mean 71 may be a pin and cooling means 73 maybe a socket such that a keyed electrical interconnect is formed. Alternately, cooling means 71 and 73 may contain magnets, which allow for attachment of external power sources. Even more preferably the magnets have different polarity such that a keyed interconnect can be formed. Additional cooling means 71 and 73 may include, but are not limited to, heatpipes, metals, glass, ceramics, boron nitride fibers, carbon fibers, pyrolytic graphite films, and thermally conductive composites. As an example, boron nitride nano tubes fibers, as provided by BNNT Inc., are pressed with exfoliated boron nitride flakes to form and thermally interconnected skeleton matrix using pressing, cold isostatic pressing, warm isostatic pressing, and/or hot isostatic pressing to form a solid sheet. The boron nitride nanotube fibers interconnect the boron nitride flakes and bond to the surface of the boron nitride flakes such that a continuous thermal matrix is formed. The resultant skeleton matrix may then be infused with polymeric or polymeric ceramic precursors including but not limited to polysilazane, polysiloxane, glasses, silicones, and other polymeric materials to form a composite.

Alternatively, The boron nitride nano tube fibers may be foamed into a yarn and woven into a cloth or felt and then infused with to form a thermally conductive composite. Alternately, high thermal conductivity carbon fibers and films may be used but boron nitride is preferred due to its low optical absorption compared to carbon based approaches. Alternately, carbon based additional cooling means 71 and 73 may include a reflective layer to reduced absorption losses and redirect light from the source as well as provide additional cooling. Additional cooling means 71 and 73 may also diffuse, reflect, or absorb optical emission 77 emitting between or from the adjacent edge of thermally conductive luminescent element 72 or 74. In this manner the far field emission of the device can be adjusted both from an intensity and spectral standpoint. Doubling the surface cooling area using additional cooling means 71 and 73 approximately doubles the lumen output as long as the thermal resistance of the additional cooling means 71 and 73 is low.

Figure 4A:
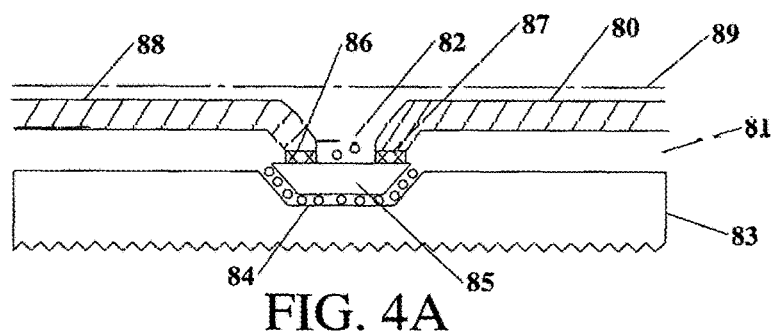
FIGS. 4A, 4B and 4C depict side views of printed electrical interconnects on luminescent thermally conductive elements for various LED die types of the present invention.

FIG. 4A depicts at least one LED 85 embedded within thermally conductive luminescent element 83. Thermally conductive luminescent element 83 may be formed via press sintering of aluminum oxide as known in the art to form a translucent polycrystalline alumina TPA with depressions sufficiently deep enough to allow for LED 85 to be recessed. Luminescent coating 84 may be substantially only in the pocket formed in thermally conductive luminescent element 83 or may cover substantially all the surfaces of thermally conductive luminescent element 83. Alternately, single crystal, polycrystalline or amorphous phosphor, pieces, plates, rods and particles can be fused or bonded into or onto thermally conductive luminescent element 83. In this manner, the quantity of luminescent material can be minimized while maintaining high thermal conductivity for the thermally conductive luminescent element 81.

As an example, single crystal Ce:YAG pieces 1 mm×1 mm and 300 microns thick can be fusion bonded into 1.1 mm×1.1 mm×500 micron deep pockets formed into TPA press sintered plates and then fired at 1700° C. in a vacuum for 10 hours such that the single crystal YAG pieces are optical and thermally fused into the bottom of the TPA pockets. LED 85 can then be bonded into the remaining depth of pocket and be used to excite the single crystal Ce:YAG pieces locally. The combined optical emission from LED 85 and the single crystal Ce:YAG pieces would be spread out and extracted by the sinter pressed TPA while still maintaining high thermal conductivity.

Alternately, luminescent powders in glass frits, polysiloxane, polysilazane, and other transparent binders can be utilized in luminescent coating 84. In particular, high temperature binders in luminescent coating 84 such as polysilazane with luminescent powders, flakes, rods, fibers and in combination both pre-cured and as a bonding agent can be positioned between thermally conductive luminescent element 83 and at least one LED 85.

Materials with high visible spectrum transmission, lower refractive index, high thermal conductivity, and low processing costs for net and final shape are preferred materials for thermally conductive luminescent element 83. These materials include, but are not limited to, TPA, Spinel, Quartz, Glass, ZnS, ZnSe, ZnO, MgO, AlON, ALN, BN, Diamond, and Cubic Zirconia. In particular, Spinel and TPA formed via press sintering are low cost of manufacture of net shape parts. The use of techniques used to form TPA parts as seen in transparent dental braces as known in the art with luminescent elements either as coatings or bonded elements can create thermally conductive luminescent element 83.

With LED 85 recessed into thermally conductive luminescent element 83, printing and lithographic methods can be used to electrically interconnect at least one LED 83 to outside power sources and/or other LEDs or devices. Unlike wirebonding, this approach creates a low profile method of interconnecting LEDs, which eases assembly of multiple sticks and reduces costs.

In one example, LED 85 is bonded into a pocket formed via laser ablation in a 1 mm thick wafer of Spinel to form thermally conductive luminescent element 83. In this example the Spinel may or may not include luminescent elements or properties. The majority of the wavelength conversion instead occurs locally around LED 85 via luminescent coating 84 and/or additional luminescent coating 82. This minimizes the amount of luminescent material necessary yet still allows for a low thermal resistance to ambient for the luminescent materials. While only a single side is shown in FIG. 4, the light source may also be bonded to another light source, heatsink, another transparent/translucent thermally conductive element to further enhance cooling and optical distribution from LED 85 and any luminescent elements within the light source. LED 85 is bonded into the pocket using polysilazane containing 0.1% to 2% doped Ce:YAG powder with a particle size below 10 microns.

Transparent/translucent dielectric layer 81 is inkjet-printed over at least one LED 85 except contact pads 87 and 86. In the case where LED 85 uses TCO based contacts, at least a portion of the TCO is not covered by transparent/translucent dielectric 81 to allow for electrical contact. Optionally an additional luminescent coating 82 may be printed or formed on at least one LED 85 to allow for additional wavelength conversion and to create a more uniform spectral distribution from the device. Interconnects 80 and 88 may then be applied either before or after curing of transparent/translucent dielectric 81. Polysilazane, polysiloxane, glass frit, spin-on glasses, and organic coatings are examples of transparent/translucent dielectric 81, preferably the coatings can maintain transparency above 300° C. Formulations containing Polysilazane with and without luminescent elements are preferred materials for additional luminescent coating 82, transparent/translucent dielectric 82 and luminescent coating 84. Preferred luminescent elements are powder phosphors, quantum dots, fluorescent dyes (example wavelength shifting dyes from Eljen Technologies) and luminescent flakes and fibers.

Electrical connection to LED 85 is via interconnects 80 and 88 for lateral LED designs. Precision inkjet printing of silver conductive inks and/or screen printing of thick film silver inks form interconnects 80 and 88. As an example thick film silver paste is screen printed and fired onto thermally conductive luminescent element 83 up to the pocket for LED 85. Transparent/translucent dielectric 81 is inkjet printed such that only contacts 87 and 86 are left exposed and the transparent/translucent dielectric 81 covers the rest of the exposed surface of LED 85 and at least a portion of thermally conductive luminescent element 83 in a manner to prevent shorting out LED 85 but still allowing access to the thick film silver paste conductors applied earlier. After or before curing of transparent/translucent dielectric 81 and optionally additional luminescent coating 82, conductive ink is inkjet-printed connecting the thick film silver conductor applied previously to the contacts 86 and 87. Using this approach, alignment issues can be overcome due to the availability of inkjet systems with image recognition and alignment features while still allowing for low resistance conductors. In general, while inkjet printing of conductors can be very accurate and be printed with line widths under 50 microns, the thickness is typically limited to under 10 microns which limits the current carry capacity of long lines. Using this approach, thick film silver conductors which can be over 50 microns thick can be used to carry the majority of the current and then short inkjet-printed traces can be used to stitch connect between the thick film silver conductors and contacts 87 and 86. Using this approach, gold wire bonding can be eliminated.

A transparent/translucent overcoat 89 may be applied over at least a portion of interconnects 80 and 89 and/or transparent/translucent dielectric 81, additional luminescent coating 82, and thermally conductive luminescent element 83 to environmentally and/or electrically isolate the device. Protective barrier layers on LED die 85 can be formed during LED fabrication to facilitate or even eliminate the need for transparent/translucent dielectric layer 81 and allow for direct printing of interconnect 89 and 88 onto contacts 87 and 86 respectively. Catalytic inks and/or immersion plating techniques allow for the formation of thicker/lower resistivity traces for interconnect 89 and 88, eliminate the need for thick film printing and allow for the use of inkjet printing for the entire interconnect. Preferred materials for transparent/translucent overcoat 89 include but are not limited to polysilazane, polysiloxane, spin-on glasses, organics, glass frits, and flame, plasma, HVOF coatings. Planarization techniques based on spin-on glasses and/or CMP can be used for transparent/translucent overcoat 89. Luminescent elements including but not limited to powders, flakes, fibers, and quantum dots can be incorporated in transparent/translucent overcoat 89, transparent/translucent dielectric 81, and additional luminescent coating 82. Luminescent elements may be spatially or uniformly dispersed in these layers.

Figure 4B:
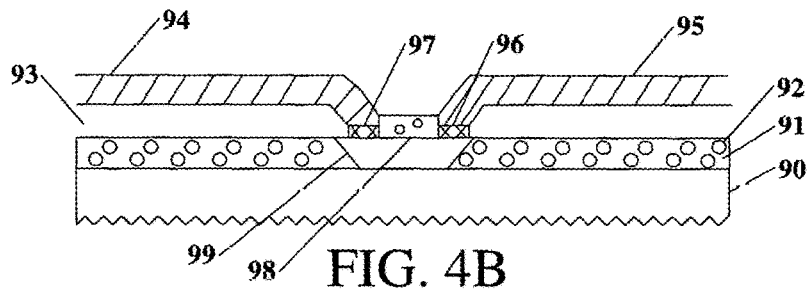

FIG. 4B depicts a light source in which a luminescent layer 91 is formed on a transparent/translucent element 90 containing extraction elements. Transparent/translucent element 90 can be, but is not limited to, single crystalline materials such as sapphire, cubic zirconia, YAG (doped and undoped), ZnO, TAG (doped and undoped), quartz, GGG (doped and undoped), GaN (doped and undoped), AlN, oxynitrides (doped and undoped), orthosilicates (doped and undoped), ZnS (doped and undoped), ZnSe (doped and undoped), and YAGG (doped and undoped), polycrystalline materials, and amorphous materials such as glass, ceramic YAG (doped and undoped), ALON, Spinel, and TPA. In general, single crystal materials grown via verneuil, EFG, HEM, Czochralski, CVD, hydrothermal, skull, and epitaxial means can be the transparent/translucent element 90.

Luminescent layer 91 may be formed directly one transparent/translucent element 90 or be formed separately and then bonded to transparent/translucent element 90. Flamespraying, plasma spraying, and HVOF techniques can form either or both luminescent layer 91 and transparent/translucent element 90. The light source can have a transparent/translucent element 90 with an alpha less than 10 $cm^{-1}$ throughout the visible spectrum and a luminescent layer 91 containing at least one luminescent element emitting between 400 nm and 1200 nm. The luminescent layer 91 can exhibit a refractive index, which is not more than 0.2 different than transparent/translucent element 90. LED 99 may be InGaN, AlInGaP, ZnO, BN, Diamond, or combinations of InGaN, AlInGaP, ZnO, BN, or diamond.

Both InGaN and AlInGaP LEDs can be used for LED 99 combined with a transparent/translucent element 90 consisting of at least one of the following materials; sapphire, Spinel, quartz, cubic zirconia, ALON, YAG, GGG, TPA, or ZnO and luminescent layer 91 and/or additional luminescent layer 98 containing Ce doped YAG. An additional red phosphor emitting between 585 and 680 nm can be used within luminescent layer 91 and/or additional luminescent layer 98. These elements form a self cooling light source which emits an average color temperature between 6500K and 1200K that lies substantially on the black body curve is a preferred embodiment of this invention. The self cooling light source can emit an average color temperature between 4000K and 2000K than lies substantially on the blackbody curve.

Multiple self cooling light sources can be used within a fixture, reflector, optic or luminaire such that color and intensity variations are averaged out in the far field. Three or more self cooling light sources within a fixture, reflector, optic or luminaire creates a uniform illumination at a distance greater than 6 inches from the sources. Transparent/translucent dielectric layer 93 may be inkjet printed, silk screen printed, formed via lithographic means and exhibits an alpha less than 10 cm$^{-1}$ throughout the visible spectrum. Interconnect 95 and 94 may be printed using inkjet, silkscreen, template, or lithographic means. Catalytic inks and immersion plating techniques increase conductor thickness and thereby reduce resistivity. Silver traces with a trace width less than 500 microns and a reflectivity greater than 50% for interconnect 95 and 94 reduce absorption of the light generated within the light source. Contacts 96 and 97 on LED 99 may be on one side only as in lateral devices or consist of one top contact and one side contact as previously disclosed in US Patent Application 20060284190, commonly assigned and herein incorporated by reference.

Figure 4C:
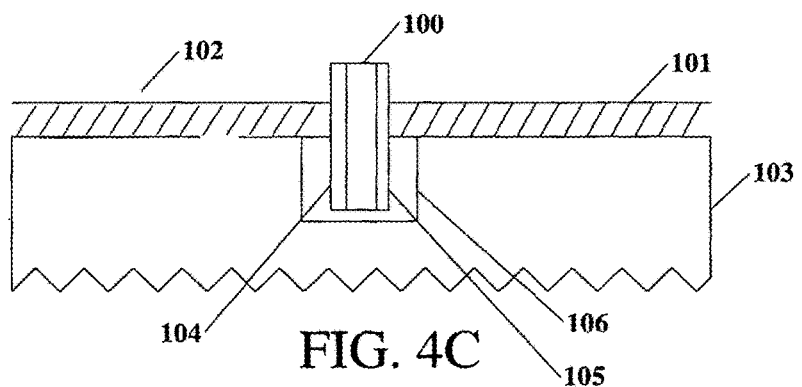

FIG. 4C depicts a self-cooling light source with at least one vertical LED 100 mounted to or at least partially embedded in thermally conductive luminescent element 103. Composite, layer, single crystal, polycrystalline, amorphous, and combinations as described previously can be used for the thermally conductive luminescent element 103. In this particular example, one vertical LED 100 is mounted such that interconnect 101 and 102 may be printed via inkjet, silkscreening, or lithographic means directly on thermally conductive luminescent element 103 and in contact with a side of vertical LED 100. This embodiment eliminates the need for an additional dielectric and allows for the use of vertical LED devices which inherently exhibit lower Vf than lateral devices. A substrate free LED as described in US patent application 20090140279 (commonly assigned and incorporated herein by reference) is a preferred embodiment for LED 100. Direct die attach and flip chip mounting configurations may also be used for LED 100. For the substrate free case, InGaN and/or AlInGaP vertical LED 100 has TCO contacts 104 and 105 for LED 100 wherein the interconnects 101 and 102 are thick film silver inks which form ohmic contact to the adjacent TCO contact 104 and 105. In this manner, absorption losses are minimized and the need for lithographic steps to fabricate LED 100 is eliminated or minimized. A self cooling light source contains at least one vertical LED 100 with TCO contacts 104 and 105 connected via thick film silver traces for interconnect 101 and 102 directly bonded to TCO contacts 104 and 105 on a thermally conductive luminescent element 103. Optionally, bonding layer 106 may be used to mount, improve extraction, incorporate additional luminescent materials or position LED 100 onto or within thermally conductive luminescent element 103.

FIG. 5 depicts various shapes of thermally conductive luminescent elements. FIG. 5A depicts a substantially flat luminescent element 107. Thickness is a function of dopant concentration but typically the thickness ranges from 200 micron to 2 mm for a uniformly doped Ce doped YAG with a Cerium doping concentration between 0.02% and 10%. In order for efficient thermal spreading to occur, the thermal conductivity of the thermally conductive luminescent element 107 needs to be greater than 1 W/mK to adequately handle average power densities greater than 0.1 W/cm2 of surface area on luminescent element 107. If the thermal conductivity is to low there is insufficient thermal spreading of the heat generated within the device which decreases the ability of the flat luminescent element 107 to cool itself via natural convection and radiative means.

Figure 5A:
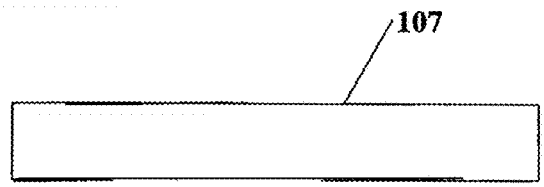
FIGS. 5A, 5B, 5C and 5D depict side views of various shapes of wavelength conversion elements of the present invention.
Figure 5B:
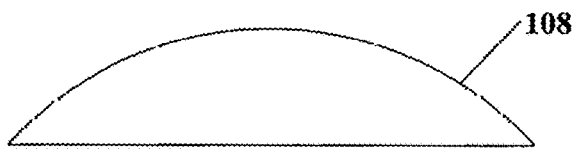

FIG. 5B depicts a non-flat (hemispheric) luminescent element 108. In this case, light extraction can be enhanced for those rays which are waveguided within the higher refractive index of non-flat luminescent element 108. In addition, far field intensity and wavelength distributions can be modified. Multiple smaller self cooling light sources with the same or different shaped thermally conductive luminescent elements create uniform or specific far field intensity and wavelength distributions. The extraction of light generated within a medium with a refractive index greater than air is restricted by total internal reflection per Snell's Law. Shaped luminescent elements 108 can be used to reduce the average optical path length of optical rays required to escape the luminescent element 108. Since absorption losses are directly proportional to the optical path length for a given absorption coefficient (alpha), reducing the average optical path length directly translates into reduced absorption losses. The spatial location of where the optical rays are generated within luminescent element 108, the refractive index of luminescent element 108, absorption coefficient (alpha) of luminescent element 108, bulk and surface scattering within and on luminescent element 108, and the geometry of luminescent element 108 can all be modeled as known in the art to optimize the extraction efficiency.

Figure 5C:
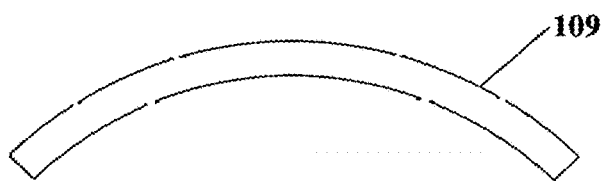

FIG. 5C depicts a non-flat (curved) thermally conductive luminescent element 109 with a substantially uniform thickness. In this manner extraction can be enhanced by maintaining a uniform thickness of luminescent material. Extrusion, pressing, molding, sawing, boring, and flamespraying techniques as known in the art may be used to fabricate various shapes of thermally conductive luminescent elements.

Figure 5D:
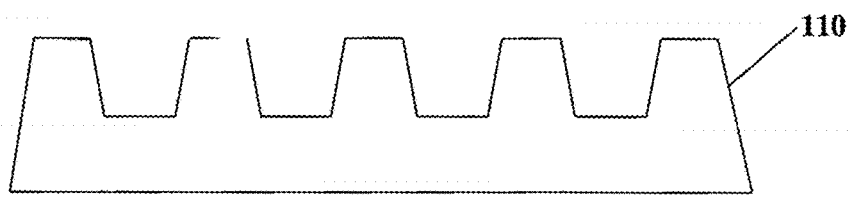

FIG. 5D depicts a non-flat (rectangular saw tooth) thermally conductive luminescent element 110 with additional surface elements to enhance convection cooling and optionally to modify or homogenize the emission output of the self-cooling light source. Extrusion, pressing, and molding techniques may be used to form thermally conductive luminescent element 110.

Figure 6A:
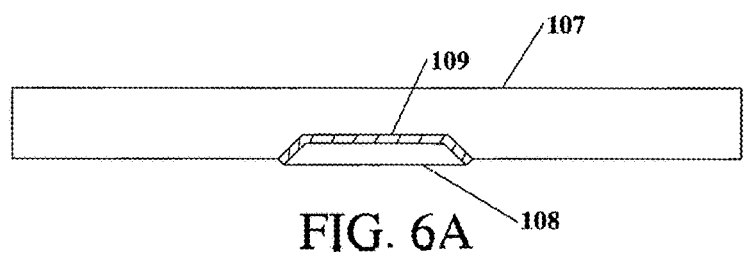
FIGS. 6A and 6B depict a side view of two different mountings for LEDs on wavelength conversion elements of the present invention.

FIG. 6A depicts a partially embedded LED 108 within a depression in thermally conductive luminescent element 107 mounted via bonding layer 109. The formation of the depression may be by laser machining, electron beam machining, etching (both chemical and mechanical), plasma etching, molding, and machining means. Substrate-free LEDs may be used for partially embedded LED 108 with a thickness less than 300 microns. By embedding partially embedded LED 108 in thermally conductive wavelength conversion element 107, the thermal resistance between the two elements can be reduced which lowers the junction temperature of the LED for a given drive level. Optionally, more of the emission from partially embedded LED into thermally conductive luminescent element 107 can be coupled thereby changing the color temperature of the self cooling light source.

Figure 6B:
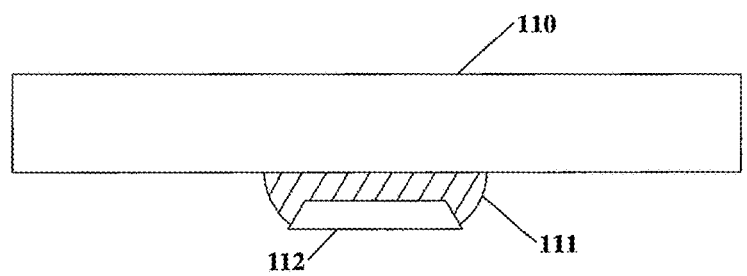

FIG. 6B depicts at least one LED 112 bonded onto thermally conductive luminescent element 110 via bonding layer 111. In this case, bonding layer 111 should exhibit a thermal conductivity greater than 1 W/mK and an alpha less than 10 cm$^{-1}$ for the emission wavelengths of LED 112.

Figure 7A:
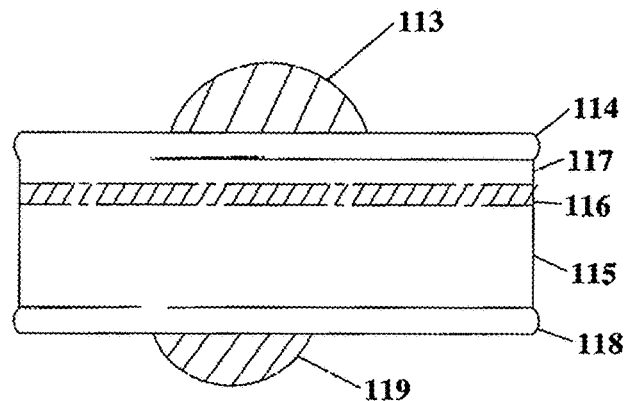
FIGS. 7A, 7B and 7C depict side views of printed interconnects on LED die of the present invention.

FIG. 7 depicts various printed contacts for TCO contact based LEDs. FIG. 7A depicts a vertical LED consisting of a top silver paste contact 113 on TCO layer 114 on p layer 117. Active region 116 is between p layer 117 and n layer 115 with n layer 115 covered with TCO contact 118 and bottom silver paste contact 119. A substrate free LED allows dual sided growth of TCO contact layers 114 and 118 on substrate free LED structures consisting of p layer 117, active layer 116 and n layer 115. Thick film high temperature silver paste contacts 113 and 119 can be printed on LEDs with TCO contacts 114 and 118 and fired at temperatures greater than 200° C. in various atmospheres to form a low optical absorption, low $V_f$, and substantially lithography free LED devices.

Figure 7B:
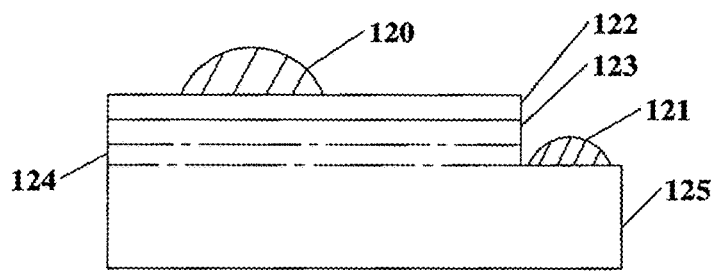

FIG. 7B depicts a lateral device with printed/inkjet-printed contacts 120 and 125. In all cases, ohmic contact to the n layer may include or not include an intermediary TCO layer to form reasonable ohmic contact. In FIG. 7B, TCO 122 is grown on p layer 123. Active layer 124 is between p layer 123 and n layer 125. TCO 122 is doped ZnO grown via CVD with a resistivity less than 0.003 ohm-cm and greater than 1000 Angstroms thick. Printed etch masks allow for etch of the step down to n layer 125. As an example, an AlInGaP LED epi may be grown on GaAs. The wafer can be etched and patterned to form the lateral device having TCO 122 on the p layer 123. Printed contacts 120 and 125 are formed on TCO 122 and n layer 125. Optionally an additional TCO layer maybe formed of n layer 125 to further reduce Vf. The addition of a eutectic solder layer to printed contact 120 and 125 to create a direct die attach die is also disclosed. In a preferred embodiment, the AlInGaP epi is removed via chemical etching using a sacrificial etching layer between the AlInGaP and GaAs substrate as known in the art. The resulting direct attach die may be additionally wafer bonded to GaN substrates as disclosed in U.S. Pat. Nos. 7,592,637, 7,727,790, 8,017,415, 8,158,983, and 8,163,582, and US Patent Applications Publication Nos. 20090140279 and 20100038656, commonly assigned as the present application and herein incorporated by reference.

Figure 7C:
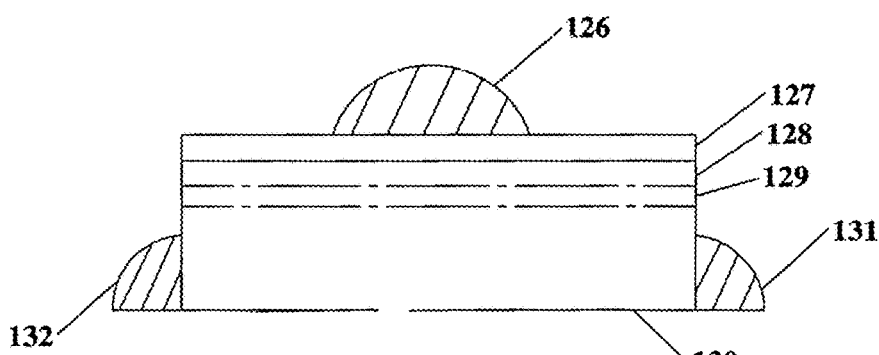

FIG. 7C depicts a printed contact with a top contact 126 and side contacts 132 and 130. Again TCO 127 forms a low ohmic transparent contact to p layer 128 and the active region 129 is between p layer 128 and n layer 130. Side contacts 131 and 132 contact the side walls of n layer 130. N layer 130 is greater than 10 microns of thickness. Even more preferably, the thickness of n layer 130 is greater than 50 microns but less than 250 microns.

FIG. 8 depicts various methods of changing the far field distribution of single self cooling source. In FIG. 8A, the refractive indices, geometry, and spacing of the LEDs 136, the wavelength conversion elements 133 and 135, and the bonding material 137 will determine the far field distribution of the source. The far field distribution is determined by where the optical rays exit, how much of the optical rays, the direction of the optical rays and the spectrum of optical rays that exit a particular spatial point on the single self cooling source. FIG. 8 illustrates various reflectors, scattering elements, and diffusers which modify where, how much, which way and the spectrum of the light rays emitted from the source. One or more wavelength conversion elements for mounting LEDs 136 can be used although two wavelength conversion elements 133 and 135 are depicted. Multiple LEDs 136 can be mounted on one or more surface of the one wavelength conversion element 133. Based on these parameters, radiation will be emitted from the structure or light guided within the source. Additionally, edge element 134 may also modify the far field distribution out of the device. Edge element 134 and bonding materials 137 may be translucent, transparent, opaque, and/or luminescent. Luminescent powders within a transparent matrix for edge element 134 and bonding materials 137 can modify the emission spectrum as well as the far field intensity distribution.

Figure 8A:
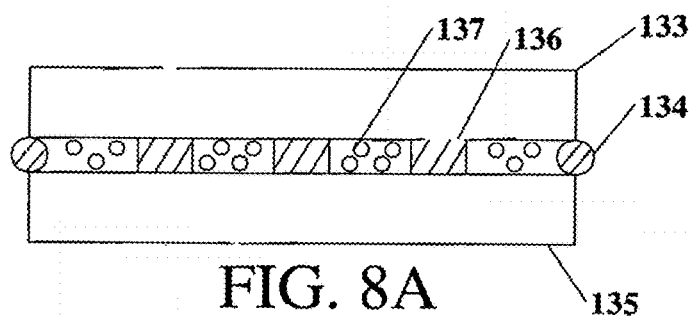
FIGS. 8A, 8B, 8C and 8D depict side views of various environmental seals for self cooling light sources of the present invention.
Figure 8B:
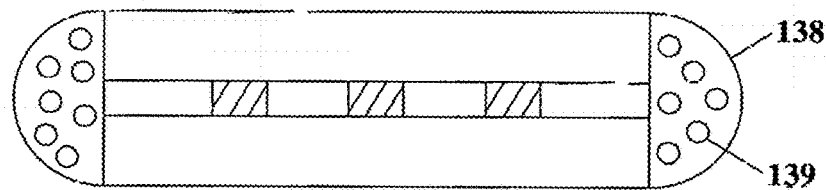

FIG. 8B depicts a self cooling light source where the entire end of the self cooling light source is substantially covered with a scattering element 139 within a matrix 138. Additionally, scattering element 139 and matrix 138 may extend to encompass not only edges of the self cooling light source but also substantial portions of the other surfaces of the self cooling light source. In this manner, light emitted from all the surface of the self cooling light source can be redirected to modify the far field intensity distribution. Luminescent materials for scattering element 139 are excited by at least a portion of the spectrum emitted by the self cooling light source.

Figure 8C:
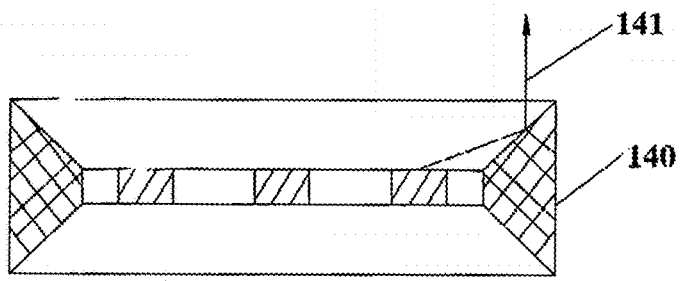

FIG. 8C depicts edge turning element 140 consisting of metal, diffuse scatterer, dielectric mirror, and/or translucent material whereby at least a portion of the light generated within the LED or wavelength conversion elements are redirected as depicted in ray 141.

Figure 8D:
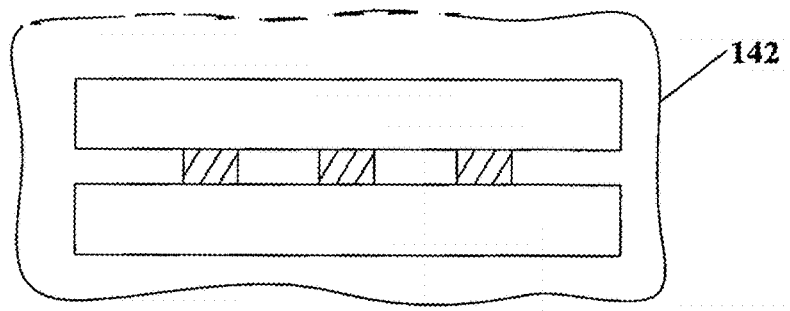

FIG. 8D depicts an outer coating 142 which may be translucent, partially opaque, polarized, and/or luminescent. The far field intensity, polarization, and wavelength distribution can be modified both in the near field and far field and spatial information can be imparted onto the self cooling light source. As an example, a self cooling light source with a shape similar to a candle flame may have a spectrally variable outer coating 142 such that red wavelengths are emitted more readily near the tip of the candle flame and blue wavelengths are emitted more readily near the base of the candle flame. In this fashion, the spatially spectral characteristics of a candle flame could be more closely matched. Using this technique a wide range of decorative light sources can be formed without the need for additional optical elements.

In another example, outer coating 142 may consist of a reflective coating such as aluminum into which openings are etched or mechanically formed. More specifically, sunlight readable indicator lights can be formed using this technique as warning, emergency, or cautionary indicators. The use of circular polarizers within outer coating 142 can enhance sunlight readability. Alternately, outer coating 142 could be patterned to depict a pedestrian crossing symbol that could be either direct viewed or viewed through an external optic thereby creating a ultra compact warning sign for crosswalks and other traffic related applications. In another example, outer coating 142 may consist of spectrally selective emissivity coating such that the emissivity of the self cooling light source is enhanced for wavelengths longer than 700 nm. By enhancing the infrared and far infrared emissivity of the self cooling light source more efficient light sources can be realized. As stated in the previous example of FIG. 3 the radiation cooling represents a significant percentage of the cooling in self cooling light sources. It is preferred that high emissivity coatings be used for outer coating 142 to maximize cooling from the surface of the self cooling light source. Most preferred is an outer coating 142 with an emissivity greater than 0.5. Depending on the maximum surface temperature the radiative cooling can represent between 20% and 50% of the heat dissipation of the source.

Figure 9A:
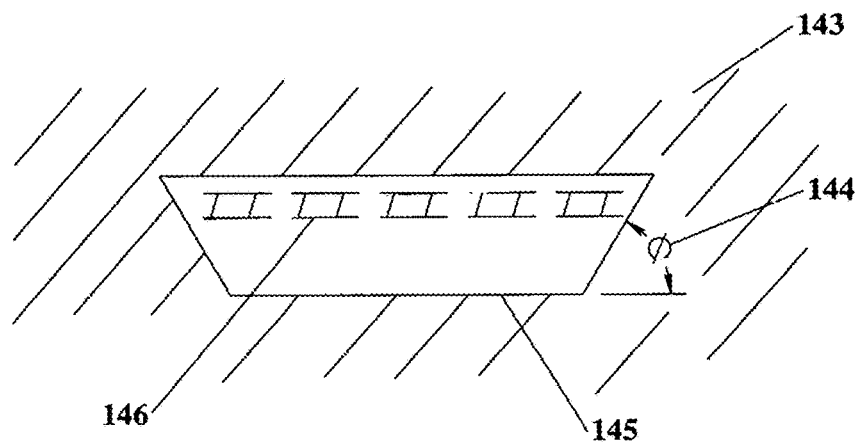
FIGS. 9A and 9B depict side views of die shaping for enhanced dual sided extraction of the present invention.

FIG. 9A depicts the use of die shaping of optical devices within a media 143. As an example, LED 145 contains an active region 146 embedded within media 143. Using ray tracing techniques known in the art, there is an optimum angle 144 to maximize the amount of radiation transferred into media 143. Typically, semiconductor materials exhibit high refractive index which tends to lead to light trapping within the LED 145. In FIG. 9A the optimum angle 144 subtends the active region 146 as shown in the figure.

Figure 9B:
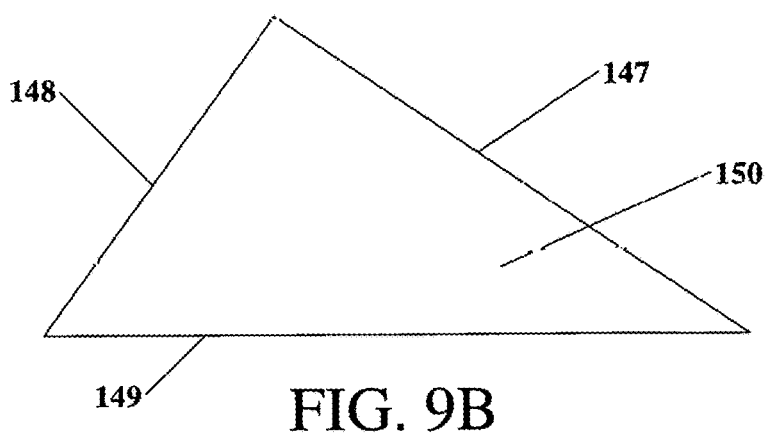

Alternately, FIG. 9B depicts that surfaces 149, 148 and 147 may be non-orthogonal forming a non square or rectangular die. In both these cases, light trapped within the LED 150 can more efficiently escape the die. The use of both forms of die shaping together is preferred. The use of non-rectangular shapes for LED 150 embedded within a wavelength conversion element to enhance extraction efficiency is a preferred embodiment of this invention.

Figure 10A:
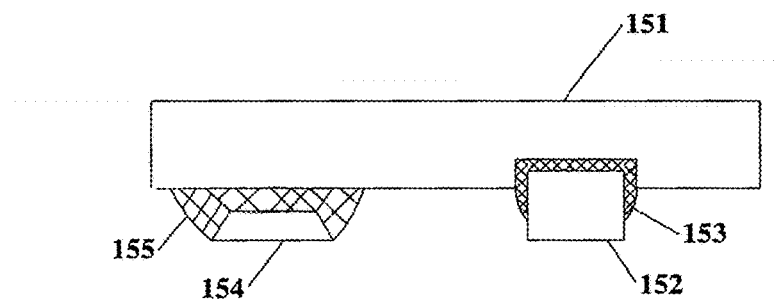
FIGS. 10A and 10B depict a side view and a graph of blue and red die in wavelength conversion elements of the present invention.

FIG. 10A depicts different mounting methods for LEDs 152 and 154 within wavelength conversion element 151 and the use of bonding layers 153 and 155. Bonding layers 153 and 155 thermally, optically, and mechanically attach LEDs 152 and 154 to at least one surface of wavelength conversion element 151. LED 152 is at least partially embedded within wavelength conversion element 151 which can allow for both edge and surface coupling of radiation emitted by the LED 152 into wavelength conversion element 151 using bonding layer 153. Alternately, LED 154 is substantially coupled to the surface of wavelength conversion element 151 using bonding layer 155. Bonding layers 55 and 153 may be eliminated where wavelength conversion element 151 is directly bondable to LEDs 154 and 152 using wafer boding, fusion bonding, or melt bonding.

Figure 10B:
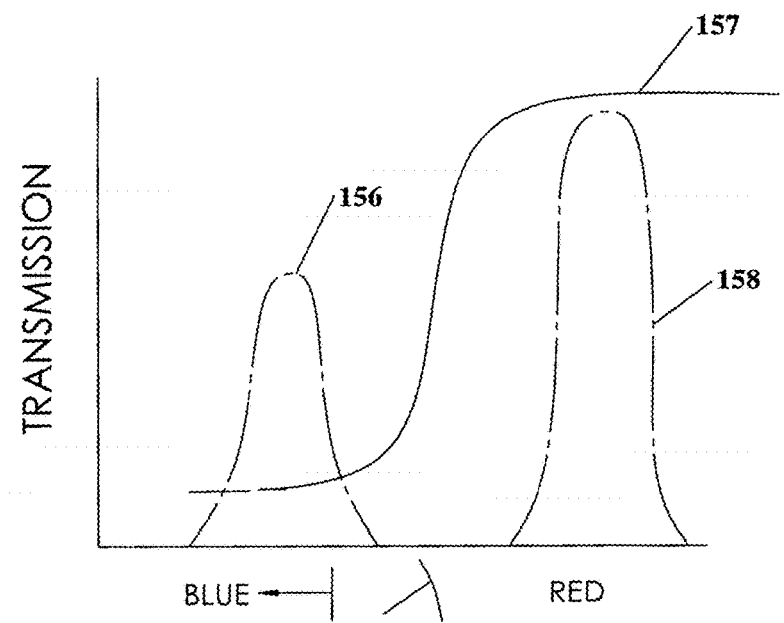

FIG. 10B depicts a typical transmission spectrum 157 of wavelength conversion elements. Blue emission 156 is absorbed by the wavelength conversion element and then reemitted at longer wavelengths. Red emission 158 is typically not strongly absorbed and therefore behaves as if the wavelength conversion element 151 is simply a waveguide. Virtually any color light source can be realized by properly selecting the right combination of blue and red LEDs within the wavelength conversion element 151. While wavelength conversion is a preferred embodiment, FIG. 10B illustrates that self-cooling light sources do not require that the wavelength conversion element 151 be luminescent. In the case of a red self-cooling light source, wavelength conversion element 151 may be used to optically distribute and thermally cool the LEDS without wavelength conversion. Alternately, UV responsive luminescent materials can be used for wavelength conversion element 162 with UV LEDs 164 or 165. The transmission spectrum 157 is shifted to shorter wavelength which allows for the formation of self cooling light sources which exhibit white body colors, as seen in fluorescent light sources. This wavelength shift however is offset by somewhat reduced efficiency due to larger Stokes shift losses.

Figure 11:
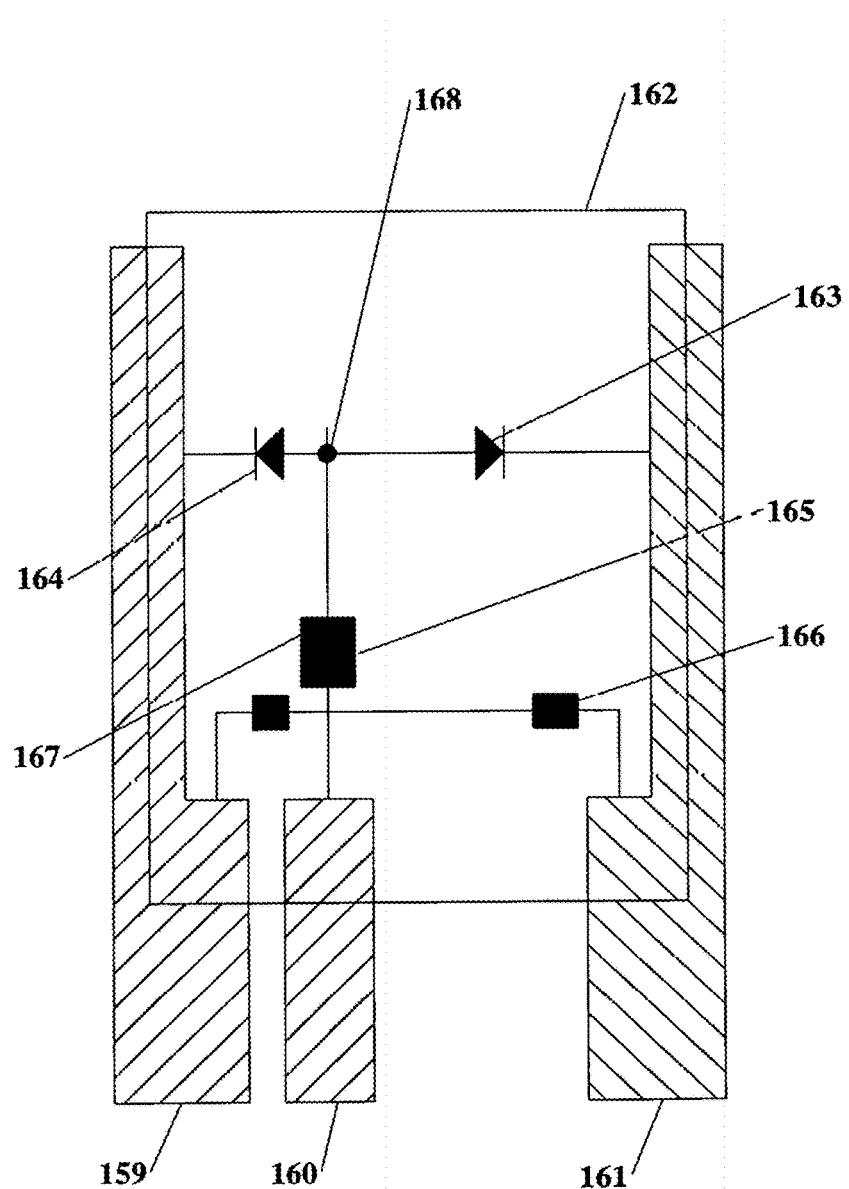
FIG. 11 depicts a top view of a three pin self cooling light source of the present invention.

FIG. 11 depicts a color tunable self-cooling light source containing at least one wavelength conversion element 162 with an electrical interconnect 168, at least one blue LED 164, at least one red LED 163, and drive electronics 165, 166, and 167. Electrical interconnect 168 is a thick film printed silver ink. Three separate pins 159, 160, and 161 to provide independent control of blue led 164 from red LED 163. Pins 159, 160, and 161 can be physically shaped to allow for keying thereby ensuring that the self-cooling light source is properly connected to external power sources. While pins 159, 160 and 161 are substantially shown on the same side of wavelength conversion element 162, the use of alternate pin configurations are anticipated by the inventors. In general, external electrical interconnect can be accomplished via pins 159, 160, and 161 as shown in FIG. 11 or via alternate interconnect means including, but not limited to, flex circuits, rigid elements containing electrical traces, coaxial wires, shielded and unshielded twisted pairs, and edge type connectors on or connected to wavelength conversion element 162 are embodiments of this invention. Additionally feedthroughs within wavelength conversion element 162 can be formed via mechanical, chemical etching, laser, waterjet, or other subtractive means to form external interconnects to any of the previous listed electrical interconnect elements in any plane of the wavelength conversion element 162.

Figure 12:
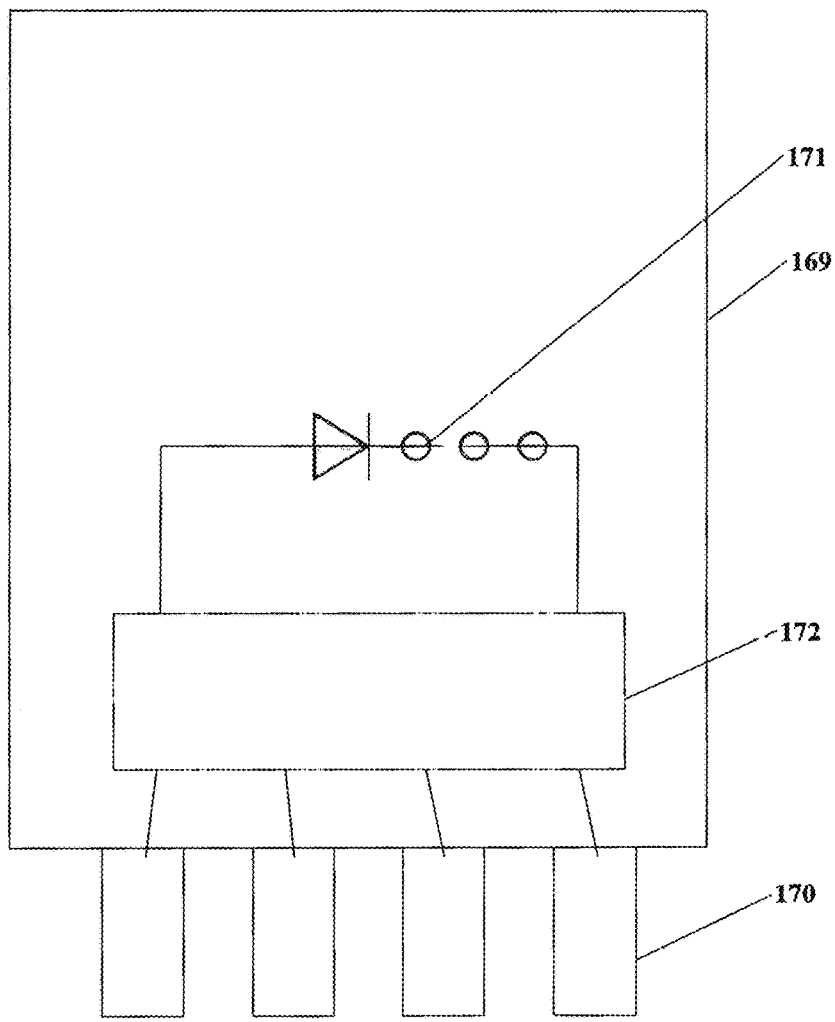
FIG. 12 depicts a top view of a self cooling light source with an integrated driver of the present invention.

Drive electronics 165, 166, and 167 may consist of both active and passive elements ranging from resistors, caps, and inductors. In this manner, a variety of external drive inputs can be used to excite the light source. As an example, a current source chip may be mounted onto the wavelength conversion element 162 and connected to an external voltage source via pins 159, 160, and 161. As known in the art, typical current source chips can also have an external resistor which sets the current which flows through the current source chip. The external resistor may be mounted on the wavelength conversion element 162 or be external to the source and connected to current source chip via pins 159, 160, and 161. As the functionality within the light source increases, the number pins may be increased. Integrated circuits can be used for drive electronics 165, 166, and/or 167. Wavelength conversion element 162 also substantially cools the drive electronics 165, 166, and 167 as well as LEDs 164 and 165. Pins 159, 160, and 161 may be used to remove heat from the heat generating elements of the light source. Wavelength conversion element 162 is luminescent and provides for optical diffusion and cooling of the heat generating elements within the self cooling light source In this case, additional wavelength emitters may be added including, but not limited to, UV, violet, cyan, green, yellow, orange, deep red, and infrared FIG. 12 depicts a self cooling light source with an embedded active driver 172 capable of driving multiple LEDs 171, all of which are mounted and cooled substantially by wavelength conversion element 169. Input pins 170 may provide power input to active driver 172 but also provide outputs including, but not limited to, light source temperature, ambient temperature, light output levels, motion detection, infrared communication links, and dimming controls. As previously disclosed, the transmission spectrum of the wavelength conversion element 169 allows for low absorption of longer wavelengths. An infrared/wireless emitter and receiver can be integrated into embedded active driver 172 so that the self cooling light source could also serve as a communication link for computers, TVs, wireless devices within a room, building, or outside. This integration eliminates the need for additional wiring and devices.

Figure 13A:
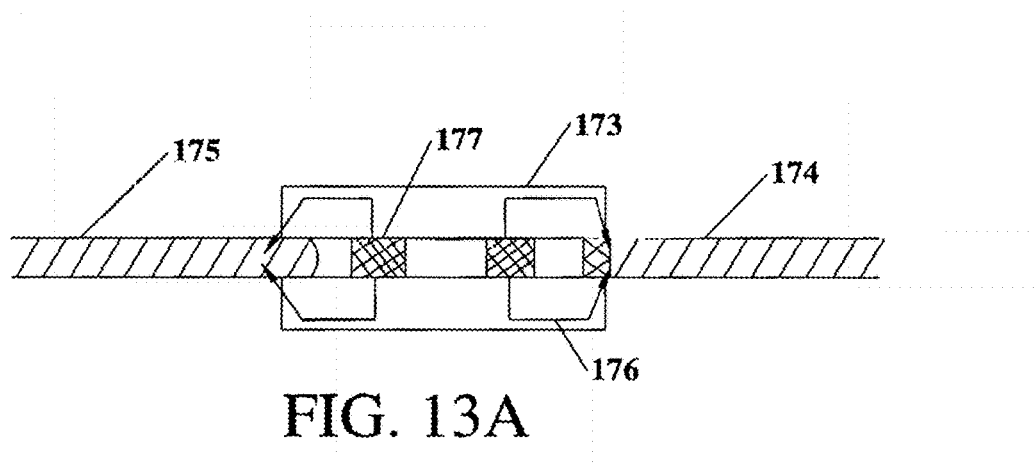
FIGS. 13A and 13B depict a side view and a perspective view of a self cooling light source with additional cooling means of the present invention.

FIG. 13A depicts the use of electrical contacts 174 and 175 as additional thermal conduction paths for extracting heat 178 out of the wavelength conversion elements 173 and 174 additionally cooling paths for LED 177. LED 177 may be direct attach or flip chip and may be a lateral, vertical, or edge contact die. As an example, electrical contact 174 and 175 may consist of 0.3 mm thick Tin plated aluminum plates sandwiched between wavelength conversion elements 173 and 174. In this manner both electrical input and additional cooling means for wavelength conversion elements 173 and 174 as well as LED 177 can be realized.

Figure 13B:
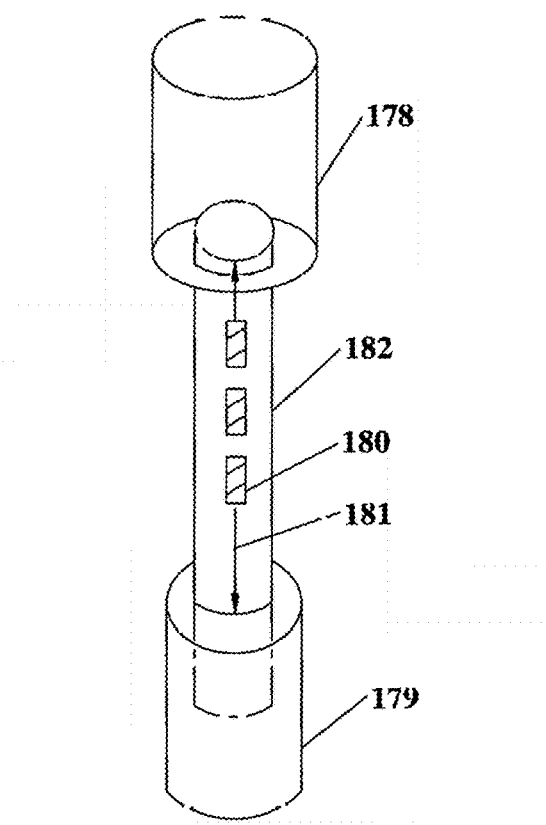

FIG. 13B depicts a rod based light source with LEDs 180 within rod shaped wavelength conversion element 182 wherein heat 181 is additionally extracted via conduction to contacts 178 and 179. Alternately, hemispherical, pyramidal, and other non-flat shapes and cross-sections maybe used for wavelength conversion element 182 to create a desired intensity, polarization, and wavelength distribution. Cross-section and other shapes, such as spheres and pyramids, maximize the surface area to volume ratio, so that convective and radiative cooling off the surface of the wavelength conversion element 182 is maximized while using the least amount of material possible. As an example, contacts 178 and 179 may consist of 2 mm copper heatpipes thermally bonded via a bonding method including but not limited to gluing, mechanical, soldering, or brazing means to wavelength conversion element 182. In this manner additional cooling maybe realized. LEDs 180 may be mounted on the surface or inside of wavelength conversion element 182. As an example LEDs 180 may be mounted on the flat surface of two hemispherical wavelength conversion elements 182. The two hemispherical wavelength conversion elements 182 are bonded together to form a spherical self cooling light source with the LEDs 180 embedded within the wavelength conversion elements 182.

Alternately, the LEDs 180 may be mounted on the spherical surface of the hemispherical wavelength conversion element 182 such the light generated by LED 180 generally is coupled into the hemispherical wavelength conversion element 182. Optionally, the flat surface of hemispherical wavelength conversion 182 may have additional luminescent coatings such that the light emitted by LEDs 180 is effectively coupled by the hemispherical wavelength conversion element 182 onto the luminescent bonding layer which reflects, transmits, converts or otherwise emits both the light emitted by the LEDs 180 and any luminescent elements back out of the hemispherical wavelength conversion element 182. The advantage of this approach is that the LEDs 180 are mounted closer to the cooling surface of the wavelength conversion element, a high degree of mixing is possible, and the angular distribution of the source can be controlled by how well the bonding layer is index matched to the wavelength conversion element 182. Bonding two hemispherical wavelength conversion elements 182 together forms a spherical source with externally mounted LEDs 180.

Figure 14:
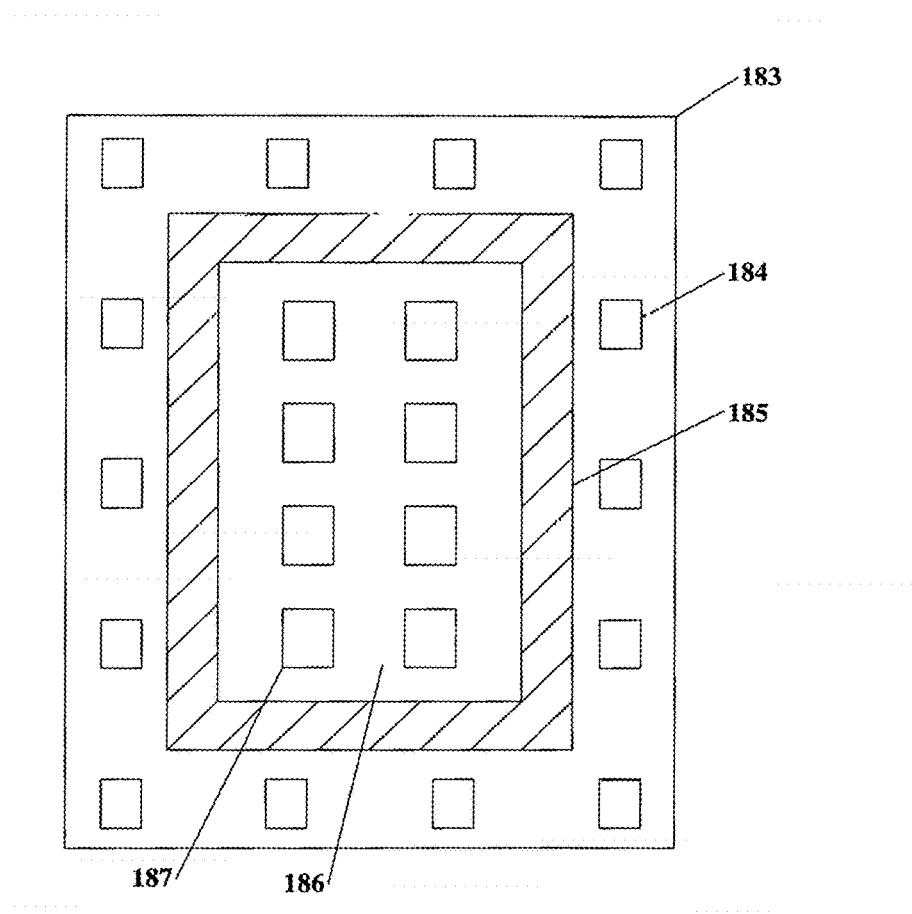
FIG. 14 depicts a top view of a self cooling light source with thermally isolated sections of the present invention.

FIG. 14 depicts a self cooling light source with at least two thermally and/or optically separated zones. Waveguide 183 containing LEDs 184 is optically and/or thermally isolated via barrier 185 from waveguide 186 and LEDs 187. Dual colored light sources can be formed. Alternately, temperature sensitive LEDs such as AlInGaP can be thermally isolated from more temperature stable InGaN LEDs. Waveguide 183 and 186 may or may not provide luminescent conversion. LEDs 184 are AlInGaP (red) LEDs mounted to waveguide 183 made out of sapphire. LEDs 187 are InGaN blue LEDs mounted onto waveguide 186 which is single crystal Ce:YAG. The barrier 185 is a low thermal conductivity alumina casting material. AlInGaP efficiency drops by 40% for junction temperatures over 60° C. while InGaN efficiency will drop only by 10% for a similar junction temperature. White light sources can be realized by thermally isolating the AlInGaP from the InGaN high overall efficiency. Using this approach the two sections operate at different surface temperatures. The InGaN LED 187 and waveguide 186 operates at a higher surface temperature while the AlInGaP LED 184 and waveguide 183 operates at a lower surface temperature.

Figure 15:
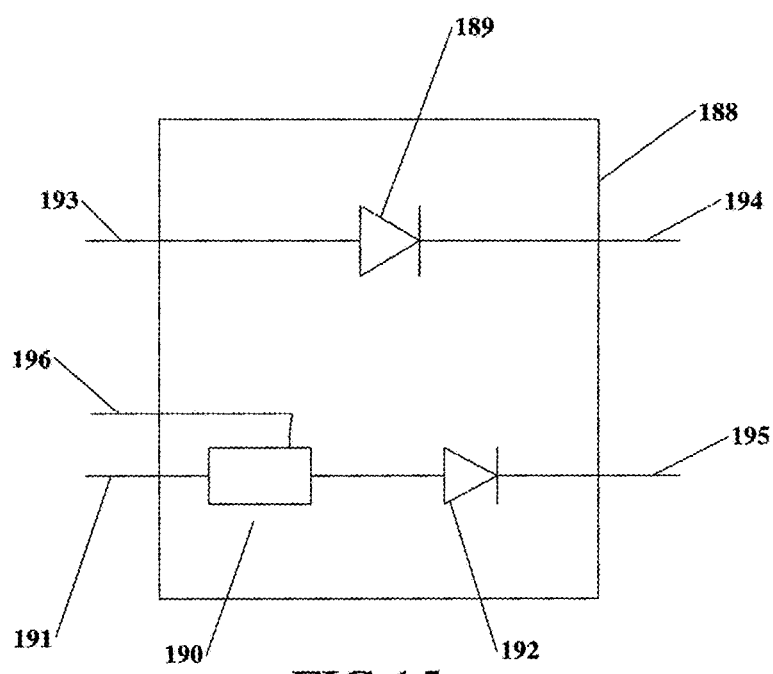
FIG. 15 depicts a top view of a self cooling light source with separate drive scheme for blue and red die of the present invention.

FIG. 15 depicts Blue LED 189 mounted to wavelength conversion element 188 and Red LED 192 with driver 190. Power lines 191, 193, 194, and 195 and control line 196 are also shown. Red LED 192 drive level is set via control line 196 by controlling the voltage/current flow available via power line input 191 and output 195. Typically driver 190 would be a constant current source or variable resistor controlled via control line 196. As stated earlier, blue LED 189 is typically InGaN with more stable regarding temperature, life and drive levels than red LED 192 typically AlInGaP. As an example, TPA coated with europium doped strontium thiogallate singularly or as a multiphase with another gallate, such as Eu doped magnesium gallate for wavelength conversion element 188 is excited by 450 nm LED 189. 615 nm AlInGaP red LED 192 is also mounted on the wavelength conversion element 188 along with driver 190. Heat is spread out via wavelength conversion element 188 as well as the radiation emitted by blue LED 189 and red LED 192. Control line 196 is used to adjust the color temperature of the source within a range by increasing the current to red LED 192 relative to the fixed output of blue LED 189. Additional LEDs and other emission wavelengths can be used.

Figure 16A:
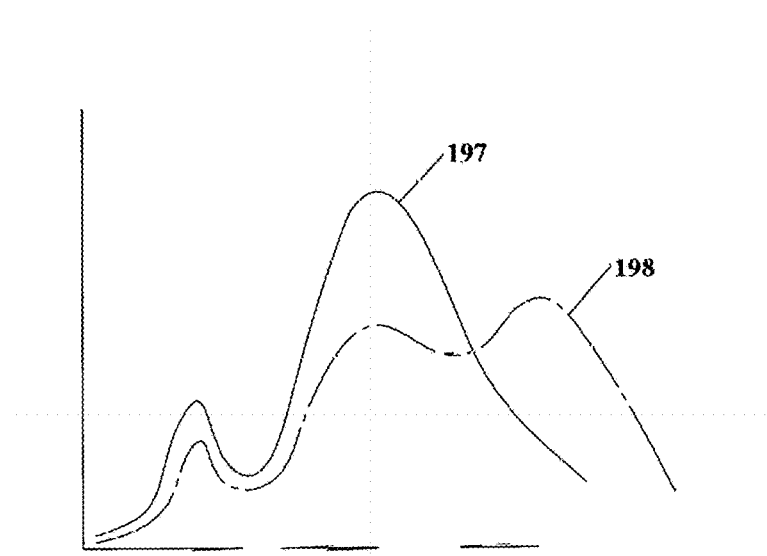
FIGS. 16A and 16B depict graphs of subtractive red phosphor and additive red LED of the present invention.

FIG. 16 depicts a white light spectrum for a typical solid state light source. FIG. 16A illustrates high color temperature low CRI spectrum 197 typically created by blue LEDS and Ce:YAG phosphors. Additional phosphors are typically added to add more red content in order to lower the color temperature as shown in spectrum 198. This red addition however requires that a portion of the blue and in some cases some of the green be absorbed which reduces overall efficiency.

Figure 16B:
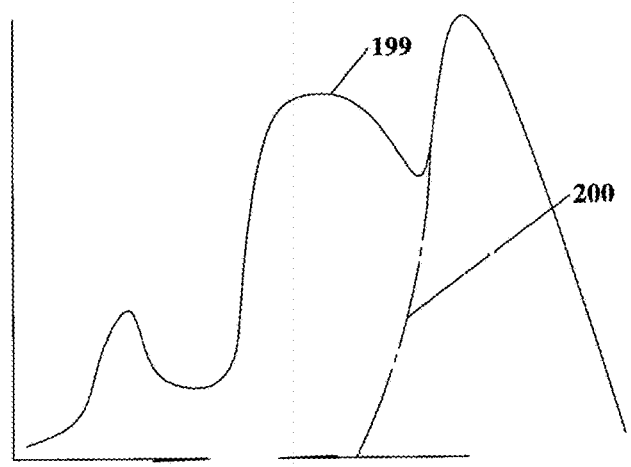

FIG. 16B depicts the typical spectrum 199 from a blue LED, Ce:YAG phosphor, and red LED. The red LED spectrum is additive as shown in spectrum 200. In general, both methods of FIG. 16 are used to form self-cooling light source described in this invention.

Figure 17:
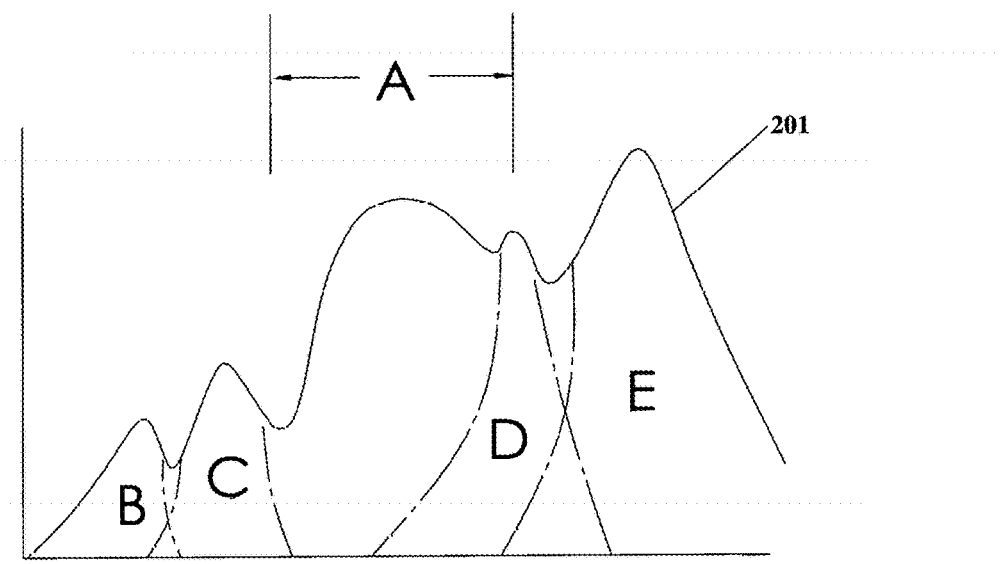
FIG. 17 depicts a graph of the spectrum from a self cooling light source with cyan and yellow LEDs of the present invention.

FIG. 17 depicts a high CRI white light spectrum 201 formed by mixing phosphor and LED spectrums A, B, C, D, and E. Spectral ranges can be mixed, diffused and converted within the wavelength conversion elements disclosed in this invention in addition to cooling, mechanically mounting, environmentally protecting, and electrically interconnecting the devices needed to generate the spectrums depicted. As an example, spectrum B may be derived from a blue 440 nm emitting LED, a portion whose output is used to excite a single crystal Ce:YAG luminescent element as previously disclosed to form spectrum A between 500 nm and 600 nm. Spectrum C may consist of a cyan quantum dot which also converts a portion of output of the blue 440 nm emitting LED into 490 to 500 nm wavelengths. Spectrum D maybe produced by using a wavelength shifter die such as Eljen-284 (Eljen Technologies Inc.) to convert a portion of Spectrum A into wavelengths between 580 nm and 700 nm and Spectrum E maybe a AlInGaP red LED emitting between 600 and 800 nm. Infrared emitters or converters may also be added for communication links, security, and night vision applications.

Figure 18A:
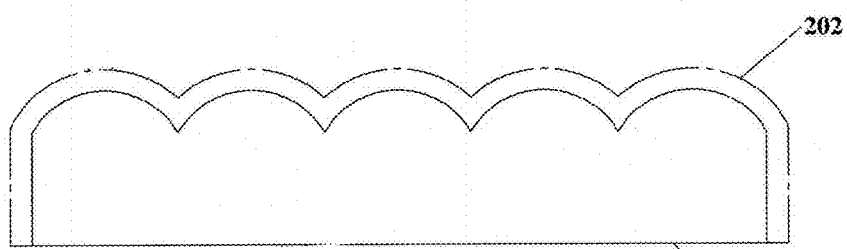
FIGS. 18A and 18B depict a side view and a perspective view of various shapes with luminescent coatings of the present invention.
Figure 18B:
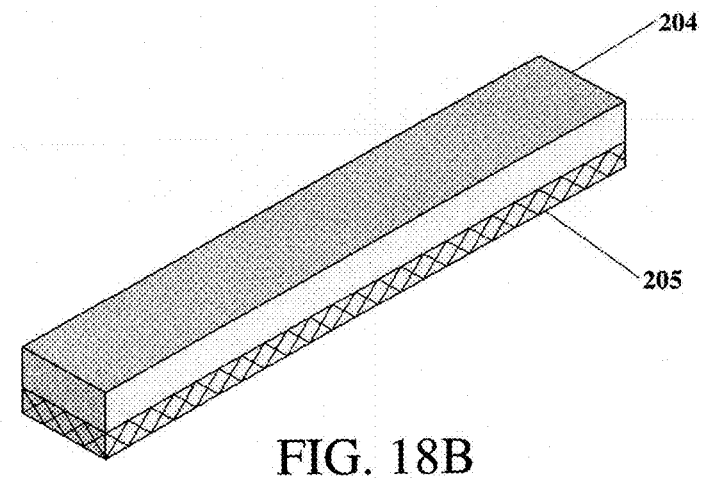

FIG. 18 depicts various shapes of waveguides and luminescent coatings. FIG. 18A depicts a textured thermally conductive waveguide 203 with a luminescent coating 202. As an example, a micro lens array may be press sintered out of TPA and coated with Ce:YAG via flame spraying. FIG. 18B depicts an EFG formed single crystal Ce:YAG rod 204 coated with a high emissivity coating 205 with a refractive index substantially equal to the geometric mean of Ce:YAG and air and a thickness greater than 300 angstroms. In the previous example of FIG. 3 the importance of radiative cooling even at low surface temperatures is disclosed. In this example the radiative cooling can represent up to 30% of the total heat dissipated as long as the emissivity of the surface is above 0.8. Emissivity varies from very low (0.01) for polished metals to very high 0.98 for carbon black surfaces.

The use of high emissivity coatings 205 that are also transparent in the visible spectrum are most preferred. These include but not limited to silicates, glasses, organics, nitrides, oxynitrides, and oxides. Even more preferred are high emissivity coatings 205 that also exhibit a thermal conductivity greater than 1 W/mK. The high emissivity coating 205 thickness is preferably between 1000 angstroms and 5 microns thick. The emissivity coating 205 may also be luminescent.

Figure 19A:
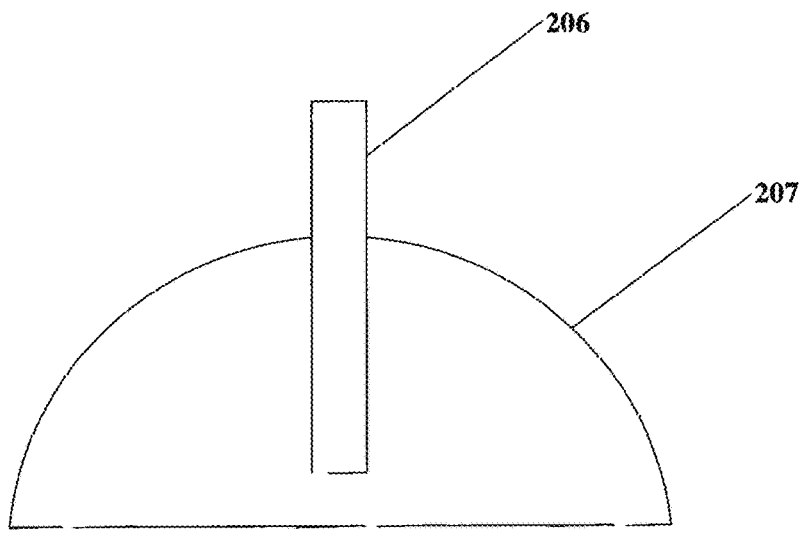
FIGS. 19A and 19B depict side views of optics for self cooling light source of the present invention.

FIG. 19A depicts a self cooling light source 206 and an optic 207. Optic 207 may be reflective, transparent, translucent or opaque. Both decorative and directional means may be used as an optic. Parabolic, elliptical, non-imaging and other optical configuration as known in the art may be used as an optic. In particular, the use of prismatic surface elements on optic 207 wherein a substantial portion of the light emitted by self cooling light source 206 are redirected in a direction orthogonal to their original direction are embodiments of this invention. Optic 207 redirects a portion of the light from light source 206 downward. The optic 207 may consist of, but is not limited to, glass, single crystal, polymer or other translucent/transparent materials. Colored translucent/transparent materials create a specific decorative or functional appearance. As an example a light source 206 may be embedded into an orange glass glob to form a decorative lamp. The elimination of the need for a heatsink greatly simplifies the optical design and allows for a wider range of reflectors and optical elements.

Figure 19B:
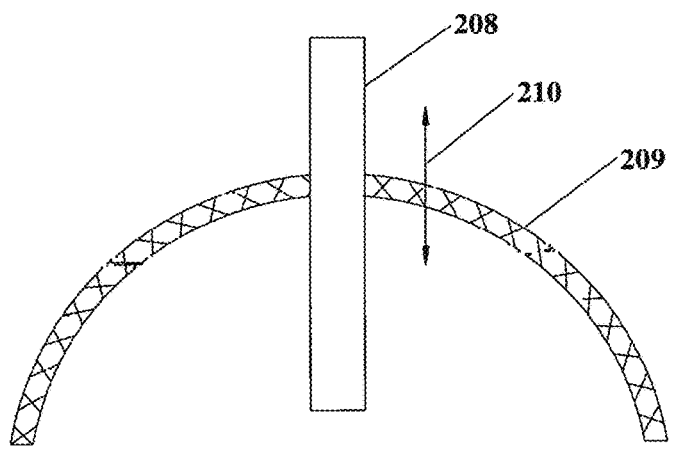

Alternately, FIG. 19B depicts an external movable reflector 209 which slides 210 up and down light source 208. Using this approach the percentage of downward light can be adjusted relative to the amount of diffuse lighting. Again the elimination of heatsinks and the formation of an extended source greatly simplifies the optical design of the light fixture.

Figure 20A:
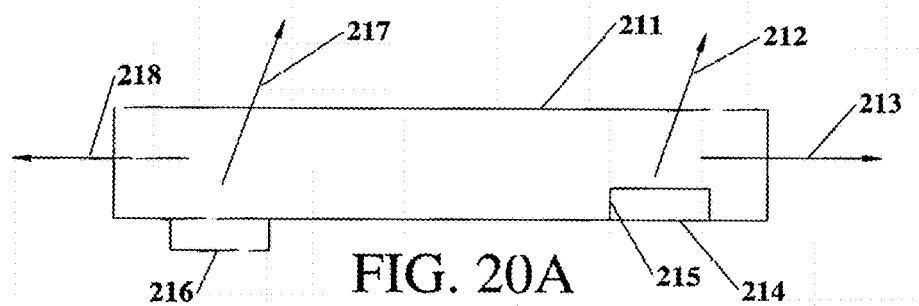
FIGS. 20A, 20B, and 20C depict side views of means of modifying the far field optical patterns of self cooling light sources of the present invention.

FIG. 20 depicts methods of adjusting the far field distributions of single light sources. In FIG. 20A, the far field distribution both intensity and wavelength can be adjusted by mounting methods for the LEDs 214 and 216 within or onto wavelength conversion element 211. LED 214 depicts an embedded LED 214 in which a pocket or depression is formed in wavelength conversion element 211. This embedded LED changes the ratio of transmitted rays 212 to waveguided rays 213 relative to surface mounted LED 216 which has a substantially different ratio of transmitted rays 217 to waveguided rays 218.

Figure 20B:
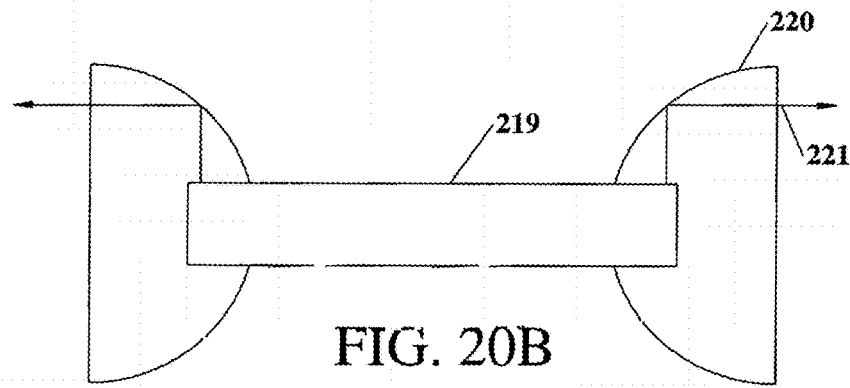

In FIG. 20B an optic 220 extracts light off of more than one surface of light source 219. In this case, rays 221 are redirected substantially orthogonally to the surface the rays were emitted from and mixed with the rays from other surfaces of light source 219. The optic 220 may be a prism, lens, parabolic, elliptical, asperical, or free formed shape.

Figure 20C:
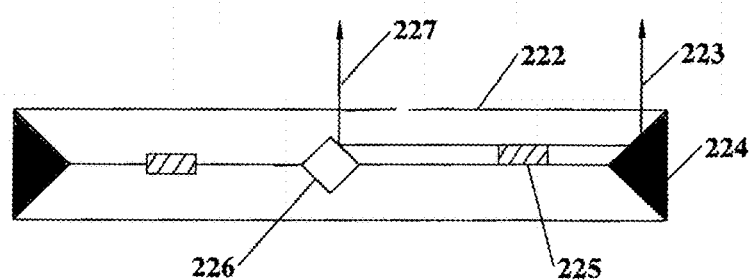

FIG. 20C depicts embedded LEDs 225 in embedded occlusions 226 with edge-turning elements 224 which were previously disclosed. Rays 227 and 223 can be directed substantially orthogonally out of the wavelength conversion element 222.

Figure 21A:
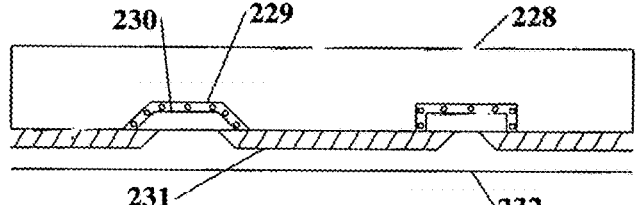
FIGS. 21A, 21B, and 21C depict side views of a light emitting patch source and its use with waveguiding materials of the present invention.

FIG. 21A depicts a LED die 230 bonded into a wavelength conversion element containing depressions or pockets 228 using a bonding layer 229, a electrical interconnect layer 231 and protective dielectric layer 232. As an example, a 500 microns thick Ce:YAG single crystal wafer is laser drilled to have a pocket into which lateral LED die 230 is placed and bonded using a polysilazane. The polysilazane is at least partially cured. The polysilazane is further coated using inkjet printing techniques to cover all but the metal contact pads of lateral LED die 230. Conductive ink is printed via, but not limited to, inkjet, screenprinting, tampo, or lithographic means such that the exposed metal contact pads of lateral LED die 230 are interconnected electrically via electrical interconnect layer 231. Nanosilver, silver paste, and other highly reflective printable electrically conductive inks, pastes or coatings are the preferred conductive ink. A protective dielectric layer 232 is applied via, but not limited to, inkjet, spin coating, dip coating, slot coating, roll coating and evaporative coating means.

Figure 21B:
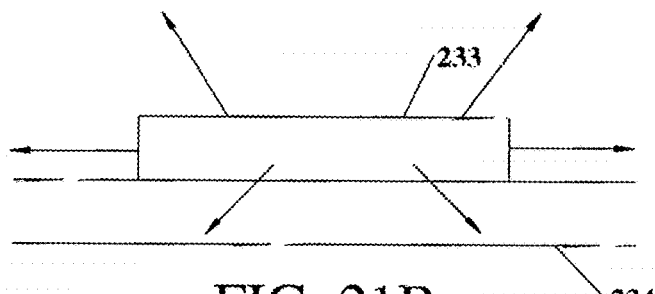
Figure 21C:
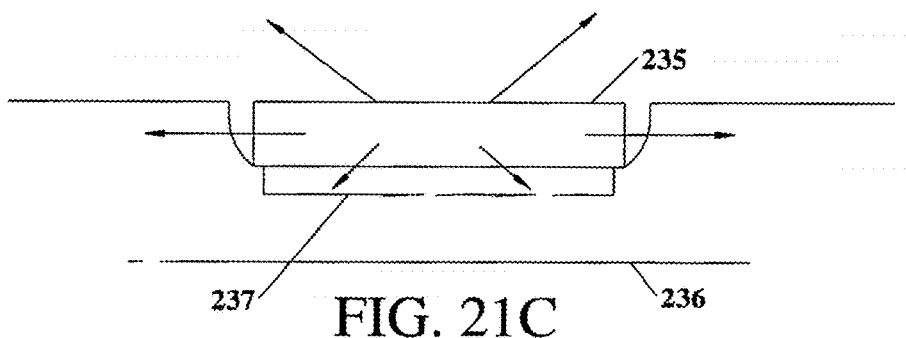

FIG. 21B depicts LED 233 mounted to the surface of waveguide 234 most of the rays do not couple to the waveguide efficiently. FIG. 21C depicts embedded LED 235 within a pocket in waveguide 236. Optically and thermally there is more coupling into waveguide 236. In addition the use of embedded LED 235 allows for simplified interconnect as depicted in FIG. 21A. Further luminescent insert 237 may be used to convert at least a portion of the spectrum from LED 233 or 235. In this case lower cost materials may be used for waveguide 234 and 236 respectively. As an example, single crystal Ce:YAG inserts 50 microns thick with a Ce doping concentration greater than 0.2% with substantially the same area as embedded LED 235 can be inserted into press sintered TPA waveguides. In this manner, the amount of luminescent material can be minimized while still realizing the benefit of a thermally conductive element including, but not limited to, waveguide, increased thermal cooling surface, and optical spreading of the light over an area larger than either luminescent insert 237 or LED 235. Ceramic, polycrystalline, amorphous, composite and pressed powders of luminescent materials may be used for luminescent insert 237. A waveguide 236 with a thermal conductivity greater than 1 W/mK can work with a luminescent insert 237. LED 235 consists of one or more of the LED which is an InGaN, AlGaN, and/or AlInGaP based LED in waveguide 236 with a thermal conductivity greater than 1 W/mK with at least one luminescent insert 237.

Figure 22:
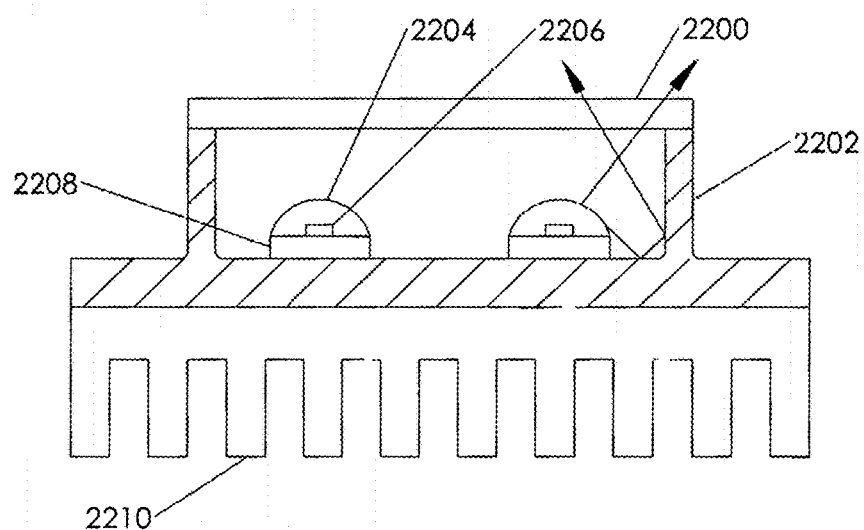
FIG. 22 depicts a side view of a prior art light strip.

FIG. 22 depicts a prior art LED light strip. Enclosure 2202 contains LED packages which typically consist of a submount 2208, LED die 2206, and an encapsulating lens 2204. The inside of enclosure 2202 is reflective the light emitted by the LED die 2206 and a diffuser/lens element 2200 is placed at distance sufficient for the light from the individual LED packages to mix and form a spatially uniform output on the output surface of the diffuser/lens element 2200. Heat is extracted from the LED packages through the enclosure 2202 to heatsink 2210. In general the majority of the heat generated travels in the opposite direction of the light emission which is through diffuser/lens element 2200. From a practical standpoint the distance between the LED packages is the minimum distance the diffuser/lens element 2200 needs to be away from the LED packages to get uniformity. In this configuration the diffuser/lens element 2200 typically is typically made of organic materials (plastic) and even the enclosure 2202 and heatsink 2210 may be filled with organic materials. For example the diffuser/lens element 2200 is typically acrylic or polycarbonate which is flammable under exposure to flame.

Unfortunately, the techniques known in the art to reduce flame spreading and smoke adversely affect the optical transmission and optical absorption losses in these materials. This approach suffers from low lumens per gram due the weight of the heatsink, typically less than 1 lumen/gram. Because the majority of the light emitted by the LEDs in this configuration is emanating from a point source, the LED 2206 of the light source uniformity must be accomplished within the diffuser/lens element 2200 in a single pass. The LEDs in these prior art light sources are directly viewable (imaged by the naked eye through the diffuser/lens element) due to the short optical path length between the LED and the diffuser. Therefore, there is minimal light bounces or recycling before emission from the light source. Intensity, uniformity and wavelength averaging all suffer due to the lack of mixing and averaging. Also the thickness of the source must be increased to allow for mixing to occur when the LEDs are mounted in this direct view configuration. This makes it difficult to achieve aesthetically pleasing low profile light sources.

Figure 23:
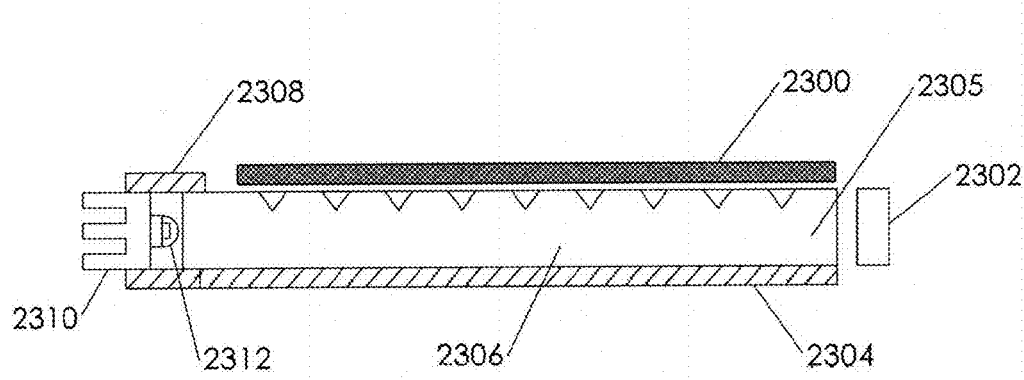
FIG. 23 depicts a side view of a prior art waveguide light panel.

FIG. 23 depicts a prior art solid state waveguide based panel light with a waveguide 2305 typically made of acrylic and polycarbonate. In this configuration the amount of flammable material is even larger with up to several pounds of organic material that is used to form a large waveguide as required in a 2 ft×2 ft. or 2 ft.×4 ft troffer. The required optical properties such as transmission and low scatter or absorption losses are even more strict in this configuration. This makes it very difficult to use conventional flame retardant techniques on these elements. Light from the LED package 2313 is coupled to the waveguide 2305 using a reflector 2308. Heat generated by the LED package 2313 is dissipated by thermal conduction to appended heatsink 2310 (typically an outer metal frame or bezel). A rear reflector 2304, extraction elements 2306, end reflector 2302, and top diffuser 2300 are used to direct light within the waveguide 2305 through the top diffuser 2300. Typically reflectors and diffusers are all organic and further enhance the flammability and toxic smoke generation upon exposure to open flames. In general, the use of large area organic materials in films, diffusers, organic optical waveguides, organic reflective films, and organic elements within LED packages can pose an increased risk to firefighters and occupants during a fire within a structure. Many organics like acrylic emit not only smoke but also toxic and noxious chemicals when burned. The need exists for non-flammable solid state light sources.

This invention overcomes all of the aforementioned deficiencies by indirectly mounting the LEDs within a light recycling cavity formed by a reflector and an optically reflective and light transmitting thermally conductive element which functions as a reflective exit aperture to the light recycling cavity and simultaneously removes the heat generated by the LEDs from the light emitting surface of the light transmitting thermally conductive element.

Figure 24:
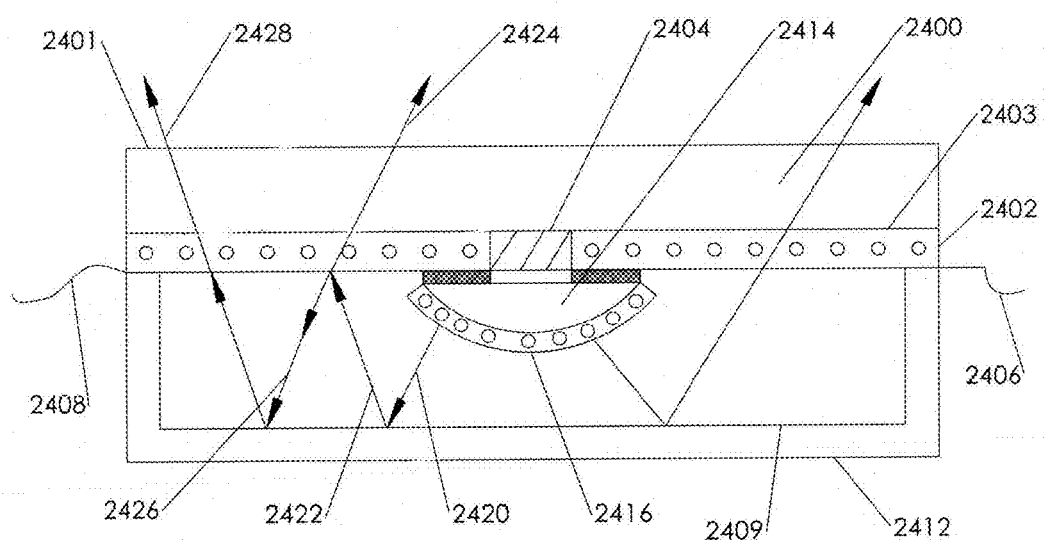
FIG. 24 depicts a side view of a self cooling light strip where emitting surface and cooling surface substantially the same.

FIG. 24 depicts a non-flammable self cooling light source of the present invention in which the emitting and cooling surfaces are substantially the same. As an example, the light source contains at least one LED 2414, at least one reflector element 2412, and at least one light transmitting thermally conductive element 2400. The at least one light transmitting thermally conductive element 2400 has at least one exterior light emitting surface. The at least one exterior light emitting surface 2401 faces outward into the room or lighted area, while the interior surface 2403 of at least one light transmitting thermally conductive element 2400 faces into the light recycling cavity 2409 formed by the at least one light transmitting thermally conductive element 2400 and at least one reflector element 2412. The at least one LED 2414 is contained within the light recycling cavity 2409 and in thermal contact with said at least one light transmitting thermally conductive element 2400 such that the heat from said at least one LED 2414 is transferred via thermal conduction from said at least one LED 2414 to the exterior light emitting surfaces 2401 of said at least one light transmitting thermally conductive element 2400 and wherein the heat is removed to ambient via convection and radiative cooling from the exterior light emitting surfaces 2401 of the at least one light transmitting thermally conductive element 2400.

The light transmitting thermally conductive element 2400 has a thermal conductivity that is greater than 1 W/mK. More preferably the light transmitting thermally conductive element 2400 has a thermal conductivity that is greater than 10 W/mK. Most preferably the light transmitting thermally conductive element 2400 has a thermal conductivity that is greater than 20 W/mK. In this particular embodiment at least one LED 2414 (this can be one of the following: a direct attach LED die, flip chip LED die, wire bonded LED die or other LED die configuration with or without wavelength conversion layer 2416 or an LED package with integrated wavelength conversion layer 2416) is soldered, wirebonded, adhesively bonded or mechanically attached to at least one light transmitting thermally conductive element 2400 either via or in addition to being attached to interconnect 2402 (which is comprised of at least one electrically conductive trace printed and fired on light transmitting thermally conductive element 2400). This electrical conductive interconnect is preferably highly reflective or light transparent. Interconnect 2402 may be conductive inks containing silver with either organic or inorganic binders. The binders are removed during firing resulting in a metal trace. Light transmitting thermally conductive element 2400 is typically composed of inorganic materials such as but not limited to alumina, sapphire, Yag, GGG, Spinel, and other inorganic high thermal conductivity materials which exhibit light absorption losses below 1 $cm^{-1}$ throughout the visible wavelength range, a thermal conductivity greater than 1 W/mK, and are non-flammable when exposed to a flame. Alternately, glass composites and non-flammable inorganic/organic composites may be used such as polysilazane/hBN. Polysilazane as well as other siloxanes may be used based on their tendency to convert to non-flammable residues upon exposure to flames. Alumina is preferred due to its ready availability in thin layers, low cost, and compatibility with high temperature process like sintering of conductive inks and soldering. Alumina has a thermal conductivity of greater than 20 Watt/m-K.

Whereas materials with high light transmissivity (TPA, Spinel, sapphire, etc.) may be used as the light transmissive thermally conductive element 2400, these materials are relatively expensive. Lower cost ceramics tend to be more opaque and have low light transmission and higher reflectivity. However, it has been found by practicing the tenets of this invention that high net light extraction efficiency may be achieved with these materials. For example commercial grade Alumina (96% $Al_2O_3$) 500 micrometers thick has an optical transmission of less than 16% with a reflectivity of 84%. Visually it has a white body and appears opaque. However, by utilizing this highly reflective material (e.g. alumina) as the light transmitting thermally conductive element and forming a light recycling cavity 2409 with reflector 2412 greater than 70% of the light may be extracted from the light recycling cavity. Using these more reflective (84%) materials, light emitted from the LED(s) 2414 and optionally wavelength converted, impinges on the reflector 2412 of the light recycling cavity 2409 and is reflected 2422 to the light transmitting thermally conductive element 2400 where 16% would be transmitted and emitted 2424 from the outside surface 2401 of light transmitting thermally conductive element 2400. However, the light not transmitted (84%) is reflected 2426 back to the reflector 2412 where it again is reflected back to the light transmitting thermally conductive element 2400 and ~13.4% (16% of the 84% reflected light)

is transmitted through and emitted 2428 from the outside surface 2401 of light transmitting thermally conductive element 2400. This diminishing cycle, for each reflection, continues until a very high percentage of the original light emitted by the LED(s) 2414 passes through the white reflective (almost opaque) alumina and is emitted by the light source. Remarkably, extraction efficiencies of greater than 70% have been achieved with alumina ($Al_2O_3$) elements that have less than 17% in line transmittance. These efficiencies are measured by measuring the raw lumen output of the LED(s) 2414 themselves at a given voltage and current and then measuring the output from the light recycling cavity 2409 with the LED(s) 2414 (enclosed within the closed cavity) driven at the same voltage and current. The very high number of reflections within the light recycling cavity 2409 and the fact that the LED's 2414 light emitting surface faces away from the light transmitting thermally conductive element 2400 combined with the highly reflective and white opaque appearance of the light transmitting thermally conductive element 2400 results in a very uniform and monolithic appearance to the light emitting surface of the light source 2401. This overcomes one of the biggest complaints about prior art solid state light sources: that the LEDs can be seen or viewed, appearing as point sources or hot spots when viewing the emitting surface of the light source.

Alumina is readily available in thin sheet form. However, a wide range of additives are used to form the material. For this application, additives which do not introduce absorption losses are preferred. Some additive or impurities such as iron can introduce absorption in to the final product and therefore are not preferred. In general, materials which exhibit white body color are preferred. However for applications such as red light sources a wider range of body colors can be used. As such, the most preferred light transmitting thermally conductive element 2400 is one that exhibits low absorption losses over the wavelengths emitted by the light source.

Heat generated by at least one LED 2414 and the wavelength conversion layer 2416 is conducted through the light transmitting thermally conductive element 2400 and transferred to the surrounding ambient without the need for additional heatsinking means. The thickness of the light transmitting thermally conductive element 2400 is between 100 microns and 5 mm, with 500 microns to 1 mm preferred. If there is low level of scatter within the light transmitting thermally conductive element then the use of thicker light transmitting thermally conductive elements 2400 is preferred. However in this particular configuration highly scattering light transmitting thermally conductive elements 2400 such as 94% to 100% alumina can be used if the absorption losses are low. As such, sintering aids which do not color the alumina are preferred. Also the at least one reflector 2412 should have a reflectivity greater than 80% and more preferably greater than 90%. The LED 2414 is preferably in direct thermal contact to the light transmitting thermally conductive element 2400. Alternatively, the LED 2414 may be mounted or thermally in contact with the reflector or other thermally conductive substrate as long as the thermal impedance between the LED 2414 and the light transmitting thermally conductive element 2400 is minimized. While at least one LED 2414 may be thermally attached to at least one reflector 2412 to provide additional cooling surface area, it is preferred and an embodiment of this invention that the majority of the heat generated by at least one LED 2414 be transferred to the at least one light transmitting thermally conductive element 2400. This allows for the light source to be mounted onto a wide range of surfaces which may or may not be thermally conductive such as ceilings, walls, sheet rock, ceiling tiles, glass and other low thermal conductivity surfaces which may be combustible or have maximum safe temperature ranges.

In some cases it may even be advantageous to thermally isolate at least one reflector 2412 from surfaces onto which it is mounted. This is possible because substantially all the heat generated within the light source can be dissipated off the exterior light emitting surface(s) 2401 of the at least one light transmitting thermally conductive element 2400. Preferably, heat generated in the wavelength conversion layer 2416 is also transferred to at least one light transmitting thermally conductive element 2400 so that it may be dissipated and cooled by the exterior light emitting surface(s) 2401 of the light transmitting thermally conductive element 2400 as well. In general, this invention discloses a light source with at least one light transmitting thermally conductive element 2400 with an external light emitting surface 2401 whereby the same exterior light emitting surface 2401 also transfers the majority of the heat generated in the light source to ambient. This includes heat generated by the at least one LED 2414, heat associated with absorption losses within the light recycling cavity 2409, and any heat generated by losses (e.g. Stoke's shift) in the at least one wavelength conversion layer 2416. At least one reflector 2412 may additionally be used to transfer heat from either the at least one LED 2414 and/or wavelength conversion layer 2416 to at least one light transmitting thermally conductive element 2400. While at least one reflector 2414 could in principle also contain all or part of interconnect 2402 for at least one LED 2414. It should be noted however that additional dielectric layers (not shown) are required to integrate the interconnect 2402 into at least one reflector 2412.

It is important that all interior surfaces of the light recycling cavity have high reflectivity. For example reducing the reflectivity of the reflector 2412 from 95% to 90% will reduce the extraction efficiency of the light recycling cavity by 20%. At least one LED 2414 should preferably have a high reflectivity. However, it is not that critical because the LED(s) 2414 will typically cover a very small percentage of the inside area of the light recycling cavity. The interconnect 2402 similarly also covers only a small fraction of the inside area of the light recycling cavity 2409. However, reactivities of greater 80% are achievable and preferred for the interconnect 2402. The at least one reflector should have a reflectivity greater than 90%, and more preferably greater than 95%. Also, the wavelength conversion layer 2416 preferably should have low absorption losses. Scattering can be very high in these light recycling systems as long as the loss associated with each reflection is minimal. With the use of mostly reflective light transmitting thermally conductive element 2400 a light ray 2420 may as many as 40 reflections before exiting the light recycling cavity 2409 through light transmitting thermally conductive element 2400. In a conventional light recycling cavity with a physical exit aperture the can only exit through the exit aperture. However, using a mostly reflective and translucent light transmitting thermally conductive element 2400 there is no defined physical exit aperture. Nevertheless, light does escape as described previously.

Optionally, a blocking layer 2404 may be used to prevent light from the at least one LED die 2414 and/or wavelength conversion layer 2416 from passing through the light transmitting thermally conductive element 2400 without first entering and mixing in the light recycling cavity. This will assure a high degree of mixing and minimize any light "hotspots" near the LED 2414. Alternately at least one LED 2414 may be an LED package where blocking layer 2404 is integrated into the LED package.

Power to at least one LED die 2414 is powered via interconnect 2402 which in turn attaches to external power leads 2408 and 2406. While FIG. 24 is a two dimensional view, it should be noted that interconnect 2402 covers only a small amount of the surface area of interior surface 2403 of light transmitting thermally conductive element 2400. External power leads 2408 and 2406 may be but not limited to flex circuits, pins, wires, insulated wires, magnetic contacts and other physical contacting means. At least one reflector 2412 is preferred to be a high reflectivity coated metal such as Alanod™, but other materials both diffuse and specular with reflectivity greater than 90% may be used. It can't be seen in this cross sectional view but the reflector 2412 forms five sides of the light recycling cavity 2409. The reflector 2412 can be easily manufactured using conventional sheet metal processes (e.g. stamping, etc.). In general the use of inorganic materials are preferred to create non-flammable recycling cavity self cooling light sources, but reflective polymers for the reflector 2412 may be used in applications where flammability is not an issue.

Figure 25:
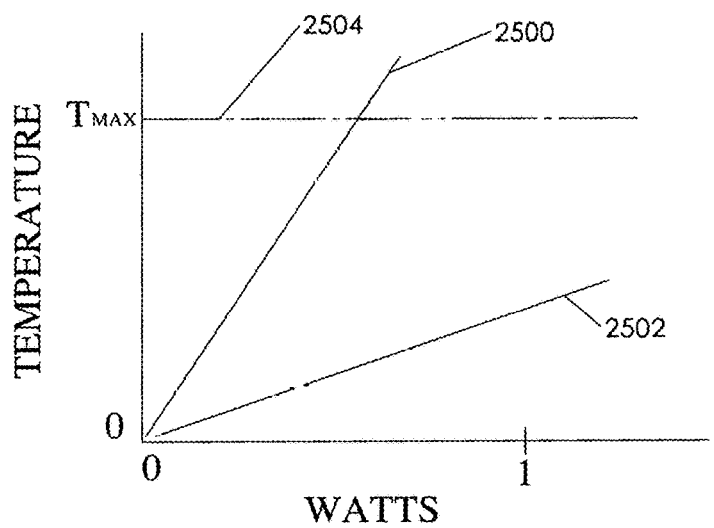
FIG. 25 depicts a graph showing die temperature versus thermal conductivity of emitting/cooling surface.

FIG. 25 illustrates the temperature of the LED (sometimes referred to as "die") versus input watts to the LED (die) for two different thermal conductivities for the light transmitting thermally conductive translucent element 2400 previously discussed in FIG. 24. The LED die has a maximum operating temperature $T_{max}$ as depicted by the dashed line 2504. If a low thermal conductivity material such as glass with a thermal conductivity of 1 W/m-K is used as the light transmitting thermally conductive translucent element 2400, the LED's maximum operating temperature $T_{max}$ is reached at very low input power (watts) even if the thickness of the glass is made very thin. This is depicted by graph line 2500 showing the relationship between input power of the LED in watts versus LED junction temperature $T_j$. In this case to get usable light output, requires the use of large numbers of LED die closely spaced at low drive levels. When the light transmitting thermally conductive element 2400 is instead made of materials with a thermal conductivity of 30 W/m-K (e.g. alumina), curve 2502 is attained in which very high drive levels to the LED can be used while maintaining the LED die temperature below $T_{max}$. This enables increased spacing between LED die and higher drive levels for each LED die without exceeding the LED's maximum temperature limit $T_{max}$. This results in higher light output with fewer LEDs which lowers cost. In general, higher thermal conductivity materials are preferred for the light transmitting thermally conductive element 2400 to spread the heat out over a larger area.

Figure 26:
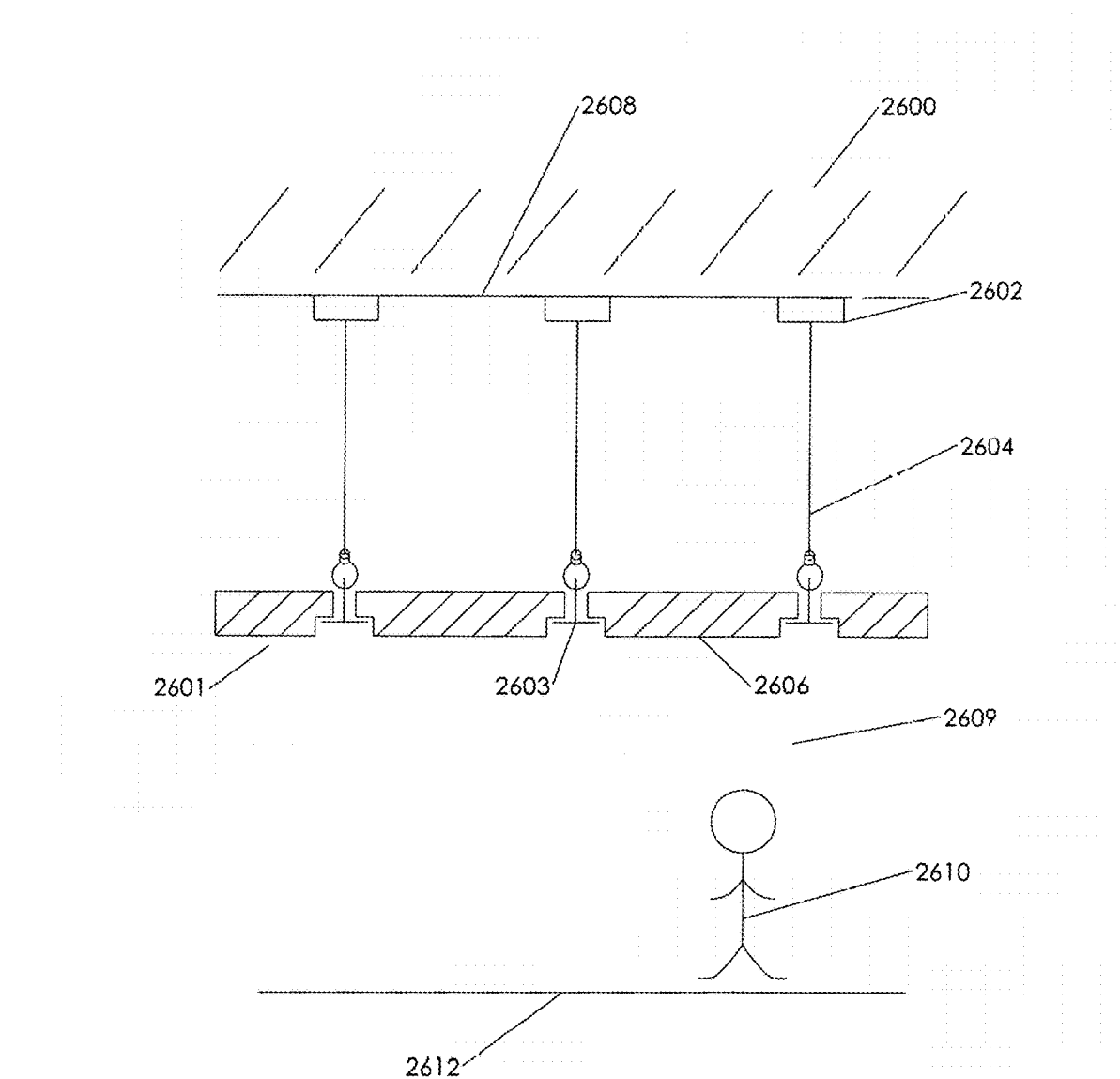
FIG. 26 depicts a side view of a suspended ceiling installation.

FIG. 26 depicts a typical suspended ceiling 2601. Ceiling tile 2606 is suspended from the deck 2600 via anchors 2602 and wires 2604 by grid 2603. Plenum space 2608 is the region above the ceiling tile 2606 and below the deck 2600. The office space 2609 is below the ceiling tile 2606 and above the floor 2612. Occupants (or a firefighter) 2610 typically occupy the office space 2609 below the ceiling 2601. A fire can propagate in either the plenum space 2608 or office space 2609. Duct work, electrical distribution, networks and fire suppression typically is in plenum space 2608. In general, it is desirable to minimize the number and size of breaks in the suspended ceiling for acoustic, aesthetic, and fire suppression. Existing lighting fixtures such as troffers break the contiguous nature of the suspended ceiling 2601. In most building codes, troffers and can lights are required to be encased in fireproof enclosures on the plenum side 2608. Unfortunately most solid state light fixtures depend on cooling to occur within the plenum space 2608. The use of fireproof enclosures greatly hinders the transfer of heat to the plenum space 2608. It is highly desirable, from an aesthetic, fire, and acoustical standpoint that any lighting fixture not break the contiguous nature of the suspended ceiling 2601 and would cool itself from or into the office space area 2609. Even more preferably an ideal lighting fixture would blend aesthetically into the grid 2603 and/or ceiling tile 2606 and be lightweight enough such that the lighting fixture can be seismically certified with the suspended ceiling such that no additional wires 2604 to support the light source are required. The use of high lumens/gram self cooling light sources of this invention provides a means of meeting these simultaneous requirements. Most preferable is that these lighting fixtures are non-flammable thereby reducing the risk to firefighters/occupants 2610 even further. In general the light sources of this invention may be installed on a wall, floor, ceiling or suspended ceiling of a room such that substantially all the heat generated by the light source is dissipated into the room or office space side 2609. The light source contains at least two external contacts that both mechanically attach and electrically interconnect said light source to a powered distributed grid 2603 contained on a ceiling, wall or floor of a room wherein the light source can be easily removed and attached to different locations on the wall, floor or grid to adjust the lighting distribution in the room. All of this can be achieved without ever having to break or penetrate the ceiling barrier. The light source may be integrated into movable ceiling tiles 2606 as well.

Figure 27:
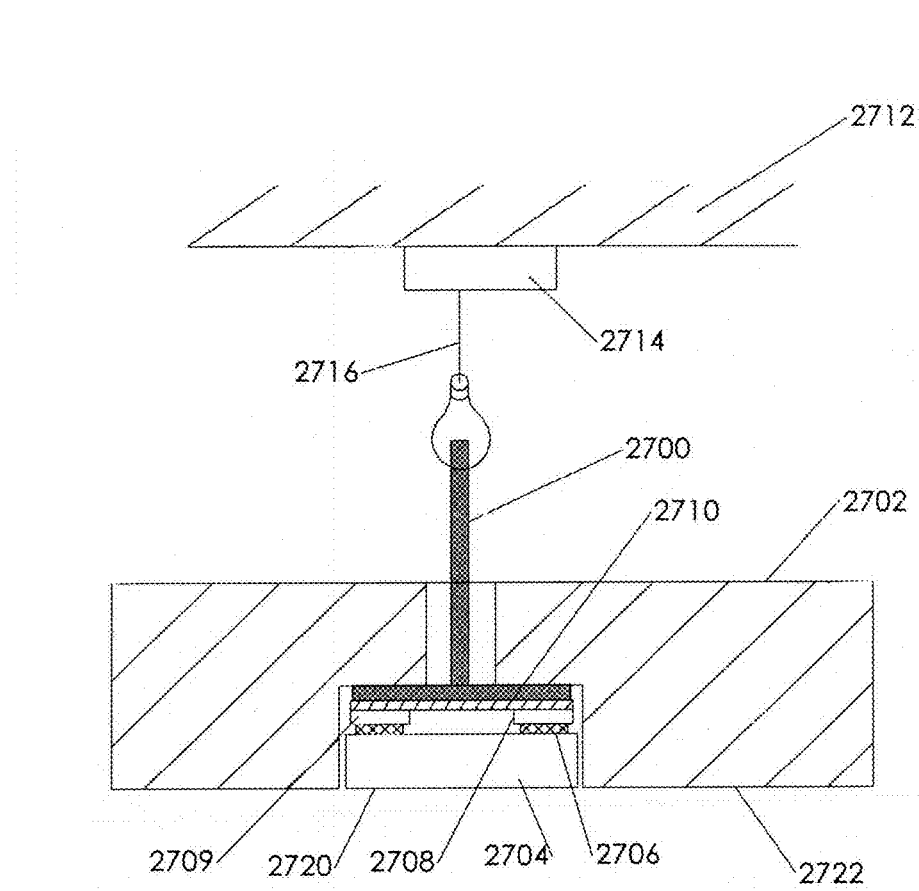
FIG. 27 depicts a side view of a self cooling non-flammable light strip attached to suspended ceiling grid.

FIG. 27 depicts a self cooling recycling solid state light source 2704 attached to a 24 volt DC powered grid 2700 via magnetic contacts 2706. The conductors 2708 and 2709 are attached to grid 2700 via dielectric 2710. External interconnects (not shown) connect conductors 2708 and 2709 to a 24 VDC power supply (not shown) as known in the art. A typical example would be Armstrong's FlexZone™ DC power grid ceiling. As the self cooling light recycling solid state light source 2704 can be adapted to run on AC or other DC voltages, this embodiment is not limited to 24 VDC power grids. The self cooling recycling solid state light source 2704 preferably has a thickness less than 5 mm such that the occupant or office space side of the ceiling tile 2702 can be essentially flush with the light emitting surface 2720 of the self cooling light recycling solid state light source 2704. This creates a monolithic look to the suspended ceiling. Even more preferable is that the lights off state body color of the light emitting surface 2720 closely match the ceiling tile 2702 finished surface 2722 body color and texture. The suspended grid 2700 attaches to the deck 2712 via anchor 2714 and wire 2716.

Figure 28A:
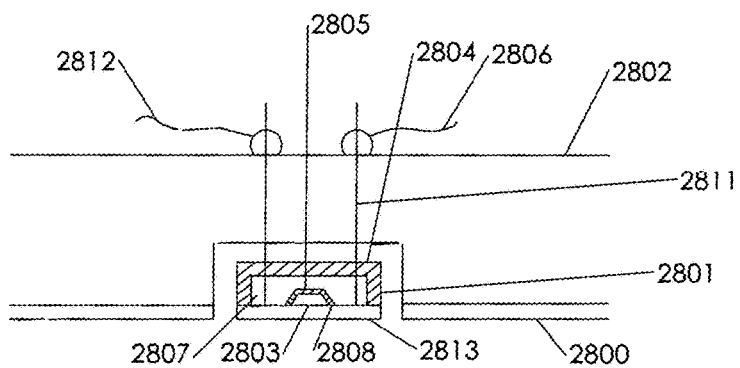
FIG. 28A depicts a side view of a self cooling non-flammable light panel integrated into ceiling tile of a suspended ceiling.

FIG. 28A depicts a self cooling solid state light source recessed into a ceiling tile 2802. In this embodiment, a direct attach LED die 2803 is attached to a light transmitting thermally conductive element 2808 and a light recycling cavity 2807 in fully enclosed space formed by the light transmitting thermally conductive element 2808 and reflector 2801. A wavelength conversion layer 2805 is applied to the direct attach LED die 2803 thereby reducing the amount of wavelength conversion material needed and minimizing the wavelength conversion layer 2805 impact on the external body color. Because the ceiling tile is typically low density and an electrically insulating dielectric which is easily penetrated, lightweight light sources can be simply pinned on or otherwise attached without the need for additional support. Push pins 2810 and 2811 act like pins in a cork board wherein they are pressed into the relatively soft ceiling tile and are able to support and secure the very light weight light sources of this invention. The self cooling solid state light source can be pushed into a recessed pocket in ceiling tile 2802 such that it is substantially flush with outer scrim layer 2800. The push pin contact not only provides an electrical connection but also attaches the self cooling solid state light source to the ceiling tile 2802. On the plenum side of the ceiling tile 2802 clip 2804 further supports the self cooling solid state light source. In a manner similar to pierced earrings being held in place the clip 2804 can be used not only to lock the source in place but also to provide electrical input via power leads 2806 an 2812. Because the majority of the heat is transferred by the light emitting surface 2813 to the office (occupant) space, the self cooling solid state light source can be cooled without breaking the contiguous nature of the ceiling. This approach enables a wide range of retrofittable light sources wherein the lightweight and low surface temperature of the surface in contact with the mounting surface enables the mounting of the source to combustible materials.

As a further example, push pin contacts 2810, 2811 may be robust enough to pierce into the surface of a piece of sheetrock or dry wall. Push pin contacts 2810, 2811 may protrude part way or all the way through the sheetrock to allow for contact to electrical connection to conductors embedded in or behind the sheetrock sheet. Flat conductors as known in the art, which are typically used for audio applications, may also be utilized. Due to the low current nature of these sources even flat conductors mounted behind decorative wallpaper can be used to provide power to the light sources disclosed in this invention. This is possible because the light sources disclosed are lightweight enough to allow for push pin mounting and they do not require additional heatsinking means. This is all made possible because substantially all the heat generated within the light source is dissipated by the light emitting surface so that the mounting surface does not require any thermal transfer for the light source to operate. In general, the light sources disclosed in this invention may be mounted to any surface via clips, magnets, or other mounting means while emitting light levels greater than 60 lumens per square inch of emitting surface independent of the size of the light source. This is possible because the cooling area and light emitting area are substantially the same. The sources may be easily secured to virtually any surface because they also emit greater than 30 lumens per gram. Lastly, the light sources disclosed are inherently distributed sources, which do not require any additional fixturing elements. Incandescent and halogen light sources require heat shields to prevent overheating of adjacent or nearby combustible materials. Fluorescent light sources require additional optical elements (reflectors, diffusers, etc.) to transform the tubular line of light output into a larger flat emitting source.

Figure 28B:
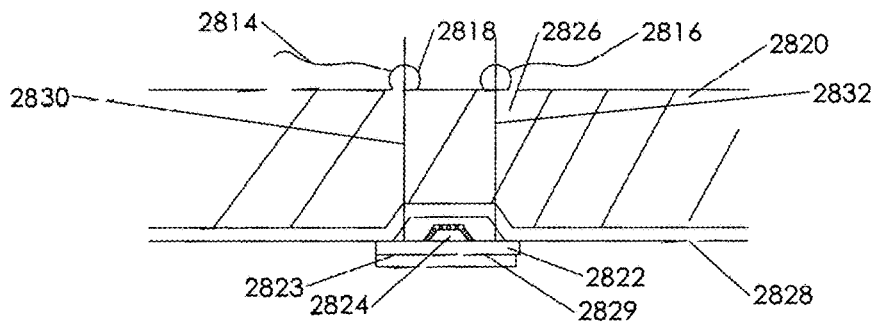
FIG. 28B depicts a side view of an embedded self cooling light source with the scrim of the ceiling tile taking the place of the reflector to form the light recycling cavity.

FIG. 28B depicts an embedded self cooling light source wherein the scrim or outside layer 2828 of the ceiling tile takes the place of the reflector to form the light recycling cavity. In this case the light transmitting thermally conductive element 2822 to which direct attach LED die 2824, wavelength conversion layer 2826, and push pin contacts 2832 are attached simply cover the cavity or depression formed in the ceiling tile 2820 and scrim layer 2828. The push pin contacts 2832 also can be connected and supported by clip 2818 with power supplied via leads 2816 and 2814. In this case the scrim layer 2828 is preferably highly reflective at least within the region that forms the light recycling cavity of the self cooling solid state light source. A wide range of additional elements such as bezels and micro louvers can also be attached to the light emitting surface 2822 used to enhance the aesthetic and optical performance of the sources. This embodiment eliminates the need for a separate cavity reflector 2801 by taking advantage of the high reflectivity of the scrim layer 2828. Alternately, a scrim layer 2829 can be a surface treatment on the thermally conductive translucent element 2822. Preferably, scrim layer 2829 would be thermally conductive and light transmitting in nature with minimal absorption to the light emission from the light source. Even more preferably, the scrim layer 2829 enhances the natural convection coefficient and/or radiative coefficient of the light emitting surface 2823 of the light transmitting thermally conductive translucent element 2822 on occupant or office side of the light source. One means making such a scrim layer 2829, is the use of flame spraying alumina powders and/or fibers applied directly to an alumina light transmitting thermally conductive translucent element (e.g. alumina) 2822. Because the light recycling cavity allows for a wide range of translucency in the light transmitting thermally conductive translucent element, materials with in-line transmission less than 20% can be used and still maintain efficiency levels greater than 70%.

Alternatively, highly reflective totally opaque materials that have arrays of holes or openings representing a substantial percentage of the surface area can be used for the light transmitting thermally conductive element 2822. As an example, a metal core board containing an array of small holes through the metal core board may be used as the light transmitting thermally conductive element 2822. As long as the surfaces that make up the recycling cavity are highly reflective to allow for long optical pathlengths, large number of light bounces, or a lot of recycling either homogenous or in-homogenous materials may be used for the light transmitting thermally conductive translucent element 2822. It should be noted that a holey metal core board preferably also has high reflectivity within the holes through the metal core board. The holes in the holey metal core board most preferably are greater than 10% of the surface area of the holey metal core board. The hole may be uniformly distributed or non-uniformly distributed. Smaller holes are preferable with a range of 1 micron to several millimeters in diameter. The higher thermal conductivity of the metal core allows for the thermally conductive translucent element 2822 to thinner using this approach. Additional dielectric, diffusive elements, or imaging elements may be used to construct composite thermally conductive translucent element 2822. As an example, highly reflective porous aluminum 100 microns thick with 20 micron diameter holes uniformly distributed across the aluminum is laminated with a 40 micron thick flexible zirconia sheet as know in the industry. A silver thick film interconnect is printed and fired on the 40 micron thick flexible zirconia prior to lamination. The resulting composite may be used as thermally conductive translucent element 2822.

Optionally an additional scrim layer 2822 may be attached to the other surface of the aluminum to provide aesthetic, acoustical, or thermal benefits. In general, the side of the holey metal core board, which in not part of the recycling cavity may be painted, printed, or otherwise decorated to create a wide range of aesthetic looks. This approach is an example of a non-homogeneous thermally conductive translucent element 2822. Also, the holey metal core board as thermally conductive translucent element 2822 can be used to allow for enhanced heat transfer to the office space side of the installation or even to allow for air flow through the light source. In the later case, the reflector also has a pathway for airflow. Most preferably this approach is used in porous metal ceiling tile applications. As an example a porous metal ceiling tile is patterned with a highly reflective dielectric layer and a highly reflective interconnect to form thermally conductive translucent element 2822. An optional scrim layer 2828 can be added for aesthetic, thermal, or acoustic reasons. LED direct attach die 2824 with a wavelength conversion layer 2826 or LED packages with wavelength conversion already included can be attached to the highly reflective interconnect on the highly reflective dielectric which is on the porous metal ceiling tile which forms the thermally conductive translucent element 2822.

Reflector 2801 may or may not contain a pathway for air flow depending on the installation and desired optical output. In this example, the light source can be the ceiling tile not attached to the ceiling tile. Further, the scrim layer 2828 may be a light transmitting thermally conductive layer such that the light source blends into the ceiling aesthetically but still allows for light emission and thermal cooling of the light sources.

Figure 28C:
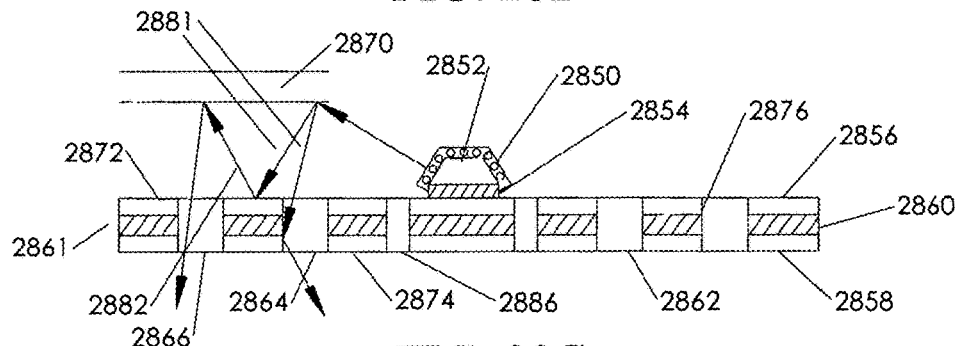
FIG. 28C depicts a side view of a holey light transmitting thermally conductive element.

FIG. 28C depicts a holey light transmitting thermally conductive element 2861 consisting of at least three layers a metal core 2860, dielectric reflector layer 2856, and interconnect 2854. An optional fourth layer 2858 may be added as described below. Metal core 2860 typically is made out of a metal including but not limited to aluminum, copper, metal alloys, and metal composites. Metal core most preferably has the thermal conductivity greater than 30 W/m-K and even more preferably greater than 100 W/m-K. Dielectric reflector layer 2856 most preferably has a reflectivity greater than 90% and even more preferably greater than 95%. The dielectric reflector 2856 may cover all or only a portion of inside surface 2872. Dielectric reflector layer 2856 electrically isolates interconnect 2854 from the metal core 2860 allowing for power to be delivered to LED die 2852. LED die 2852 may further be coated with wavelength conversion layer 2850.

In general, a light recycling cavity reflector element 2870 reflects 2881 and redirects at least a portion of the light emitted 2880 from the LED die 2852 and wavelength conversion layer 2850 onto the inside surface 2872 of the holey light transmitting thermally conductive element. Some of those light rays are reflected 2882 off of surface 2872. Those light rays which are not reflected off inside surface 2872 of dielectric reflector layer 2856, either transmit light rays 2866 through the hole 2862 or the light rays 2864 may bounce of the sidewalls of hole 2862 before exiting. Holes 2862 may be perpendicular to the inside surface 2872 or tilted such that the ratio of light rays 2864 to light rays 2866 increases. It is important that the inside sidewall 2876 of hole 2862 is highly reflective to achieve high light extraction efficiency from the light recycling cavity formed by the holey light transmitting thermally conductive element 2861 and the reflector 2870. Alternately, inside sidewall 2876 may be absorptive if it is desirable to restrict the angular output distribution of the light source. The inside sidewall 2876 may also be tapered forming reflective optical elements which again can be used to modify the output light distribution from the light source. For example, if the opening of the holes 2885 is smaller than the light output end of the holes 2886 the light rays reflected off the inside of the holes will be collimated. Because the light transmitting thermally conductive element disclosed is not homogenous, an optional outside layer 2858 may be added which can have a wide range of colors and/or finishes without negatively affecting the light recycling cavity efficiency. Most preferably outside layer 2858 is thermally conductive and exhibits a high thermal emissivity as previously described. Most preferred is an outside surface 2874 which has an emissivity greater than 0.3.

Figure 29:
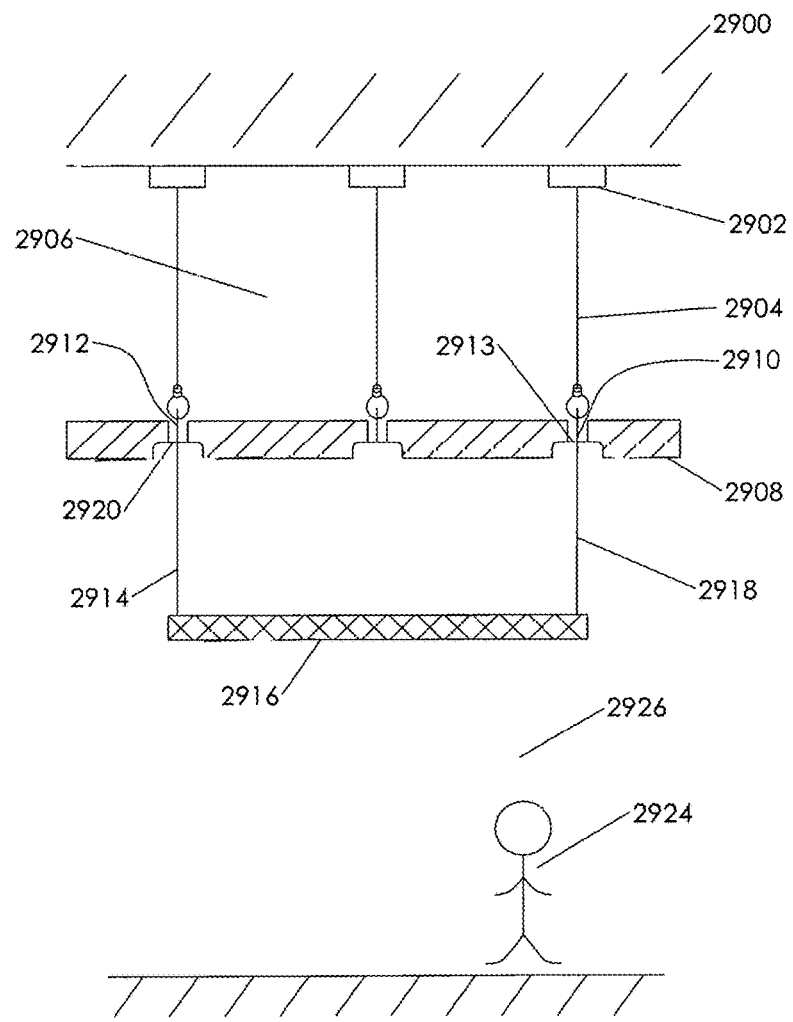
FIG. 29 depicts a side view of a suspended self cooling panel light.

FIG. 29 depicts a suspended self cooling light fixture 2916 within a suspended ceiling. Cables 2914 and 2918 attach to the grid 2920 and 2910 respectively, which contain power leads 2912 and 2913 respectively. Cables 2914 and 2918 provide both physical support and electrical input to the suspended self cooling light recycling light source fixture 2916. Alternately, the power leads 2912 and 2913 can come through the ceiling tile 2908 with cables 2914 and 2918. Because lumen per gram outputs are greater than 50 lumens per gram a 2000 lumen suspended self cooling light source fixture 2916 weighs less than 40 grams which is well within the safe structural capacity for either the grid or the ceiling tiles to support. This increases the flexibility for the lighting designer. Unlike conventional large, heavy and fixed light fixtures such as troffers, virtually no falling or seismic hazard exists with this approach to lighting. With prior art heavy light source fixtures there is a significant risk especially for firefighters/occupants 2924 during a fire where lighting fixtures can fall out of the suspended ceiling. Aesthetically the suspended ceiling supported by wires 2904, anchors 2902 to deck 2900 hides air ducts, wiring, and fire suppression means in the plenum space 2906. The firefighters/occupants 2924 view is the office space defined by suspended ceiling, floor 2922, and walls. The light source(s) 2916 of this invention use the combination of light weight and light output to enable sufficient light in a space such that the total weight of the light source divided by the square footage of the illuminated area or space is less than 1 gram per square foot while providing over 30 foot candles to the illuminated area.

Figure 30:
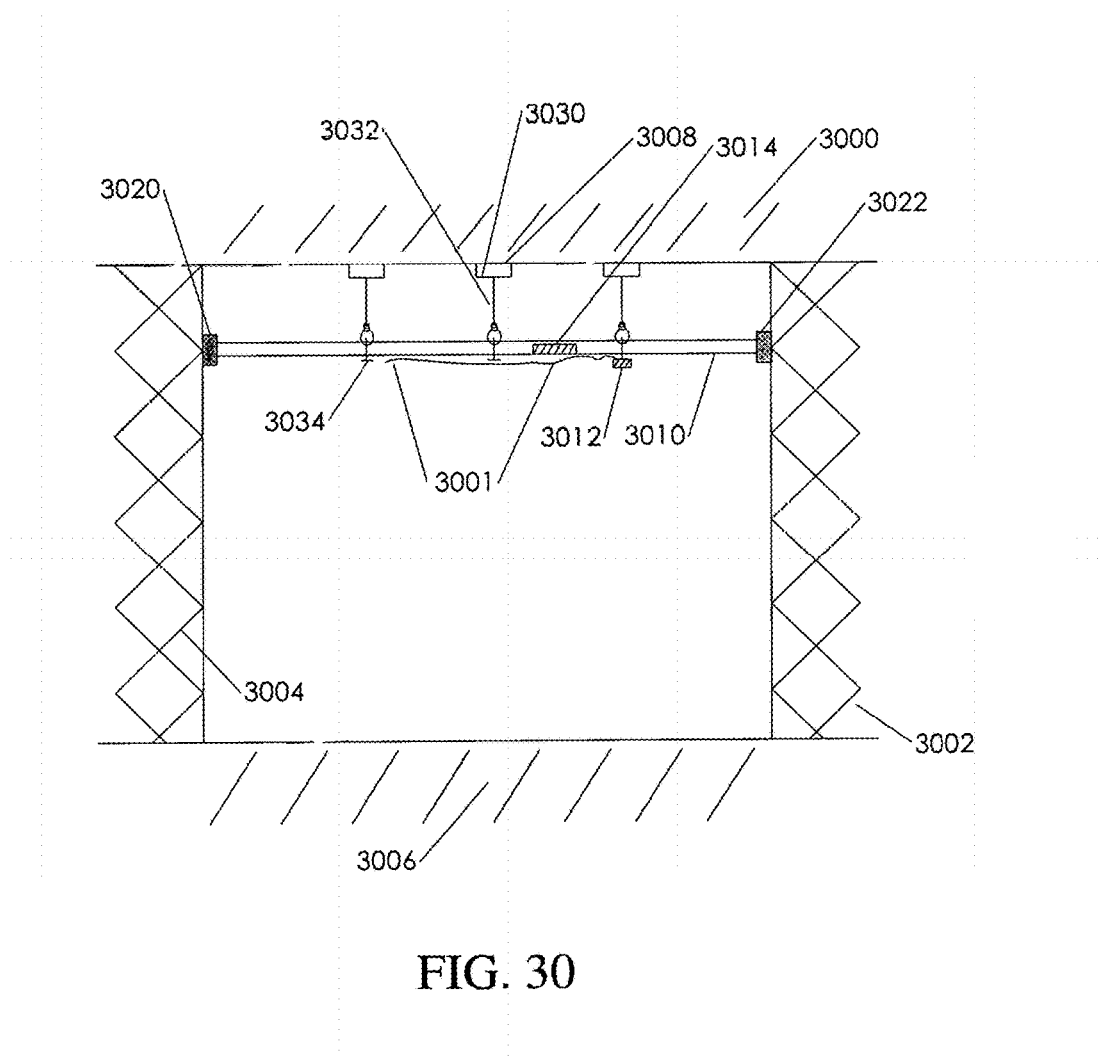
FIG. 30 depicts a side view of a seismic installation of self cooling light strip in suspended ceiling.

FIG. 30 depicts the use of self cooling solid state light recycling cavity light sources 3012 and 3014 within a seismic suspended ceiling installation. During a seismic event the deck 3000, floor 3006 and walls 3002 and 3004 move relative to each other which stress the suspended ceiling 3001 consisting of the grid 3034, the ceiling tile 3010 supported by wires 3032 anchored via anchors 3030 attached to the deck attachment 3008. The suspended ceiling 3001 may also be attached to the walls 3004 and 3002 with supports 3020 and 3022 respectively. Grid supported self cooling solid state light source 3012 is attached to grid 3034 while embedded self cooling solid state light sources 3014 is attached to or embedded within the ceiling tile 3010. In either case the self cooling solid state light sources do not interfere with the dampening and supporting function of the either the grid 3034 or the ceiling tile 3010 because they have such low thermal mass and because they do not form a break in the suspended ceiling. The flexibility of this approach permits a wide variety of suspended ceiling installations without compromising the structural integrity or the contiguous barrier of the suspended ceiling. The lighting may be easily configured or changed without compromising the safety of the occupants in the event of a seismic event.

Figure 31:
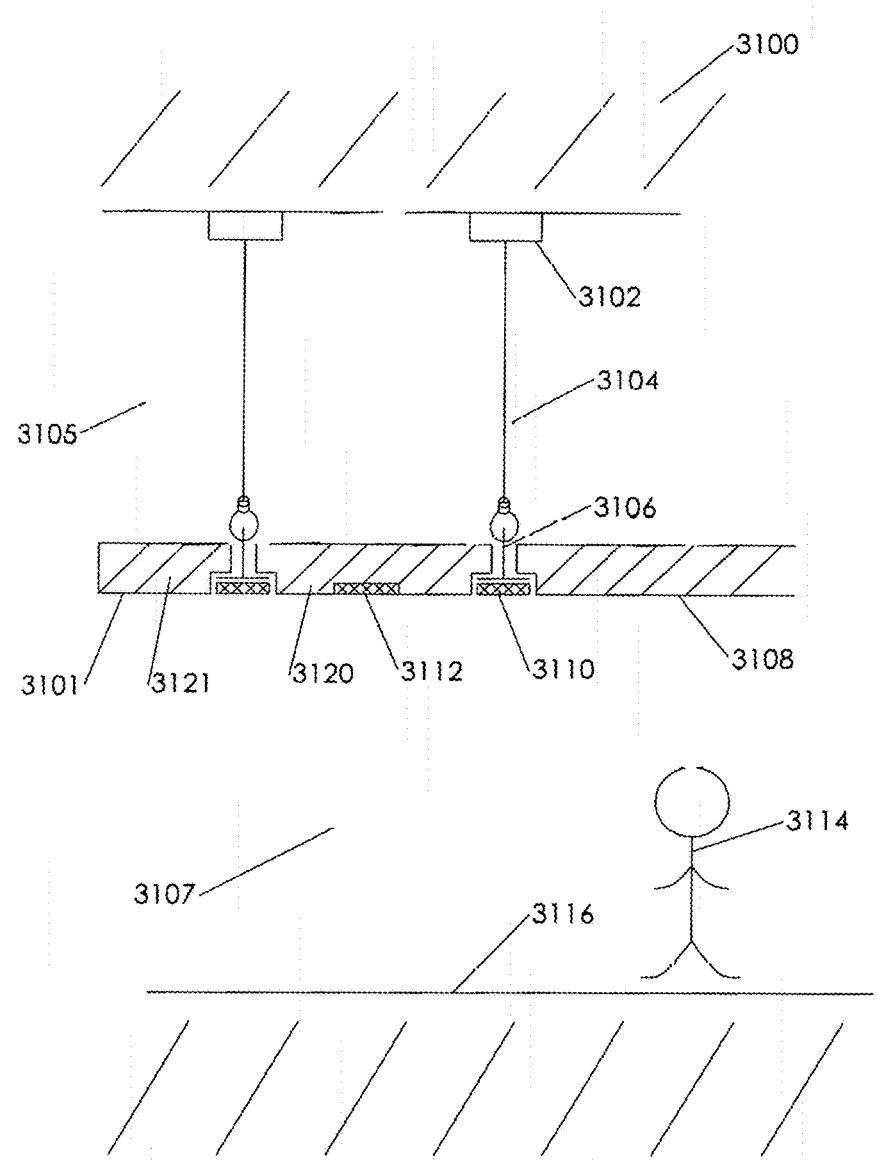
FIG. 31 depicts a side view of an acoustical installation of self cooling light panel in suspended ceiling.

FIG. 31 depicts a suspended ceiling 3101 supported by wires 3103 and 3104 anchored via anchors 3102 to the deck 3100 containing the self cooling solid state light source 3112 of this invention embedded within a ceiling tile 3020 and containing the self cooling solid state light sources 3110 of this invention on the grid 3106. Using this approach, the acoustical response of the suspended ceiling is not compromised by the lighting fixtures. In conventional installations, large breaks in the noise dampening occurs because ceiling tiles 3108 are replaced by troffers with little to no acoustical treatment (e.g. dampening) or capability. This increases the noise level for the occupants 3114 as sound waves bounce between the floor 3116 and the suspended ceiling. By virtually eliminating all breaks in the suspended ceiling 3101 the noise level within the office space can be reduced because the acoustically functional ceiling tiles (e.g. 3108, 3120 and 3121) form a contiguous barrier between the plenum space 3105 and the occupant side 3107 of the suspended ceiling 3101. Also noise transmitted from the plenum space 3105 (established by and between the suspended ceiling 3101 and the deck 3100) is reduced to the occupant or office space 3107 and the occupants 3114 with the more contiguous suspended ceiling enabled by the light sources of this invention. In general, the more contiguous the suspended ceiling the less acoustical noise and the lower the fire risk for the occupants 3114.

Figure 32A:
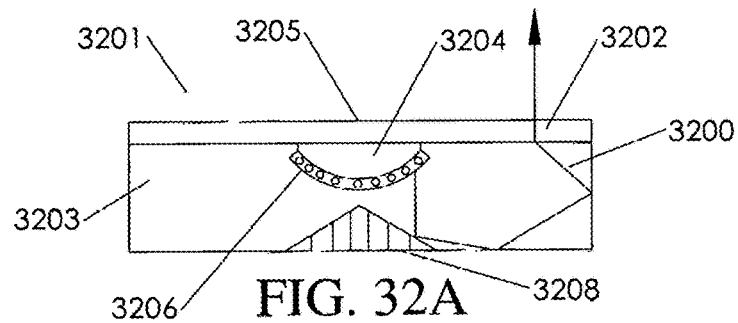
FIG. 32A depicts a side view of a light recycling self cooling light source with a light transmitting thermally conductive translucent element 3202 and a direct attach LED die 3204.

FIG. 32A depicts a light recycling self cooling light source 3201 comprising a light transmitting thermally conductive translucent element 3202 to which a direct attach LED die 3204 is attached. (It should be noted that in most of the figures of the individual light sources herein the light emitting surface of the light source is depicted or shown facing in an upward direction. Of course, in ceiling installations the light emitting surfaces would be facing downward.) The direct attach led die 3204 further is coated with a wavelength conversion layer 3206. The light recycling cavity 3203 is formed by the reflector element 3200 forming an enclosure or cavity around the light transmitting thermally conductive element 3202. As previously described, light rays generated and emitted by LED 3204 within the light recycling cavity are reflected and recycled by reflector 3200 to the light transmitting thermally conductive translucent element 3202 where they are reflected back into the cavity 3203 or transmitted through to the light emitting surface 3205 of the light transmitting thermally conductive element 3202. Multiple reflections provide high uniformity to the light emitting surface 3205. Uniformity can be further enhanced with the addition of a turning element 3208 on reflector 3200 which redirects light rays emitted normal to the emitting face of the LED 3204 down the length of the recycling cavity. In particular a conical, pyramidal, or cusp shaped turning element 3208 can be used to increase the optical pathlength of light rays within the light recycling cavity which in turn increases spatial uniformity for the light rays exiting the thermally conductive translucent element 3202. The turning element 3208 may be a separate piece, sheet, or formed directly into the reflector 3200. A metal or reflective inorganic is preferred for reflector 3200. However, because the majority of the heat is transferred to the ambient via the surface of the light transmitting thermally conductive translucent element 3202 the reflector 3200 does not need to be thermally conductive and therefore can be formed in virtually any material including multilayered reflectors like 3M's ESR films, metal coated films, diffuse reflective films such as polysilazane containing Hex-Boron-Nitride (hBN) flakes, and other inorganic and/or organic reflectors. Most preferred are reflectors with greater than 90% reflectivity. Non-flammable materials such as metals and ceramics are preferred.

Figure 32B:
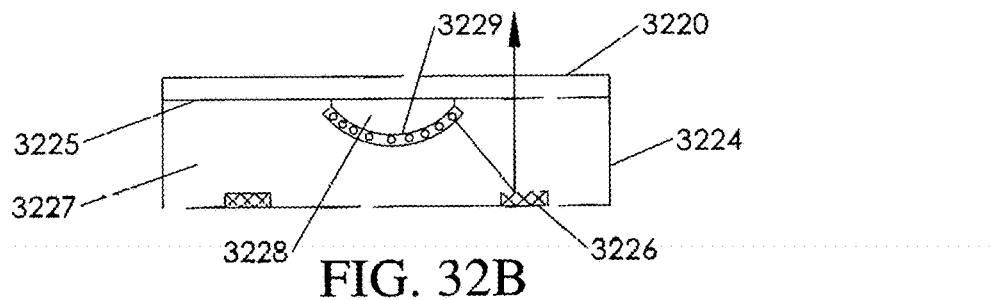
FIG. 32B depicts a side view of a light recycling cavity with a light transmitting thermally conductive element combined with a reflector 3224.

FIG. 32B depicts another embodiment of the light source of the present invention containing a light transmitting thermally conductive element 3220 combined with reflector 3224, which forms light recycling cavity 3227. Direct attach LED die 3228 emits blue light which is partially converted to longer wavelengths by wavelength conversion layer 3229. The wavelength conversion layer 3229 location is optional within the light recycling cavity 3227. Alternatively there may be no wavelength conversion layer. For example red, green and/or blue LEDs may be used singly or together within the light recycling cavity 3227. A tunable light source is easily achieved with a high degree of mixing of the various colors within the light recycling cavity. Single color self cooling light sources and multicolored self cooling light sources may also be constructed using this approach. The use of direct attach LEDs 3228 is preferred. However, because the interconnect (not shown in this view but previously described), which is typically on the inside surface 3225 of the light transmitting thermally conductive element 3220, will accommodate direct attach, flip chip, wirebond or other connection methods a variety of LED die and LED packages can be used. In this embodiment scattering elements 3226 are used to adjust the spatial uniformity of the light rays exiting the thermally conductive translucent element 3220.

Figure 32C:
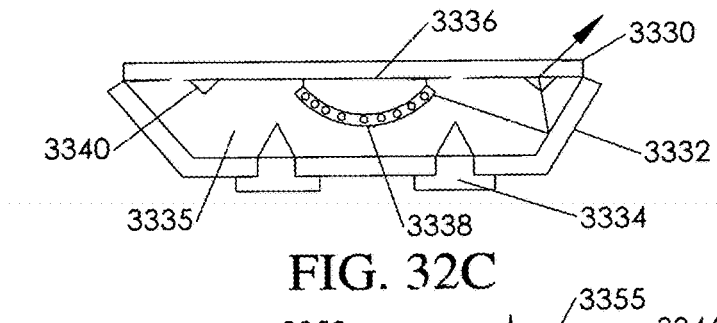
FIG. 32C depicts a side view of a light recycling cavity with a light redirecting reflector.

FIG. 32C depicts a light recycling cavity in which the reflector 3332 is formed to redirect light out through the light transmitting thermally conductive element 3330. The direct attach LED die 3336 and wavelength conversion layer 3338 emit light into the light recycling cavity 3335 formed by reflector 3332 and light transmitting thermally conductive element 3330. Additional scattering or turning elements 3334 and 3340 can be used to spatially redirect light within the recycling cavity out through the light transmitting thermally conductive element 3330. The turning element 3334 also depicts the ability to tune the uniformity after assembly of the recycling cavity by inserting turning elements 3334 through holes in the reflector 3332. The turning elements can be adjusted to present different reflective faces to the light emanating from the LED 3336 to alter the light distribution in the recycling cavity 3335. Alternately, opaque or translucent reflective elements can be spatially printed on the light transmitting thermally conductive element 3330 and used with or without turning element 3340 to control the number of reflections before the light rays escape the recycling cavity 3335. As an example, highly reflective small dots may be printed at the same time the silver thick film interconnect is printed on the light transmitting thermally conductive element 3330. These dots can be patterned with varying spatial density to alter the distribution of light emanating from the light recycling cavity.

Figure 32D:
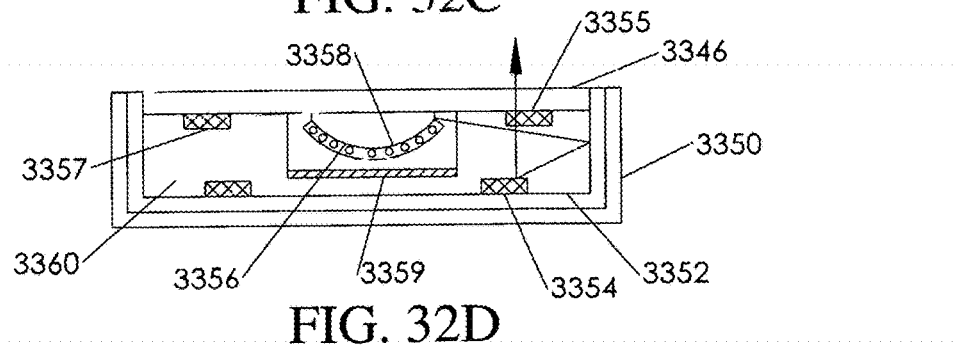
FIG. 32D depicts a side view of a light recycling self cooling light source with an additional waveguiding element that more or less fills the light recycling cavity.

FIG. 32D depicts a light recycling self cooling light source with an additional waveguiding element 3352 that more or less fills the light recycling cavity. In this embodiment the direct attach LED die 3356 and wavelength conversion element 3358 transfer their heat to the thermally conductive translucent element 3346. However light emanating from the LED and wavelength conversion element 3359 is coupled to the waveguide 3352. Light extraction from the waveguide 3352 occurs due to light extraction elements 3354, 3355 and 3357. Extraction element(s) 3357 may be as simple as an index matching dot between waveguide 3352 and light transmitting thermally conductive element 3346. The reflector 3350 is still used to enhance the recycling within the light source and it may be separate from or be formed on the waveguide 3352 as a high reflectivity coated film.

Figure 33:
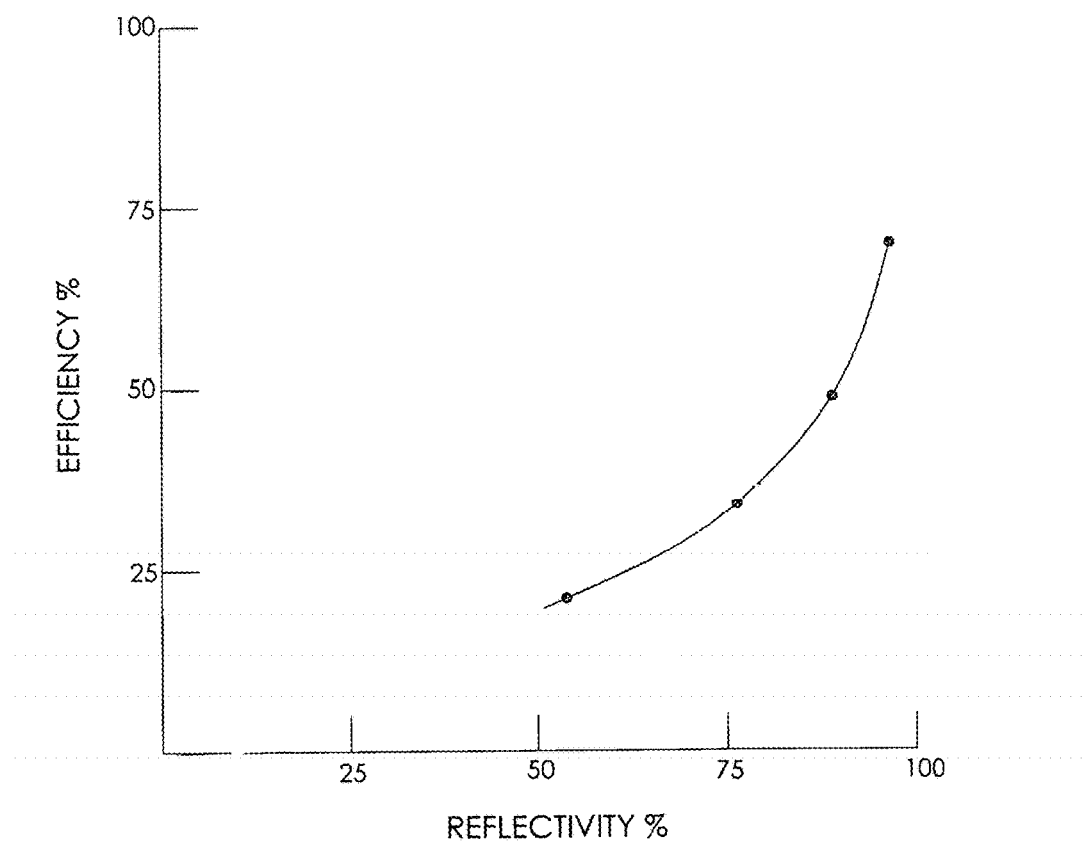
FIG. 33 depicts a graph showing efficiency versus reflectivity in recycling self cooling light sources.

FIG. 33 depicts a graph illustrating the importance of reflectivity on the efficiency of light recycling cavities. Due to the large number of reflections that must occur to convert a point source like an LED die to a uniform and diffuse output, any losses in the light recycling cavity caused by the LED die, interconnect, reflector, and/or within the thermally conductive translucent element need to be minimized. It is preferable that all of these components have high reflectivity (e.g. >80%). However, the LEDs are not as critical as they represent a very small portion of the inside surface of the recycling light cavity. The reflector 3200 as shown in FIG. 32A will typically represent over 60% of the inside surface area of the light recycling cavity 3203. Therefore, it is preferred that the reflector 3200 has very high reflectivity (e.g. greater than 95%) The light transmitting thermally conductive elements disclosed herein are most preferably optically low absorption loss materials such as alumina, sapphire, YAG, glass, YSZ, GGG, and other optically low absorption materials. It should be noted that in line transmission number typically used are not a good indicator of optical losses. Because recycling cavity sources such as these allow for multiple bounces, highly scatter materials such as alumina which appear white or opaque can actually be very efficient windows. The critical issue is not in-line transmission but optical absorption losses. Alumina Al2O3 has very low optical absorption throughout the visible spectrum however if improper sintering aids are used absorption losses can be increased. Therefore, high purity materials are preferred which may or may not be amorphous, polycrystalline or single crystal in nature. The same is true for organic materials, Teflon films with high porosity have some of the highest diffuse reflectivity numbers that can be generated approaching 100%. This effect is due to the low optical absorption throughout the visible region for these materials. Composites can likewise be low absorption as is the case with polysilazane and hBN composites, which have been previously disclosed, in the referenced filings by the authors. In general, material with absorption losses less than 0.1 $cm^{-1}$ in their transparent state throughout the visible region are preferred for the thermally conductive translucent element.

The use of organic materials to further enhance the reflectivity inside the recycling light cavity or to add aesthetic features to the outside of the light source is also disclosed. Examples of low optical absorption materials include spin-on glasses, polymers, monomers, oligomers, waxes, and oils. Other optically useful materials include composites and mixtures including inorganic/organic suspensions, polymers containing organometallics, and sol-gels. These low optical absorption materials can be formed, cured, crosslinked, or otherwise densified using heat, actinic radiation, pressure, shear, electron beam, mechanical or chemical means to form a layer or freestanding element.

Preferred optical materials include the following: Typical spin-on glass materials include methylsiloxane, methylsilsesquioxane, phenylsiloxane, phenylsilsesquioxane, methylphenylsiloxane, methylphenylsilsesquioxane, and silicate polymers. Spin-on glass materials also include hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about 8. Also included are copolymers of hydrogensilsesquioxane and alkoxyhydridosiloxane or hydroxyhydridosiloxane. Spin-on glass materials additionally include organohydridosiloxane polymers of the general formula $(H_{0-1.0}SiO_{1.5-2.0})_n (R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl.

Typical polymer optical materials include halogenated polyalkylenes, preferred fluorinated an/or chlorinated polyalkylens, more preferred chlorofluoropolyalkylens, and most preferred are the fluorinated polyalkylenes among which are included: polytetrafluoroethane (ethylene), polytrifluoroethylene, polyvinylidene fluoride, polyvinylfluoride, copolymers of fluorinated ethylene or fluorinated vinyl groups with non-fluorinated ethylenesor vinyl groups, and copolymers of fluorinated ethylenes and vinyls with straight or substituted cyclic fluoroethers containing one or more oxygens in the ring. Also included in the most preferred polymers are poly(fluorinated ethers) in which each linear monomer may contain from one to four carbon atoms between the ether oxygens and these carbons may be perfluorinated, monofluorinated, or not fluorinated.

Also included in the most preferred polymer optical materials are copolymers of wholly fluorinated alkylenes with fluorinated ethers, partly fluorinated alkylenes with wholly fluorinated ethers, wholly fluorinated alkylenes with partly fluorinated ethers, partly fluorinated alkylenes with partly fluorinated ethers, non-fluorinated alkylenes with wholly or partly fluorinated ethers, and non-fluorinated ethers with partly or wholly fluorinated alkylenes.

Also included among the most preferred polymer optical materials are copolymers of alkylenes and ethers in which one kind of the monomers is wholly or partly substituted with chlorine and the other monomer is substituted with fluorine atoms. In all the above, the chain terminal groups may be similar to those in the chain itself, or different.

Also among the most preferred polymer optical materials are substituted polyacrylates, polymethacrylates, polyitaconates, polymaleates, and polyfumarates, and their copolymers, in which their substituted side chains are linear with 2 to 24 carbon atoms, and their carbon atoms are fully fluorinated except for the first one or two carbons near the carboxyl oxygen atom such as Fluoroacrylate, Fluoromethacrylate and Fluoroitaconate.

Among the more preferred polymer optical materials, one includes fluoro-substituted polystyrenes, in which the ring may be substituted by one or more fluorine atoms, or alternatively, the polystyrene backbone is substituted by up to 3 fluorine atoms per monomer. The ring substitution may be on ring carbons No. 4, 3, 2, 5, or 6, preferably on carbons No. 4 or 3. There may be up to 5 fluorine atoms substituting each ring.

Among the more preferred polymer optical materials, one includes aromatic polycarbonates, poly(ester-carbonates), polyamids and poly(esteramides), and their copolymers in which the aromatic groups are substituted directly by up to four fluorine atoms per ring one by one on more mono or trifluoromethyl groups.

Among the more preferred polymer optical materials, are fluoro-substituted poly(amic acids) and their corresponding polyimides, which are obtained by dehydration and ring closure of the precursor poly(amic acids). The fluorine substitution is effected directly on the aromatic ring. Fluoro-substituted copolymers containing fluoro-substituted imide residues together with amide and/or ester residues are included.

Also among the more preferred polymer optical materials are parylenes, fluorinated and non-fluorinated poly(arylene ethers), for example the poly(arylene ether) available under the tradename FLARE™ from AlliedSignal Inc., and the polymeric material obtained from phenyl-ethynylated aromatic monomers and oligomers provided by Dow Chemical Company under the tradename SiLK™, among other materials.

In all the above, the copolymers may be random or block or mixtures thereof.

In general, low optical absorption plastics are preferred (fluorinated polymers, polysiloxanes, polysilazanes, halogenated polymers, non-halogenated polymers, polycarbonates, acrylics, silicones, and inorganic/organic composites comprising low optical absorption organics). An example of a low absorption strongly scattering polymeric film is WhiteOptic™. While this film exhibits low absorption losses and white body color it also has very low thermal conductivity. While this material can be used for parts of the recycling cavity, which are not used to cool the LED, materials with thermal conductivity higher than 1 W/mK are preferred for the light transmitting thermally conductive elements disclosed in this invention. In general, all unfilled organic materials exhibit low thermal conductivity (less than 1 W/mK and typically less than 0.1 W/mK) cannot be used effectively to spread the heat generated in the LEDs within the light recycling cavity. While one could in theory operate the LEDs at such a low level and use hundreds of LEDS within the recycling cavity and use a lower thermal conductivity material for the light transmitting thermally conductive element the cost would be excessive. In almost all solid state light sources the LEDs typically represent 50% to 80% of the overall cost.

The light source of this invention enables the minimum number of LEDs while eliminating the need for costly appended heatsinks. Based on experimental results greater than 5 W/mK is preferred and greater than 20 W/mK is most preferred. In addition, most unfilled polymer systems, which exhibit low optical absorption have low use temperatures typically below 150° C. and even below 100° C. Therefore, strongly scattering organic materials which can withstand greater than 200° C. are preferred and even more preferred are organic materials which can withstand greater than 300° C. High quality low resistance interconnects compatible with wirebonding and/or direct die attach fire at temperatures over 400° C. Also direct die attach LEDs typically solder at greater than 300° C. While lower temperature interconnects and conductive adhesive may be used there are significant tradeoff is performance both electrically and optically. Finally, most unfilled organic materials also are flammable. As such inorganic materials like alumina or porous metal foils are preferred. However organic/inorganic composites are possible.

As an example of thermally conductive inorganic/organic composite with a thermal conductivity over 5 W/mK capable of withstand greater than 300° C., is boron nitride filled polysilazane may be used to form either a thermally conductive layer on the porous flexible metal foils or inorganic light transmitting thermally conductive elements or be used as a freestanding element forming at least one face of the recycling light cavity. Other polymeric binders are also possible however the high temperature performance, optical transparency and compatibility of the polysilazanes with boron nitride make this inorganic/organic composite a preferred materials choice. Filled thermoplastic composites are especially preferred.

Figure 34:
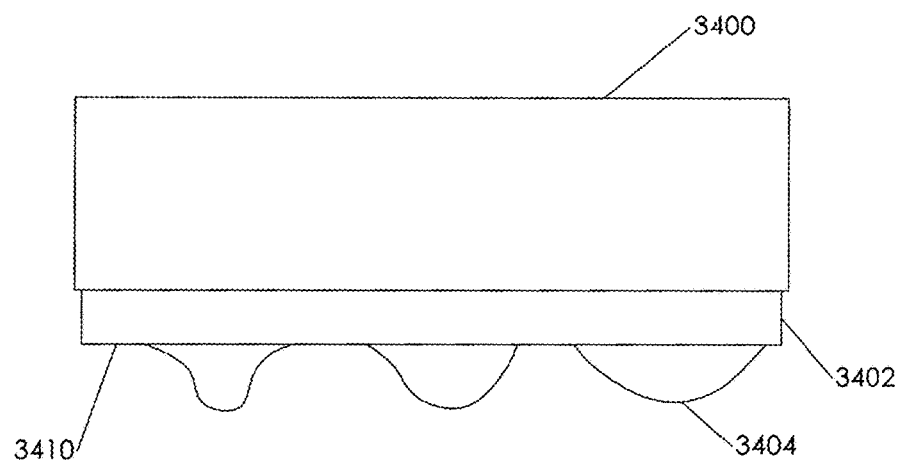
FIG. 34 depicts a side view of decorative overlays on self cooling light sources.

FIG. 34 depicts decorative overlay 3404 printed or otherwise formed on light transmitting thermally conductive element 3402. In this manner the visible light emitting surface 3410 of the light transmitting thermally conductive element 3402 can be modified aesthetically. The light recycling cavity self cooling light source is again formed using a reflector 3400 and a light transmitting thermally conductive element 3402. Decorative overlay 3404 may include paints, lacquers, fused glass, or other coatings that impart patterns, textures and other aesthetic elements. Because inorganic materials such as alumina is preferred for light transmitting thermally conductive element 3402 high temperature processing steps such as glazing are possible. These high temperature steps tend to also use materials like glass and other inorganics, which still have reasonable thermal conductivity. Texture may be imparted via a coating on or direct embossing of the light transmitting thermally conductive element 3402. The decorative element 3404 most preferably is thermally conductive such that when the thermally conductive decorative element 3404 is in thermal contact with the light transmitting thermally conductive element 3402 the majority of the heat is emitted from the exterior surface of the thermally conductive decorative element 3404. Like a lamp shade the decorative element 3404 may or may not be transmissive to all wavelengths emitted by the light source. Colored glasses in a variety of patterns fused to the light transmitting thermally conductive element 3402 is a preferred embodiment of decorative element 3404.

Figure 35A:
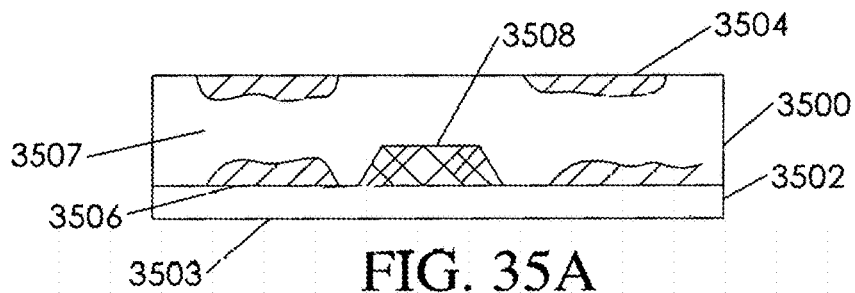
FIG. 35A depicts a side view of a light recycling self cooling light source with a reflector, a thermally conductive translucent element and a LED die.

FIG. 35A depicts a light recycling self cooling light source with reflector 3500 and thermally conductive translucent element 3502 to which an LED die 3508 is attached. Wavelength conversion elements 3504 and 3506 maybe placed not in direct contact with LED 3508 as shown. Light emitted by the LED 3508 is reflected and recycled in light recycling cavity 3507 formed by reflector 3500 and light transmitting thermally conductive element 3502. A portion of the light is converted to longer wavelengths by the wavelength conversion elements 3504 and 3506 before being transmitted to and emitted by the emitting surface 3503 of the light transmitting thermally conductive element 3502. In this configuration a UV LED die 3508 is preferred so that the phosphors used in wavelength conversion elements 3504 and 3506 can have natural white body color. Alternately, the external body color of the light source can be modified by selecting phosphors, quantum dots, and other wavelength conversion materials with a particular body color. Body color is an important aesthetic attribute of light sources when the desire is to create a monolithic uniform look in installations like suspended ceilings.

Figure 35B:
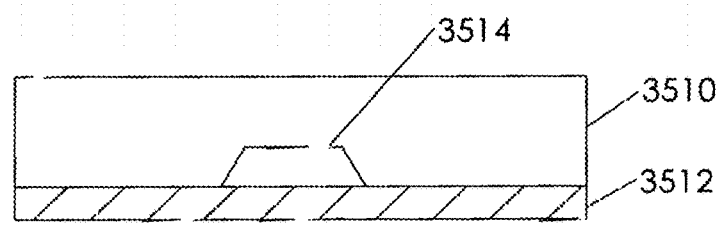
FIG. 35B depicts a side view of a light recycling self cooling light source with a light transmitting thermally conductive luminescent element.

FIG. 35B depicts a light recycling self cooling light source where the light transmitting thermally conductive element 3512 is also luminescent. As mentioned previously a wide range of materials can be used to form solid wavelength conversion elements in ceramic, coated, and single crystal form. The LED die 3514 attaches and is in thermal contact to the light transmitting thermally conductive element 3512 and the light recycling occurs due the reflector 3510.

Figure 35C:
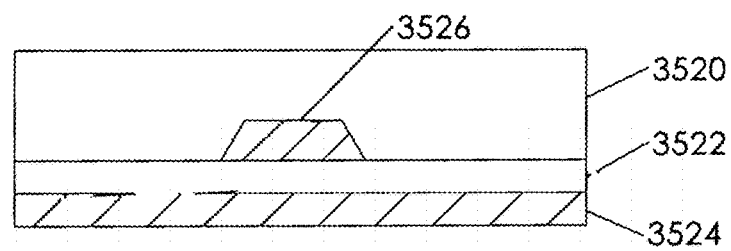
FIG. 35C depicts a side view of a separate wavelength conversion coating/element formed on a thermally conductive translucent element.

FIG. 35C depicts a separate wavelength conversion coating/element 3524 formed on or attached to thermally conductive translucent element 3522. The relative position of these two elements to the LED die 3526 may be switched or used as shown. Reflector 3520 and light transmitting thermally conductive element 3522 form the recycling cavity.

Figure 35D:
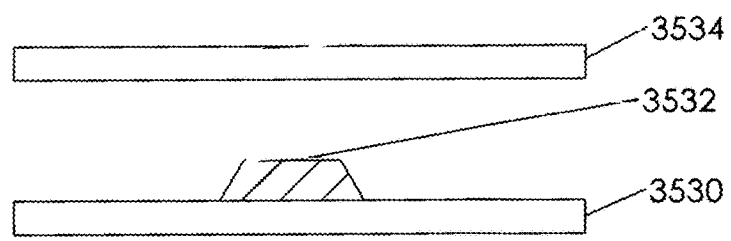
FIG. 35D depicts a side view of a self cooling light source without a light recycling cavity.

FIG. 35D depicts a self cooling light source without a light recycling cavity. In this embodiment the emission from the LED die 3532 which is attached to, interconnected (not shown) and cooled by thermally conductive translucent element 3530 only partially illuminates wavelength conversion layer 3534. A wide range of optical effects can be formed using this approach, which illustrates the flexibility of eliminating the heatsink by integrating the cooling and emission surfaces into one element.

Figure 36:
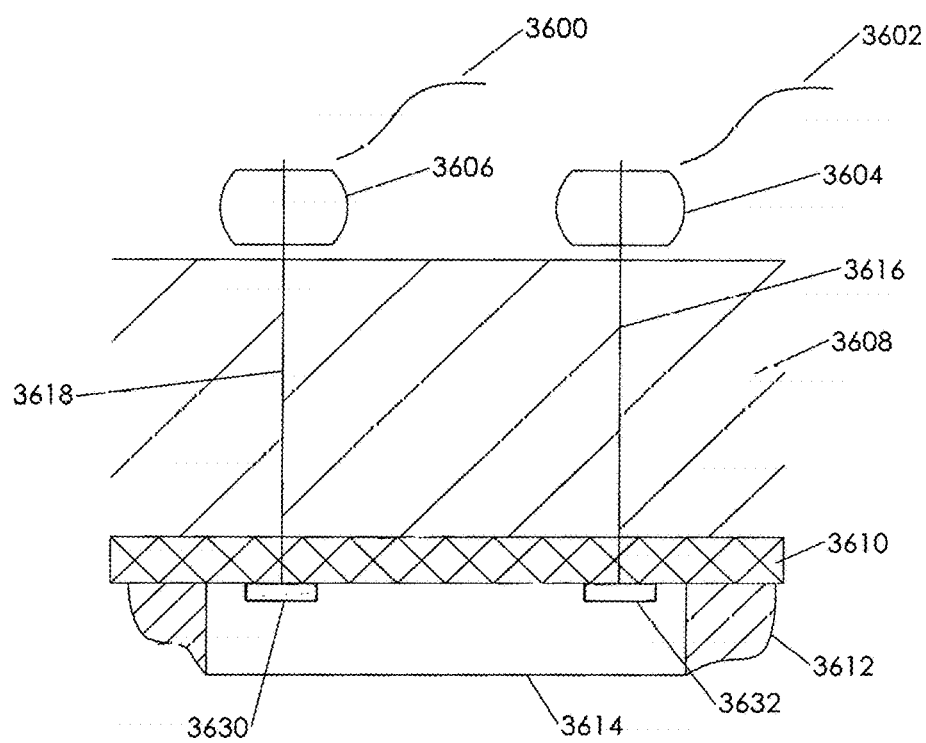
FIG. 36 depicts a side view of a push pin connector and self cooling light source.

FIG. 36 depicts a push pin connector for ceiling tiles 3608. Self cooling solid state light source 3614 contains two substantially rigid pins 3618 and 3616. Because the ceiling tile 3608 is a dielectric and tends to be easily pierced the rigid pins 3618 and 3616 can be simply pressed through the scrim layer 3610 and ceiling tile 3608. Additional mounting support can be via clips 3604 and 3606 which can additionally act as electrical connector to power leads 3602 and 3600. The ultra light weight of these light sources resulting in high lumens per gram of these self cooling solid state light source 3614 allows for this type of installation. Aesthetic elements 3612 can be added as well. The use of non-flammable materials is preferred for aesthetic elements 3612. Alternately, the scrim layer 3610 can be formed to create recesses for the self cooling solid state light source 3614. Optionally magnetic connectors 3632 and 3630 may be used to allow for front side removal without removing the ceiling tile 3608. Optionally magnetic push pins with their visible mating contacts coated to blend with the ceiling tile may be used. In this way Self cooling light sources with greater than 30 lumens per gram are preferred and embodiments of this invention.

Figure 37:
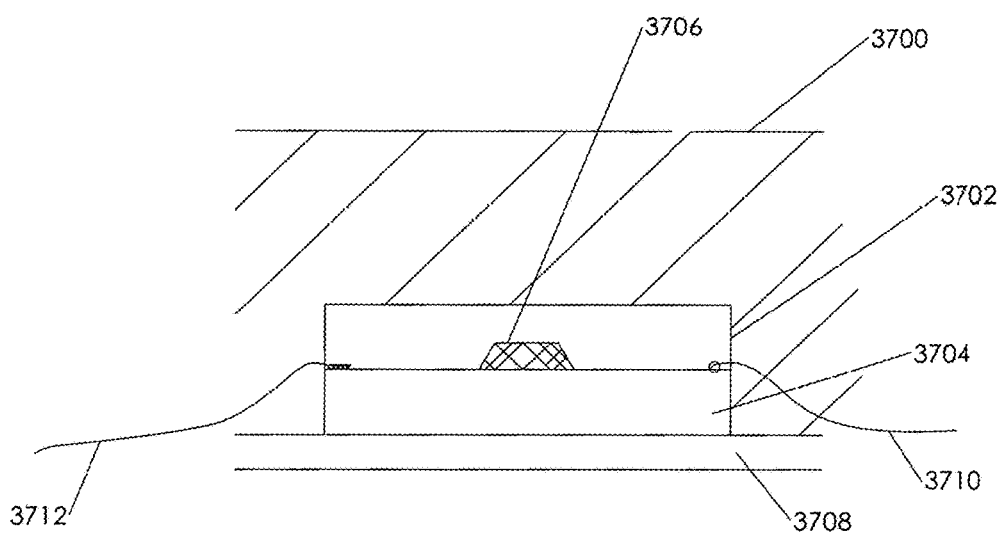
FIG. 37 depicts a side view of a scrim overlay for self cooling light source.

FIG. 37 depicts a self cooling solid state light source embedded within a ceiling tile 3700 underneath the scrim layer 3708. In this configuration a translucent scrim with a reasonable porosity or thermal conductivity is preferred such that heat from the thermally conductive translucent element can be extracted to the ambient of the office space. The heat from the LED die 3706 and reflector 3702 are again used to create a light recycling cavity as previously disclosed. In this configuration the electrical interconnects 3710 and 3712 can be embedded under the scrim layer 3708 as well. This creates an illuminated ceiling tile that replaces conventional light fixture.

Figure 38:
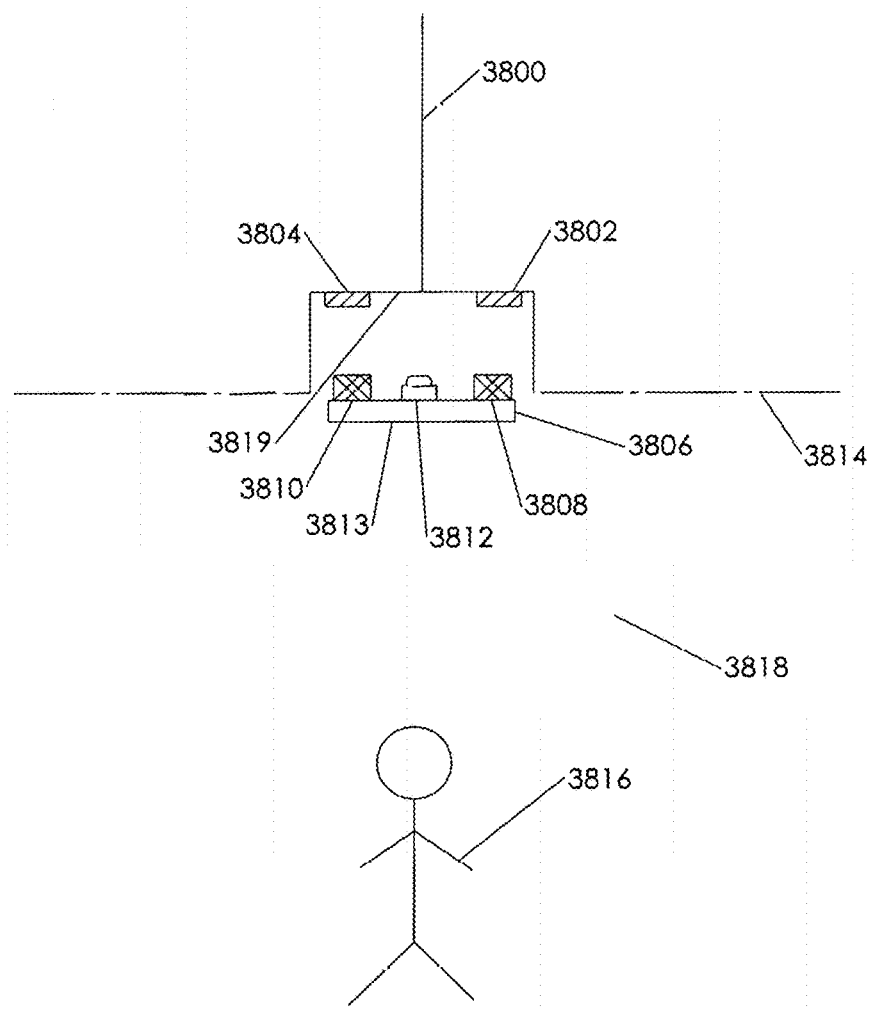
FIG. 38 depicts a side view of a modular rail based field replaceable linear sources.

FIG. 38 depicts a modular rail self cooling light source, which is field replaceable. In order to be field replaceable several criteria must be met, including but not limited to easy installation, keyed installation or electrically/mechanically protected installation, low voltage operation, distributed power, light weight, and decorative elements to cover unused areas. Armstrong FlexDC™ suspended ceiling grid offers one example of a distributed power system. However, prior to this invention the lack of field replaceable light sources due to weight and thermal considerations restricted taking advantage of the full capability of these new distributed power grids. In this embodiment a light recycling cavity light source is integrated into a modular grid system 3800. In this case the reflector 3814 in previous examples is integrated into the grid along with DC input strips 3804 and 3802 to form a light recycling cavity modular grid system 3800 such that only the light transmitting thermally conductive element 3806 with attached LEDs and/or LED packages 3812, an interconnect (not shown), and an attachment/contact means 3810 and 3806 are required by the end user to create self cooling linear light sources. This is enabled by the basic nature of this design wherein substantially most of the heat from the light source is transferred to the occupant 3816 side or office space 3818 from the light emitting surface 3813 of the light transmitting thermally conductive element 3806. The office space 3818 is that area below the ceiling 3814 in which the occupants 3816 work. In this configuration, the light recycling cavity is formed once the translucent thermally conductive element 3806 with its associated LEDs and/or LED packages 3812 and contacts 3808 and 3810 are mounted into the reflective receptacle 3819 of the modular grid system 3800. While magnetic contacts are preferred for contacts 3810 and 3808, other methods are may be used including but not limited to conductive Velcro™, snaps, push pins, clips, and other mechanical/adhesive means. The lightweight and long life nature of this approach eliminates the need for expensive locking means to support the field replaceable light source.

The use of standard steel grid, which allows for magnetic contacts 3808 and 3810 to make contact to DC strips 3804 and 3802 is preferred. This approach minimizes the weight of the light source itself, which in turn reduces the cost of shipping and storage. A distributed power grid with an integrated reflector 3819 is an embodiment of this invention. The ceiling 3814 may be a suspended ceiling, cloud, or other aesthetic/acoustical element. While ceilings are shown, similar installations in walls and floors may also be utilized for this invention. Walls, sheetrock, brick, mortar, wood and other elements may be used in a similar manner as a receptacle for the self cooling light source. The ability to transfer the heat into the office space using substantially only the light emitting surface enables the use of temperature sensitive materials including but not limited to wallpaper and paint on any mounting surface as well. In general, the light sources disclosed herein may be installed on a wall, floor, ceiling or suspended ceiling of a room such that substantially all the heat generated by the light source is dissipated into the room. The room being defined as the illuminated area or space in to which the light emitted by the light sources is emitted.

Figure 39:
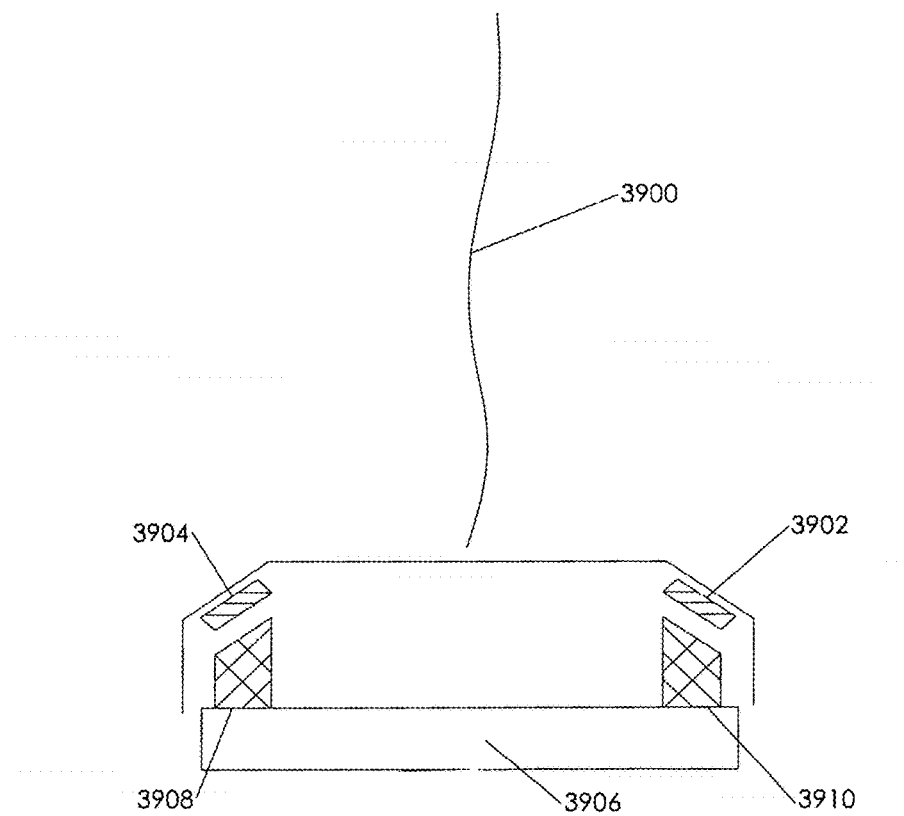
FIG. 39 depicts a side view of a magnetic connector for modular rail or grid system.

FIG. 39 depicts a magnetic connector with self centering for modular rail or grid system. In this case the recycling cavity modular grid system 3900 has a recycling cavity shaped to self center the linear light source 3906. By beveling the sides of the recycling cavity and using angled magnetic contacts 3908 and 3910, electrical contact to DC strips 3904 and 3902 and mechanically self centering the linear light source 3906 can occur at the same time. Other mechanical, magnetic and adhesive means and elements, which support and center the linear light source 3906 in the recycling modular grid system 3900 can also be used.

Figure 40:
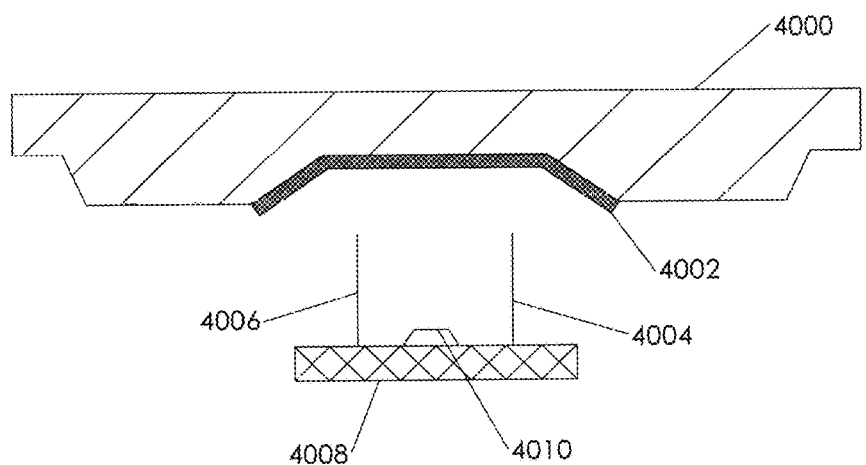
FIG. 40 depicts a side view of a ceiling tile with recycling cavity.

FIG. 40 depicts ceiling tile 4000 with in-situ recycling cavity 4002. In this configuration the self cooling light panel consisting of a light transmitting thermally conductive 4008 containing LED packages 4010 with contact pins 4004 and 4006 can be easily attached to the ceiling tile 4000 by the end user. The contact pins 4004 and 4006 can make electrical contact to embedded interconnects, slip-on contacts, or other contact means as previously described. This approach allows for reconfiguration of the lighting within a suspended ceiling. In general it is preferred that in-situ light recycling cavity 4002 has the highest reflectivity possible but a reflectivity greater than 90% is preferred, with greater than 95% most preferred. White paint, polymeric coatings, metal foils, and combinations of both may be used for in-situ recycling cavity 4002.

Figure 41:
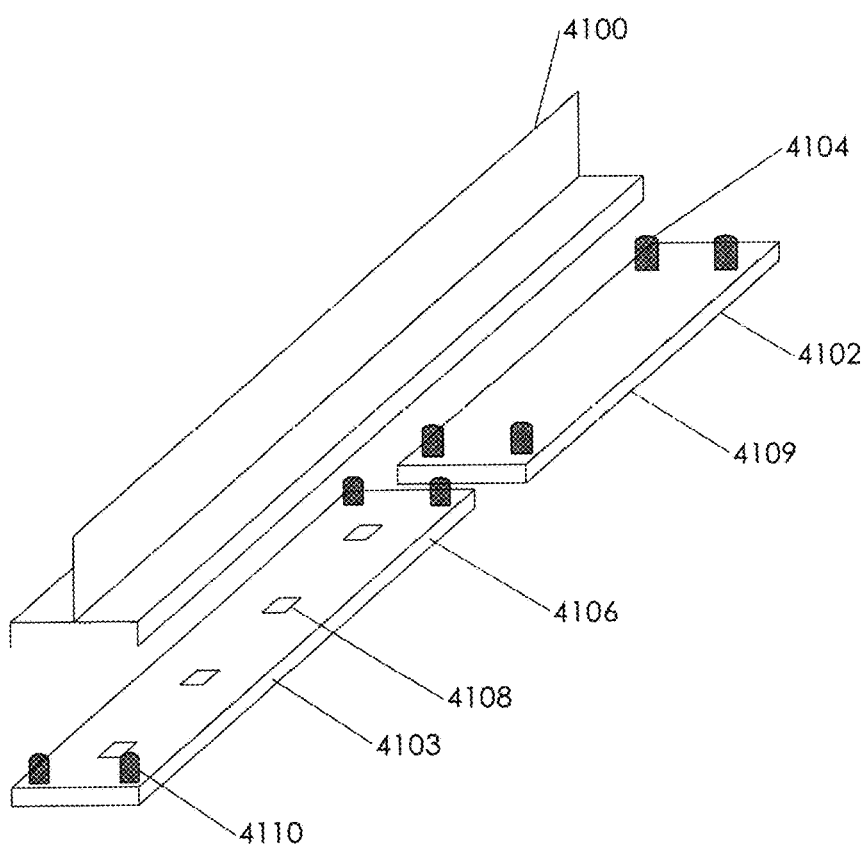
FIG. 41 depicts a perspective view of a ceiling tile modular system with integrated recycling cavity.

FIG. 41 depicts suspended ceiling modular system with in-situ light recycling cavity grid 4100 and light emitting units 4106 and dummy units 4102. Light emitting units 4106 contain LEDs and/or LED packages 4108 and contacts 4110 on the light transmitting thermally conductive element 4103. An interconnect and any additional active elements as previously disclosed (not shown) are also included. Dummy unit(s) 4102 will typically only consist of light transmitting thermally conductive element(s) 4109 and contacts 4104. These dummy units serve as spacers and/or decorative elements. However additional components providing additional functions including but not limited to power conditioning, electrical filtering, sensors, detectors, emitters, antennas, and other active and passive may also be incorporated into these dummy light sources.

Figure 42:
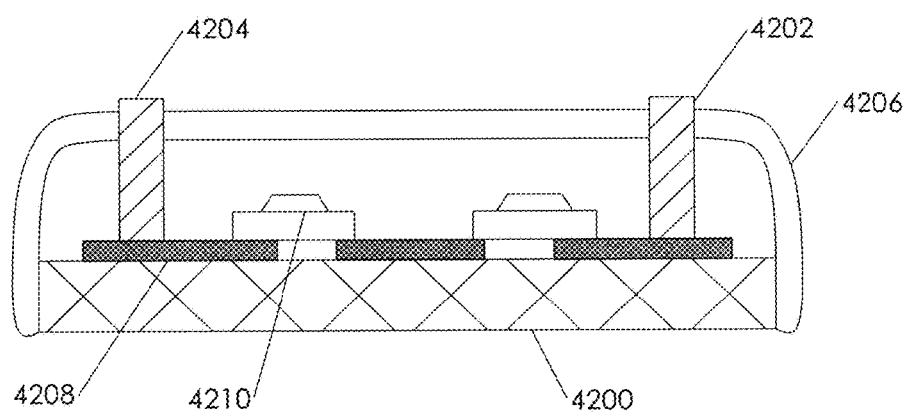
FIG. 42 depicts a side view of a suspended ceiling grid for field replaceable self cooling light sources.

FIG. 42 depicts a self cooling solid state light source with reflector/thermal barrier 4206. By making the reflector 4206 out of a low thermal conductivity material such as a polymer, porous ceramic, or glass material with a thermal conductivity less than 1 W/mK the self cooling light sources can be attached to surfaces which are thermally sensitive. The thermal isolation may be created using porosity, low thermal conductivity materials, heat shields and other thermal barrier means. In the case of polymers the reflector 4206 can be formed via blow molding, injection molding, thermal forming, and other fabrication techniques known in the art. As previously stated high reflectivity is preferred. Most preferably the reflectivity of the reflector/thermal barrier 4206 should be greater than 95%. Also the use of non-flammable or low flammability materials is preferred for the reasons previously stated. Contacts 4204 and 4202 can be molded in or pressed into the molded reflector/thermal barrier 4206. Translucent light transmitting thermally conductive element 4200 provides cooling and physical support to LEDs and/or LED packages 4210 and interconnect 4208 as previously disclosed. The use of this approach allows for a higher temperature operation point for the translucent thermally conductive element 4200 than those approaches disclosed which allow for greater thermal transfer to the reflector/thermal barrier 4206. This increases the lumens output per surface area and also increases the lumens per gram. It should be apparent that reflector/thermal barrier 4206 should be made of material compatible with the temperatures created by this approach. Again in this embodiment the emitting surface and cooling surface are both substantially the same.

Figure 43:
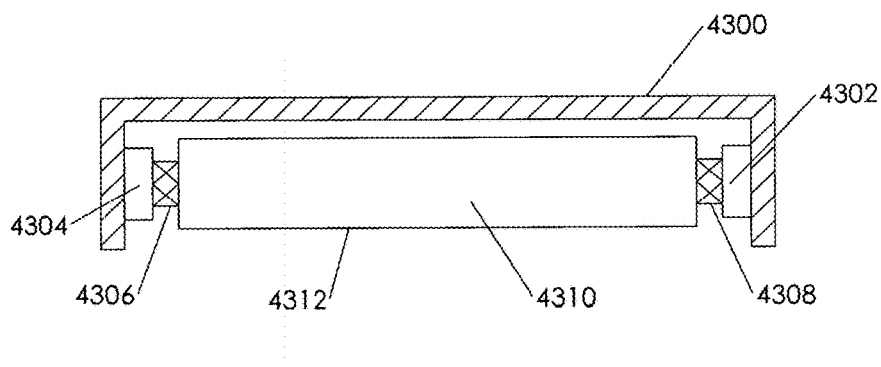
FIG. 43 depicts a side view of a snap fit linear sources for grids, undercounter, aircraft, and ceiling lighting.

FIG. 43 depicts snap fit linear light sources for grids, undercounter, aircraft, and ceiling lighting. Housing 4300 provides mounting of the self cooling light source 4310. The self cooling light source 4310 is constructed as previously described wherein the emitting surface(s) 4312 is the heatsink. As shown the housing 4300 contains two housing contacts 4302 and 4304 which form an electrical connection with light source contacts 4308 an 4306 which provide power to self cooling light source 4310. Housing 4300 may be made out of a wide range of materials including polymers, metals and ceramics. Thermally insulative materials are preferred to thermally isolate the self cooling light source 4310 from any wood, paper, drywall or other heat sensitive materials to which the housing 4300 is mounted. Housing 4300 may be mounted using screws, adhesives, pins, snaps or other mechanical or chemical means. Because the self cooling light source 4310 does not require additional heatsinking to dissipate its heat, housing 4310 may be made out of any material which can handle the surface temperatures of the self cooling light source 4310. Housing 4310 may also include additional support in the form of rails, clips, Velcro, magnets, or springs which secure and/or position the self cooling light source 4310 with the housing 4310. Housing contacts 4302 and 4304 and light source 4308 and 4306 may include spring loaded contacts, snap fit, conductive Velcro, magnetic, or locking means to ensure electrical contact.

Figure 44:
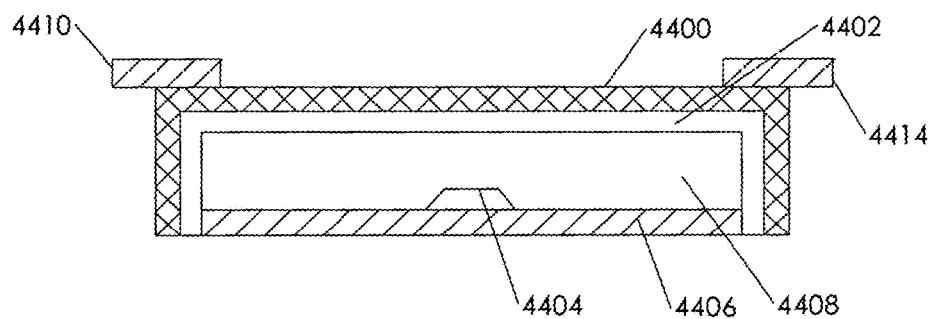
FIG. 44 depicts a side view of a self cooling lambertian solid state light source with thermal insulation barrier.

FIG. 44 depicts a thermally insulated lambertian self cooling light source with an integral thermal barrier 4400, which additionally acts as a mounting fixture. Mounting elements 4410 and 4414 can include but are not limited to tabs, rails, spring loaded elements, clips, Velcro, adhesive strips, magnets or other mechanical/chemical means of attachment and/or alignment. Optionally additional reflective layer 4402 may be used to enhance the reflectivity of the integral thermal barrier 4400 such that the recycling cavity 4408 will efficiently spread the light from at least one LED 4404 throughout the light recycling cavity 4408. Again the light transmitting thermally conductive element 4406 allows for both efficient emission of the light from the at least one LED 4404 and removing the heat generated by at least one LED 4404.

Figure 45A:
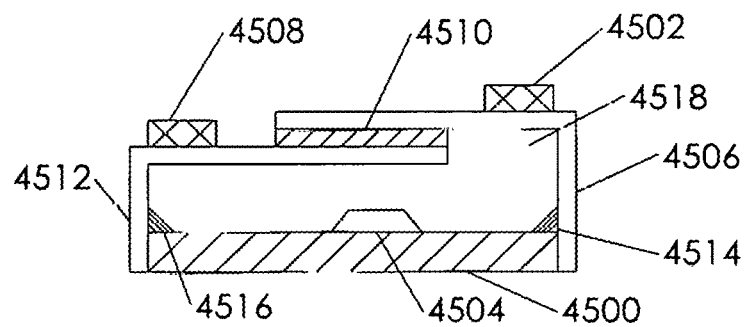
FIG. 45A depicts a side view of a connector for self cooling light sources with a reflector.

FIG. 45 depicts various connector arrangements for a self cooling light source with a reflector. FIG. 45A depicts two overlapping reflector elements 4506 and 4512, which are electrically isolated by dielectric layer 4510. The reflectors 4506 and 4512 have optional contacts 4502 and 4508 respectively. Electrical power is provided through the overlapping reflectors 4506 and 4512 to the translucent thermally conductive element 4500 through board contacts 4514 and 4516 which may include conductive epoxies, clips, solder joints, through holes, wires, and/or other connection means. The electrical power is distributed to the at least one LED 4504 as previously disclosed via an interconnect means (not shown).

Figure 45B:
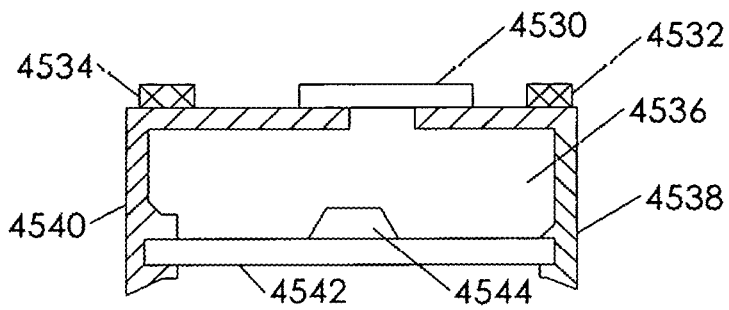
FIG. 45B depicts a side view of split reflectors with integral contacts.

FIG. 45B depicts another version of split reflectors 4538 and 4540 both of which have integral contacts which mechanically and electrically contact translucent thermally conductive element 4542 which contains at least one LED 4544. Optionally, reflector contacts 4532 and 4534 may be used to improve the electrical contact to an external power source. Insulating bridge element 4530 serves not only to electrically isolate the split reflectors 4538 and 4540 but also to provide support for the overall assembly.

Figure 45C:
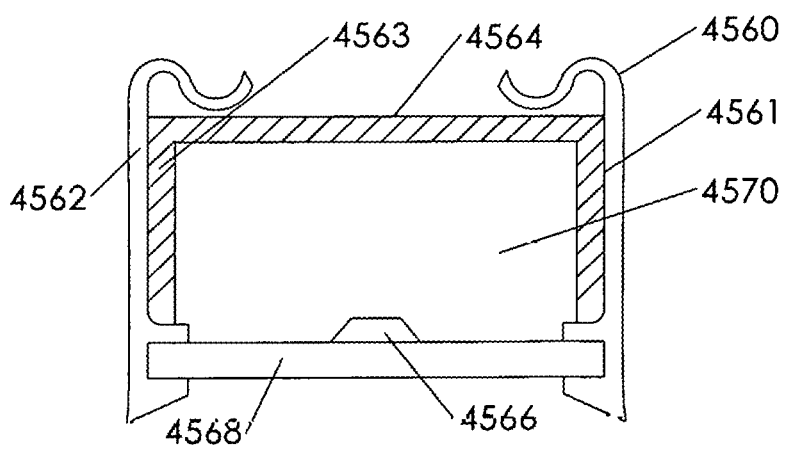
FIG. 45C depicts a side view of a recycling cavity formed of side clips, a reflector 4564 and a translucent thermally conductive element.

FIG. 45C depicts the use of side clips 4562 and 4560, which mechanically hold reflector 4564 and translucent thermally conductive element 4568 together and thereby form the recycling cavity around at least one LED 4566. In this configuration the side clips 4562 and 4560 also serve as the electrical contact to the external power supply (not shown). Also in this configuration reflector 4564 is most preferred to be electrically insulating. Alternatively, the side clips 4506, 4562 may have a dielectric or insulating layer on their inside surfaces 4561 and 4563 where they contact the reflector 4564. The clips may also allow for differing thermal expansion between reflector and light transmitting thermally conductive element. The use of any of these connection means to form light sources with multiple translucent light transmitting thermally conductive elements 4568 is also an embodiment of this invention. In general, robust large contact area connections are preferred. Multiple contact points are preferred to single point connections for improved reliability. The use of corrosion resistant coatings such as tin alloys, carbon based contact, and other environmentally stable layers to enable reliable electrical connections are also embodiments of this invention.

Figure 46A:
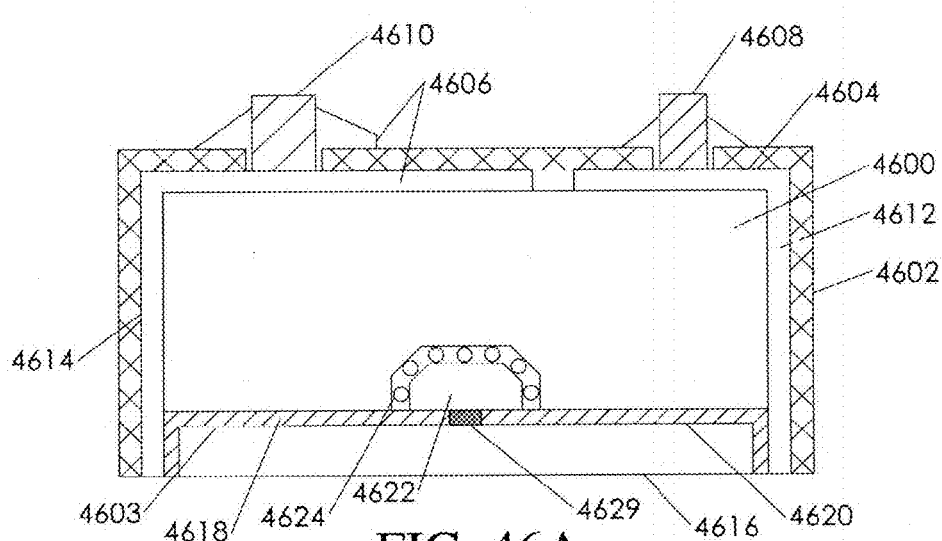
FIG. 46A depicts a side view of a recycling light source with a light transmitting thermally conductive element and interconnects.

FIG. 46A depicts another embodiment of a light recycling cavity 4600 comprising a strongly light scattering and light transmitting thermally conductive element 4616 one which interconnects 4620 and 4618 are formed as previously disclosed. It should be noted that while the side view shows interconnects 4620 and 4618 covering the inner surface of strongly scattering light transmitting thermally conductive element 4616 with only a small gap 4629, in most application standard line widths of typically 100 micron wide and 5 microns thick would be used such that the amount of conductive material used is minimized. Therefore, the interconnect only covers a small fraction of the total area of the inward facing surface 4603 of the light transmitting thermally conductive element 4616. The width and thickness of the interconnect can be adjusted as would be appropriate for the at least one LED or semiconductor device 4622 based on maximum drive current and the length of the traces. Most preferred are interconnects 4620 and 4618 which are thin traces due to the cost of the metal materials used. Most preferred is low surface roughness silver thick film pastes with a RMS roughness less than 5 microns. An example is Heraeus silver thick film paste CL80-9364 which enables the use of direct attach LED die 2810 such as DA-500 die produced by Cree. Direct attached die and/or soldered LED packages are preferred devices for at least one LED or semiconductor device 4622 due to the elimination of wirebonding costs. In general, high reflectivity and high conductivity materials are preferred for interconnects 4620 and 4618.

Additional wavelength conversion elements 4624 may be placed on the at least one LED or semiconductor device 4622 or elsewhere within the light recycling cavity 4600. For example on the surfaces which make up the light recycling cavity: reflectors 4612 and 4614, flex layer 4602, interconnects 4620 and 4618, and strongly scattering thermally conductive element 4616. External contacts 4610 and 4608 may attach to the reflective flex circuit comprising reflectors 4614 and 4604 respectively and optionally to flex layer 4602 using conductive epoxy, soldering, ultrasonic bonding, tab bonding, mechanical means, and other connection means known in the art. Adhesive insulators 4604 and 4606 are optionally used to support external contacts 4608 and 4610 respectively. Similarly reflector 4612 and 4614 may make electrical contact with interconnects 4620 and 4618 respectively using but not limited to conductive epoxy, soldering, ultrasonic bonding, tab bonding, mechanical means and other connection means known in the art. A single layer reflective flex circuit is shown comprising reflectors 4612 and 4614 and flex layer 4602. However, additional layers of interconnect as practiced in the flex circuit industry may be used.

Unlike interconnects 4620 and 4618, it is most preferred that reflectors 4614 and 4612 cover the majority of flex layer 4602. In addition it is most preferred that reflectors 4614 and 4612 have reflectivity greater than 90%. The resulting reflective flex circuit and its use in light recycling cavities is an embodiment of this invention. External contacts 4610 and 4608 are disclosed as pins however other means including but not limited to clips, pads, strips, and other mechanical contact means may also be used. A preferred embodiment is continuation of interconnects 4618 and 4620 outside inner surfaces of the light recycling cavity 4600 such that external contacts 4610 and 4608 may be moved to edge of the light source (not shown). These approaches and the dimensional properties of interconnects 4618 and 4616 are common to the other embodiments in this disclosure. The use of adhesives, clips, solders, mechanical means, and fusion processes to bond the various pieces of the light source together are also disclosed.

Once formed this embodiment can create a wide range of colors when lit (by using different color LEDs or wavelength conversion elements), while still maintaining a substantially white body color because of the strongly scattering nature of the strongly scattering light transmitting thermally conductive element 4616. In addition, the reflectors 4614 and 4612 as well as other elements within the light recycling cavity 4600 contribute to the body color of the light source. Especially in the case of ceiling tiles and grid applications, the ability to create thin lightweight solid state light source with body colors which closely match the white tiles is a benefit. The desire is to essentially conceal the lighting in the ceiling structure so that unlike conventional troffers and can lights the lighting does not draw attention to itself in the eyes of the occupants but instead presents a monolithic uniform ceiling even though lighting fixtures are present. In addition the ability to distribute the lighting throughout the ceiling tiles and grid actually makes the lighting more efficient. Light can be positioned anywhere in the ceiling as needed unlike standard troffers which are typically placed on very regular intervals but in concentrated clumps which results in the need to over light some areas to meet minimum required lighting levels between the troffers. As previously disclosed additional semiconductor devices and elements may be incorporated within and/or on light recycling light cavity envelope 4600 besides just LEDs. In addition interconnects 4620 and 4618 and reflective flex circuit comprising reflectors 4614 and 4612 and flex layer 4602 may be used to form antennas for RFID and other communication and sensor applications.

Alumina especially can be used for the strongly scattering light transmitting thermally conductive element 4616. The flex circuit may also be used to create inductive or capacitive couplers to external modulated energy source eliminating the need for external contacts 4610 and 4608. Additional functions which can be incorporated into these self cooling light sources are but not limited to RFID sensing, smoke detection, ambient temperature detection, RF emitters, strobe sources, optical data links, motion sensors, and wireless communications. As lighting is required in virtually all occupied spaces it is only natural that sensor, communication, and security functions be integrated into the light sources. The ability to use commercial grade low cost alumina provides an ideal substrate for integrating these extra electrical components into the light source. The strongly scattering white body color of these light sources allow for the concealment of security functions such as cameras and sensors. As an example a piezo-electric speaker can be placed within, built into or otherwise attached to the light source. Audio and other low frequency modulation may be brought into via the external contacts 4608 and 4610 or separate leads. Audio modulation in particular can be run in parallel, separately, or filtered off the DC input or be brought in on separate inputs. The benefit of this approach is elimination of speakers within the ceiling and the added benefit of enhanced cooling of the light source based on surface boundary interruption created by vibrations from the integrated speaker. Internal speakers can also move air into and out of the light recycling cavity 4600. This approach also allows for easy repositioning of audio speakers in a ceiling. The use of this approach to noise blank, create audio ambience, create background noise, act as an audio fire warning, acoustical source for motion detection, create a distributed speaker system, create a distributed music system. In general, this approach allows field installable, field replaceable, and field adaptable audio systems integrated into the lighting.

Figure 46B:
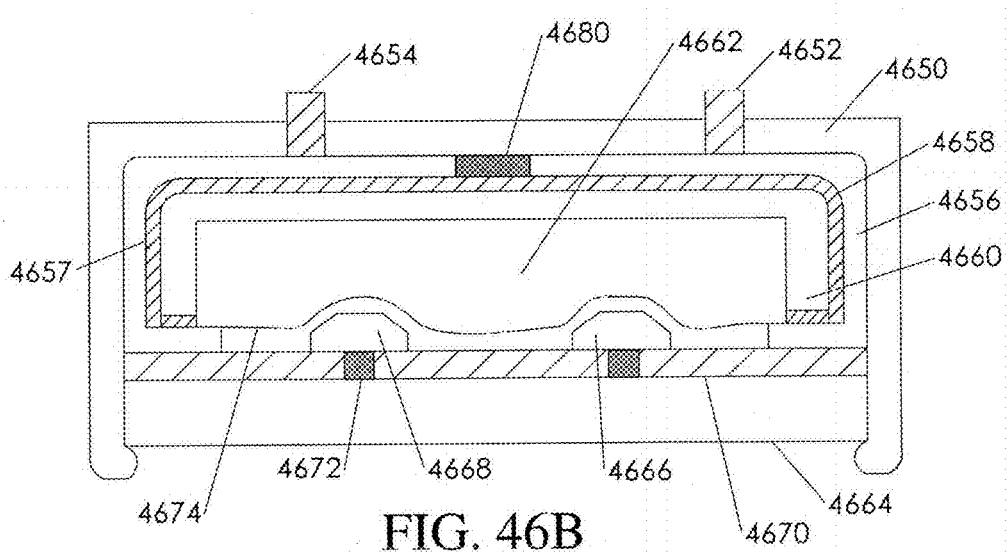
FIG. 46B depicts a side view of a flex circuit version of the self cooling light source.

As an example, a store owner could buy a light source based on this disclosure, which queried RFID tags at the exit from the story while an externally identical light source could be detecting motion elsewhere in the store. In this manner, lighting and security become the same element reducing cost, concealing the security, and improving the aesthetics. Interconnects 4618 and 4620 may be single circuits as shown or multiple circuits. The extra functions may be powered separately and in tandem with at least one LED or semiconductor device 4622. Light recycling cavity 4600 may be air, a gas, a liquid, a phase change material, an optical transmitting solid, or combinations of both. Most preferred is air. In the case where non-homogenous materials are used to make strongly scattering thermally conductive element 4616 air may flow into light recycling cavity 4600. An outer porous scrim layer may optionally be used to further modify the external body color of the source. FIG. 46B further depicts a flex circuit version of the self cooling light source. Light recycling cavity 4662 is formed by inner reflector element 4660 and translucent thermally conductive element 4664 as previously disclosed. In this case inner reflector element 4660 is electrically insulated by adhesive layer 4658 from conductive strips 4656 and 4657. In this manner conductive strips 4656 and 4657 can be used to make connection to interconnect 4670. Solder coated copper ribbon as used in the solar industry is a preferred material for conductive strips 4656 and 4657. Again LEDs and/or semiconductor devices 4668 and 4666 and interconnected using interconnect 4670. Additional electrical isolation may be provided using underfill 4672 and overcoat 4674. Paralyene and other transparent dielectric environmental coating are preferred materials for overcoat 4674. It should be noted that alumina and other materials while strongly scattering in the visible region are almost transparent in the infrared and therefore imaging at these longer wavelengths is possible from within the light recycling cavity 4662. The ability to hide detection, security, acoustical, and other sensor functions within the self cooling light sources or dummy elements as previously disclosed in FIG. 41 is a preferred embodiment of this invention.

In general, the light sources disclosed may be used to attach, mount or otherwise adhere to a variety of surfaces. While halogen and incandescent sources can have surface temperatures exceeding 150° C. it is preferred that the sources disclosed in this invention operate below 90° C. Even more preferably the sources disclosed herein operate below 70° C. Typically building codes limit direct contact to combustible surfaces such as wallpaper to less than 90° C. As such incandescent and halogen sources must be thermally isolated from these materials. Based on the higher efficiency of solid state light sources, with the light emitting surface being the cooling surface, the efficiency of this invention, and the thermal spreading of the light transmitting thermally conductive element; 4 inch×4 inch panel lights based on this invention can emit in excess of 1000 lumens without exceeding the 90° C. surface temperatures in contact with any mounting surfaces. As such the light sources disclosed can emit a useful level of output directly mounted on wallpaper and other combustible surfaces unlike incandescent and halogen sources. This allow for a wide range of applications. The non-flammable nature of the materials used in this invention do not allow for flame spread even up to 1000° C. unlike prior art organic based waveguide approaches. If even higher lumen outputs are required the thermal barrier 4650 may further thermally isolate the heat generated in the light source from coupling to any surface to which the light source is attached. The thermal barrier 4650 may consist of polymers, fiberglass, ceramics, or metals. The thermal barrier 4650 may also be decorative, supportive, or even form a hermetic or environmental seal for the light source.

Figure 47A:
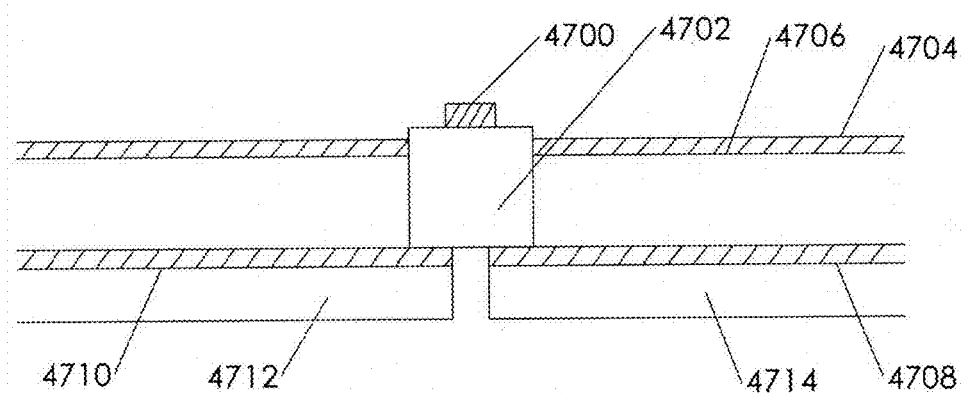
FIG. 47A depicts a side view of a plurality of light sources connected together to form linear, shaped or large planar area light sources.

FIG. 47 depicts multiple or plurality of light sources and/or dummy elements connected together to form linear, shaped or large planar area light sources. FIG. 47A depicts light transmitting thermally conductive elements 4712 and 4714 on which an electrical interconnect means 4710 and 4708 is formed. Reflector 4704 may be separate reflectors for each segment of the light source or a single larger reflector that bridges the translucent light transmitting thermally conductive elements 4712 and 4714. Jumper 4702 may consist of but not limited to flex circuits, wires, pins, mechanical clips, ribbon, or other electrical connecting means. Jumper 4702 may further have a contact 4700 which may consist of but not limited to magnets, pins, clips, or other contact means known in the art. While not shown reflector 4704 has sides as previously disclosed which form a light recycling cavity 4706 as also previously described. Jumper 4702 may be within the recycling cavity 4706 or outside the recycling cavity 4706 formed by reflector 4704 and the translucent thermally conductive elements 4712 and 4714. Jumper 4702 may or may not be physically attached to reflector 4704. Reflector 4704 may or may not be part of the electrical connections used to provide power to the LED die or packages (not shown) within the light recycling cavity 4706. While a two dimensional rendering is shown, it is disclosed that interconnect means 4708 and 4710 cover a small portion of the surface area of translucent light transmitting thermally conductive elements 4714 and 4712 respectively. This allows for high transmission of the light through translucent light transmitting thermally conductive elements 4714 and 4712 as previously disclosed.

Figure 47B:
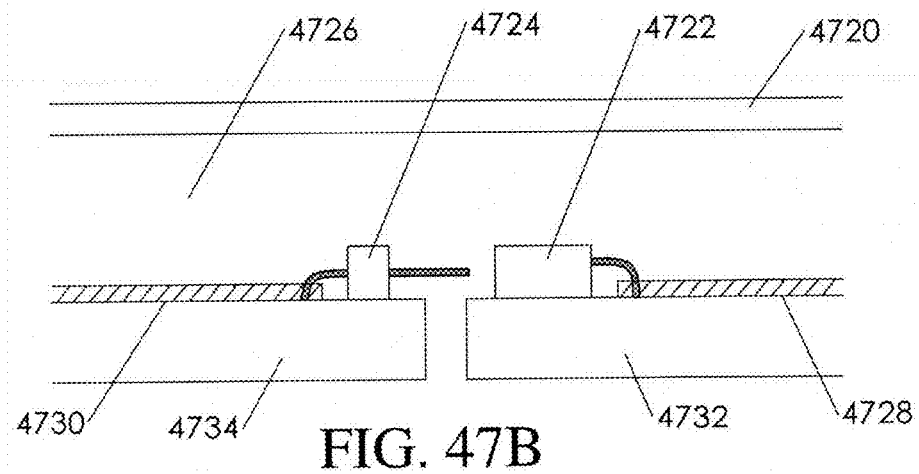
FIG. 47B depicts a side view of a plurality of light sources with connectors consisting of at least one pin connector and at least one socket connector.

FIG. 47B depicts multiple or plurality of light sources or dummy elements which are connected via connectors consisting of at least one pin connector 4724 and at least one socket connector 4722 which attach to interconnect means 4730 on translucent thermally conductive element 4734 and interconnects means 4728 on translucent thermally conductive element 4732 respectively. Again reflector element 4720 forms a light recycling cavity 4726 along with translucent light transmitting thermally conductive elements 4734 and 4732. Using these techniques multiple or a plurality of light sources may be interconnected electrically and physically to form long linear, shaped or large area low profile light sources without the need for heatsinks or other cooling means. In general, the techniques listed above allow for light sources, which emit greater than 30 lumens per gram. This high lumen output to weight ratio and the ability to cool using substantially only the light emitting surface is fundamental to this invention as it reduces the material costs of lighting fixtures, allows for direct application of solid state lighting to suspended ceilings and a wide variety of surfaces, and in many cases eliminates the need for additional fixture elements. As an example a 1000 square foot room requires 30,000 lumens to provide adequate lighting levels for general usage. Using the light sources of this invention the entire lighting for the room will weigh less than 1 kg. This allows for direct attachment to suspended ceilings without the need for additional support wires to the deck. It also reduces shipping costs and storage costs. Unlike incandescent or fluorescent bulbs the low profile and low voltage characteristics of these solid state light sources eliminate in many cases the need for additional fixture elements further reducing costs.

In particular the use of these light sources embedded in, attached to, or mounted to sheetrock, ceiling tiles, wood paneling, painted surfaces, metal surfaces, trim elements, brick, stone, tile or other construction materials to provide lighting or intelligent lighting in homes, offices, restrooms, manufacturing, or other lighting applications is an embodiment of this invention. Intelligent lighting is also a preferred embodiment allowing for the integration of color tuning, light harvesting, security, motion detection, or other sensor functions into the lighting modules. As lighting is required in virtually all locations where humans work, reside, or occupy; the integration of sensors into the lighting system is preferred.

The lighting system disclosed in this invention enables a low cost, simple architecture for implementing intelligent lighting. Not only are the light sources disclosed lightweight, efficient, and cost effective they are also (especially in the cases where alumina is used for the translucent light transmitting thermally conductive elements 4734 and 4732) completely compatible with multi-chip module technologies such as thick film and lithographic based electronic packaging. The key component of the light source which acts as both the light emitting and cooling element also is compatible with thick film and lithography based interconnect means. This permits the light emitter to also simultaneously act as a substrate for multi-chip elements, passive elements, or active elements and is a preferred embodiment of this invention. Alumina is a preferred material due to its high scatter yet low optical absorption, white body color to external light, nearly linear optical absorption across the visible spectrum, high transmission in the IR, high emissivity, reasonable thermal conductivity, low cost, availability in thin sheet form, volume manufacturing, compatibility with high temperature thick film processing, low thermal expansion coefficient, insulative properties, non-flammability, low moisture uptake, vacuum tightness, and dielectric properties allowing for high frequency elements. While other materials may be used the above properties all effect final product performance and must to be taken into account. Other materials disclosed such as organic/inorganic composites offer advantage of lower density and wider range of body color but lower operation temperatures. Holey metal approaches require the use of dielectric layers but allow for a wide range of aesthetic finishes since the outer surface no longer effects the light recycling cavity performance.

Figure 48:
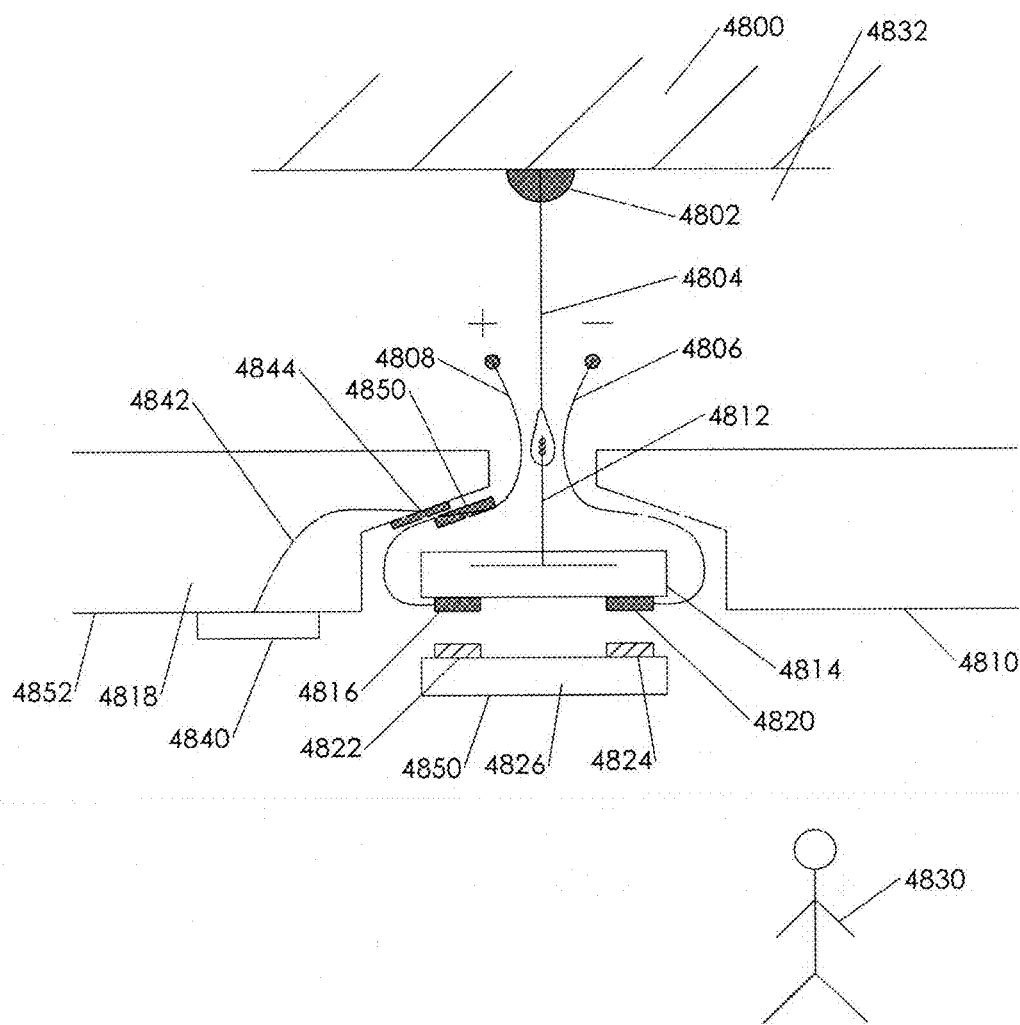
FIG. 48 depicts a side view of a retrofit system for suspended ceilings.

FIG. 48 depicts a means to form a contiguous barrier with lighting with a retrofit system based on self cooling light sources disclosed in this invention. This approach overcomes the need to replace the existing grid in a suspended ceiling. This is field installable unlike the DC FlexZone system described previously which requires the existing grid to be removed and replaced. In this embodiment the existing grid 4812 is attached the deck 4800 via suspension wire 4804 and mount 4802. Ceiling tiles 4804 and 4818 are suspended via the existing grid 4812. Clip on power rail 4814 attaches to existing grid 4812 via but not limited to one of the following means, clips, adhesive, magnets, screws, snaps, or other mechanical means. Power leads 4808 and 4806 attach to contacts 4816 and 4814 respectively. Power leads 4808 and 4806 may or may not be integrated into clip on power rail 4814. Power leads 4808 and 4806 further attach to at least one external power source (not shown) and deliver power to the contacts 4816 and 4814 respectively. The light source 4826 contains contacts 4822 and 4824 which mate with contacts 4816 and 4820 respectively. Contact 4822 and 4824 may also provide mechanical, magnetic, adhesive, Velcro, or other physical attachment means to hold light source 4826 to clip on power rail 4814 which in turn is attached to existing grid 4812.

The advantage of this approach is that existing grids and ceiling tiles can be used, lighting and intelligent lighting functions can be added only where needed, the existing grid can be cosmetically covered, the retrofit system can be installed by the end customer (especially for low voltage (less than 30 VDC)), it is easily removed, moved, upgraded, or otherwise changed, and the lightweight nature of the approach does not degrade seismic performance of the ceiling. Alternately, the light source 4826 may be integrated in the ceiling tiles 4818 and/or 4810 instead or as well as the existing grid 4812. In the case where the light source 4840 is mounted or embedded in ceiling tile 4818, wires 4842 (only one wire shown) would contact power leads 4808 and 4806 using contact means 4844 and 4850 as previously described. In this case both positive and negative inputs could be on one or each side of the existing grid 4812 and two or more contacts 4844 would be used to provide power to the light source 4840. Again the main advantage is the light weight (greater than 30 lumens per gram) and the self cooling nature of this invention. Ceiling tiles 4818 are typically composed of recycled paper and as such contain combustible materials. They also are specifically designed to have low thermal conductivity to isolate the plenum side 4832 from the occupant side 4834 to enhance the work environment for the occupants 4830. As previously state the high lumen per gram (greater than 30 lumens per gram) enables the delivery of over 30,000 lumens into a room with less than 1 Kg of additional weight to the suspended ceiling from the light sources 4826.

The light sources 4826 also cools itself substantially using the light emitting surface dissipating the heat it generates into the occupant side 4834 of the installation. Light source 4840 similarly dissipates its heat into the occupant side 4834 of the installation while maintaining a maximum surface temperature against the ceiling tile 4818 of less than 90° C. and even more preferably less than 70° C. Both light source 4822 and 4840 can deliver greater than 100 lumens of diffuse substantially lambertian light per square inch of emitting surface while maintaining these surface temperature constraints. Unlike conventional solid state lighting this approach minimizes the amount of material required to create a high lumen output distributed substantially lambertian solid state source, minimizes the amount of weight required to generate 1000s of lumens of output and does this in a package this is less than 1 cm thick and even more preferably less than 5 mm thick. This thin package enables the formation of a nearly monolithic suspended ceiling wherein ceiling tiles 4818 and 4810 can be tegular as shown. Light source 4826 because of its thinness (less than 1 cm more preferably less than 5 mm) can have its emitting surface 4850 substantially flush with the occupant side 4852 of ceiling tile 4818. This creates a more pleasing and aesthetic look for the occupant 4830. In general, 30,000 lumens can be delivered into a room using less than 1 Kg of light sources 4826 while dissipating less than 500 watts. A 1000 square foot room would be illuminated with greater than 30 lumens per square foot while maintain a maximum surface temperature of less than 90° C. and even more preferably less than 70° C. The low thermal resistance of the approach also maintains the LED junction temperatures within light source 4826 to be only a few degrees higher than the emitting surface 4850. Further still, the high lumens per gram output of light source 4826 enables clip, snap, mechanical, Velcro, adhesive and magnetic suspension and mounting to the ceiling. Typically the existing grid 4812 is steel as such magnets can be used to not only hold contacts 4816 and 4820 to contacts 4822 and 4824 respectively, magnets may be used to hold light source 4826 in place.

Figures 49A, 49B:
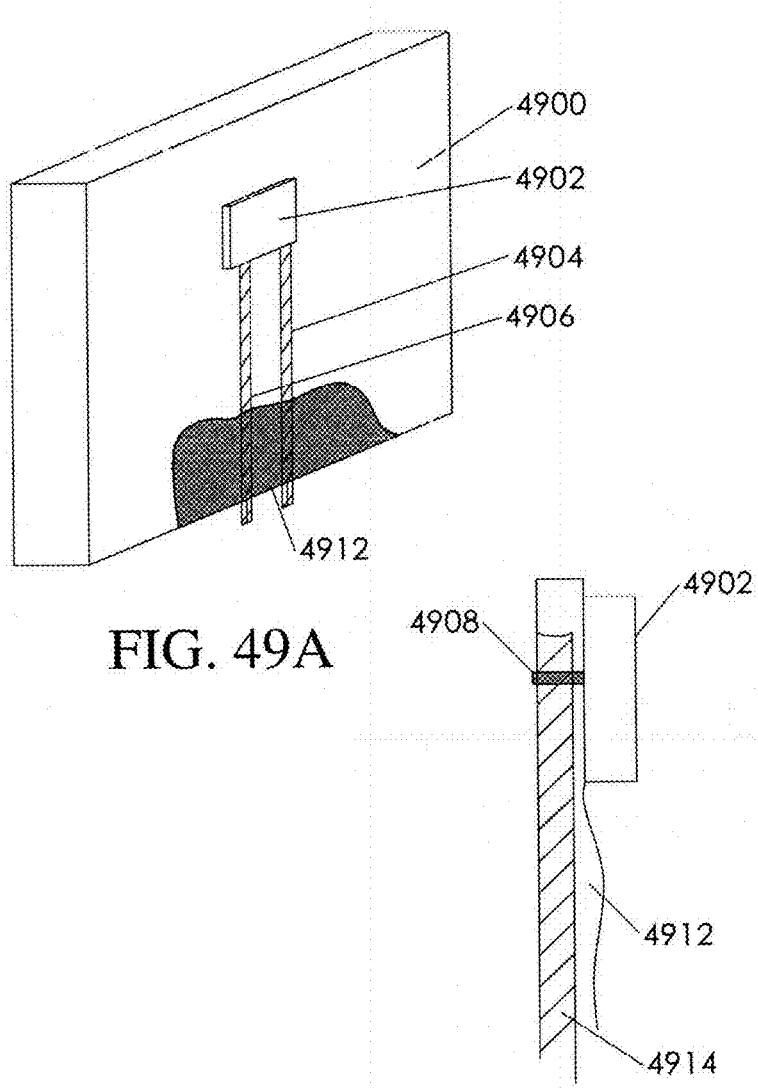
FIG. 49A depicts a perspective view of a barrier utilizing a retrofit wall or floor installation of the light sources.
FIG. 49B depicts a side view of a power input means covered by cover layer.

FIG. 49A depicts a means to form a barrier 4900 of this invention utilizing a retrofit wall or floor installation of the light sources 4902. Because additional elements such as heatsinks, diffusers, or frames are not needed with the disclosed light sources 4902 for use as a fixture, light source 4902 can be mounted onto any surface which contains some power input means 4904 and 4906. Power input means 4904 and 4906 may include but not limited to embedded wires, tape based conductors, TCO based conductors, inductive coupling means, capacitive coupling means and radiative coupling means. As previously stated because the preferred embodiment is alumina for the emitting and cooling surfaces a wide range of active and passive elements can be easily incorporated into the light source 4902. As an example power input means 4902 and 4906 may be simply two copper conductors embossed, trenched into, or otherwise embedded into wall or floor barrier 4900.

As shown in FIG. 49B power input means 4904 can be covered by cover layer 4912 which may include but not limited to wallpaper, spackle, paint or other coverings. Because light sources 4902 can deliver over 500 lumens in an area of less than 10 square inches, weigh less than 20 grams, in a package less than 5 mm thick, and still maintain a surface temperature less than 90° C. while dissipating substantially all the heat generated into the room via the light emitting surface, it is possible to simply mount the light sources 4902 to the wall or floor 4900 using mechanical means such as but not limited to screws, pins, staples, magnets, Velcro, adhesives and other attachment methods. As shown in FIG. 49B the support pin 4908 may also act as an electrical connection between light sources 4902 and power input means 4094, even piercing cover layer 4912. Essentially the lightweight nature of these light sources 4902 can be tacked on to wall or floor 4900 if the proper power input means 4904 and 4906 are provided either within, on, behind, in front of, or attached to wall of floor 4900. While two leads are shown for power input means 4904 and 4906 multiple lines may be used for control and even digital or RF inputs. Again light emitting and dummy units can be used in floor and wall applications as well. The light sources disclosed are applicable for indoor, outdoor, underwater, hazardous environment, space, and pressurized installations. Low voltage (less than 30 VDC) are preferred due to elimination of shock harzards however AC and higher voltages are disclosed with the addition of dielectric protection and other safety features known in the industry. Low voltage drive is also preferred due to elimination of AC to DC conversion losses for intelligent lighting functions which usually operate using DC. Using this approach wall wart power supplies and direct attachment to solar and other renewable resources are envisioned and preferred.

Figure 50:
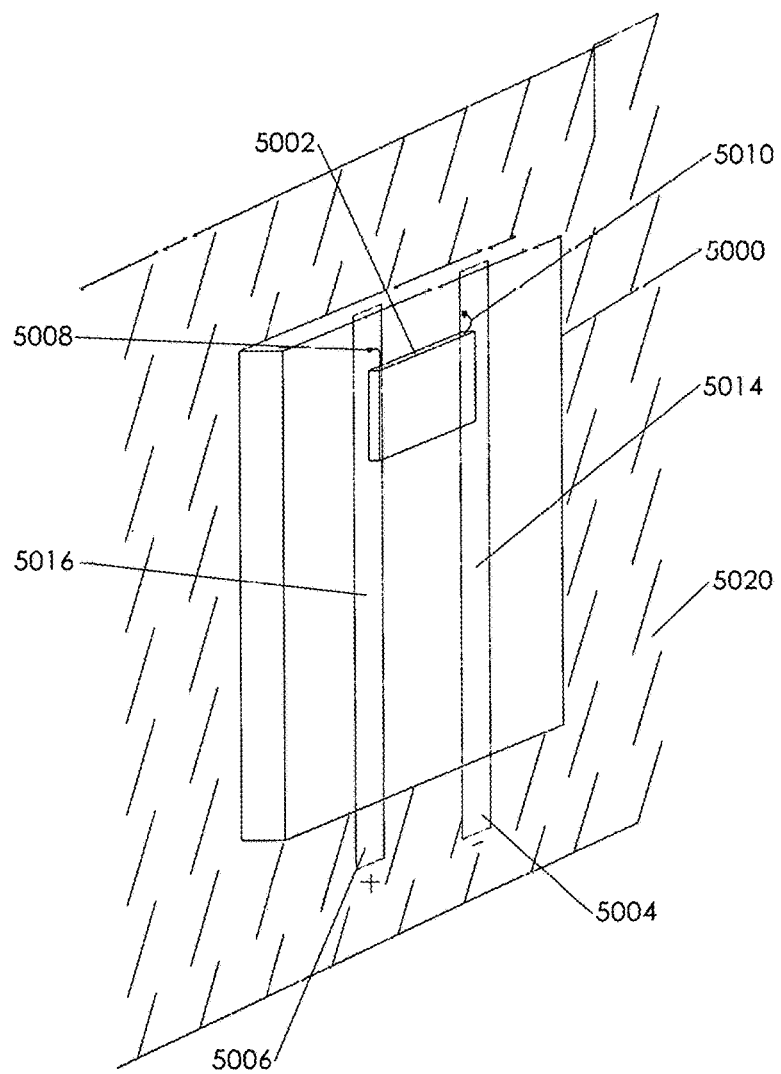
FIG. 50 depicts a perspective view of a removable modular wall system with integrated low voltage power grid.

FIG. 50 depicts a means of forming a barrier of this invention utilizing modular sheathing units with integrated low voltage conductors to form a low voltage power grid for existing walls and floors. Sheathing unit 5000 contains at least two conductors 5016 and 5014. Sheathing unit 5000 may consist of but not limited to composite, paneling, sheetrock, and other construction materials. Sheathing unit 5000 most preferably is not permanently affixed to underlying walls and floors 5020 and is substantially self supporting. In a manner similar to modular flooring which snap together sheathing unit 5000 is intended to be removable such that the modular system can be taken with the owner when they move. The modular nature also allow for easy remodeling and redecorating without disturbing the underlying walls and floors 5020. While attachment to underlying walls and flooring is possible it is not preferred. This enables the end user to easily reconfigure the room as required. As such sheathing unit 500 has sufficient structural integrity to support itself substantially over the typical 8 foot floor to ceiling distance with attachment only at the top and bottom to underlying walls and floor 5020. Most preferably sheathing unit 5000 has an integral or non-integral locking system which allows the multiple sheathing units 5000 to be linked together. The multiple sheathing units 5000 may or may not contain at least two conductors 5016 and 5014 in each unit. At least two conductors 5016 and 5014 are shown with contact leads 5006 and 5004 respectively, which connect to a main low voltage power distribution system (not shown). The main low voltage power distribution system may be hidden within trim molding, wainscoting, or other covering means which may also be attached or mounted to the assembled sheathing units 5000 after installation.

Contact leads 5006 and 5004 may also be attachment means for securing sheathing units 5000 to the underlying floors and walls 5020. The sheathing units 5000 may also extend to ceilings or be freestanding elements as well. Connector means 5010 and 5008 are meant to electrically connect to at least two conductors 5016 and 5014 to provide power to panel light 5002. Connector means 5010 and 5008 may optionally provide for attachment means of panel light 5002 to the sheathing unit 5000 as well. The lightweight, elimination of heatsink, and thinness of the panel light 5002 disclosed previously enables the use of this type of independent modular low voltage power grid. In conventional solid state lighting the underlying walls and floors 5020 would be drilled or otherwise punctured to allow for electrical wiring or recess mounting of the heatsink or other cooling means. This not only means that any changes such as moving a light source results in have to patch or otherwise repair the underlying walls and floors 5020 but it also means that underlying walls and floors 5020 no longer provide a continuous barrier which compromises the thermal and fire performance of the room. By creating an outer modular sheath consisting of multiple sheathing units 5000 which contain integral low voltage power grids the end user can change, remove, take with, or otherwise modify any room. While the approach can be extended to the ceiling as previously disclosed the sheathing units 5000 may require addition support or mounting elements to prevent warping. Sheathing units 5000 may also be used to connect, distribute or otherwise connect the low voltage power grid between the floor, ceiling, or walls. In this manner, a single power supply may be used to provide power to multiple lighting source or other devices such as but not limited to audio, air movement, displays, floor lamps, kitchen appliances, or tools.

An example, of additional support or mounting elements for ceiling mounting would be but not limited to the suspended grid, attachment to rafters, or other methods consistent with mounting of ceiling tiles, paneling, or sheetrock. Sheathing units 5000 may also be spaced out from underlying walls and floors and be acoustically permeable such that additional noise dampening can be created compared to hard mounted approaches. Sheathing units 5000 spaced a distance from underlying walls and floors 5020 may also provide air channels for HVAC. Hot air may be routed to closer to the floor and cold air may be routed to the ceiling using the space between the sheathing units 5000 and the underlying walls and floors 5020 to create more efficient heating and cooling. Alternately, radiant heating and/or cooling units may be incorporated into sheathing units 5000, between sheathing units 5000 and underlying walls and floors 5020, and/or attached to underlying walls and floors 5020 such that sheathing units 5000 act to not only hide the radiant heating and/or cooling units but also serve to enhance air circulation by forming induced draft air channels. In general, a preferred embodiment is a semi-rigid substantially freestanding modular system based on multiple connected sheathing units 5000 where at least one sheathing unit 5000 contains at least one low voltage power distribution grid.

Figure 51:
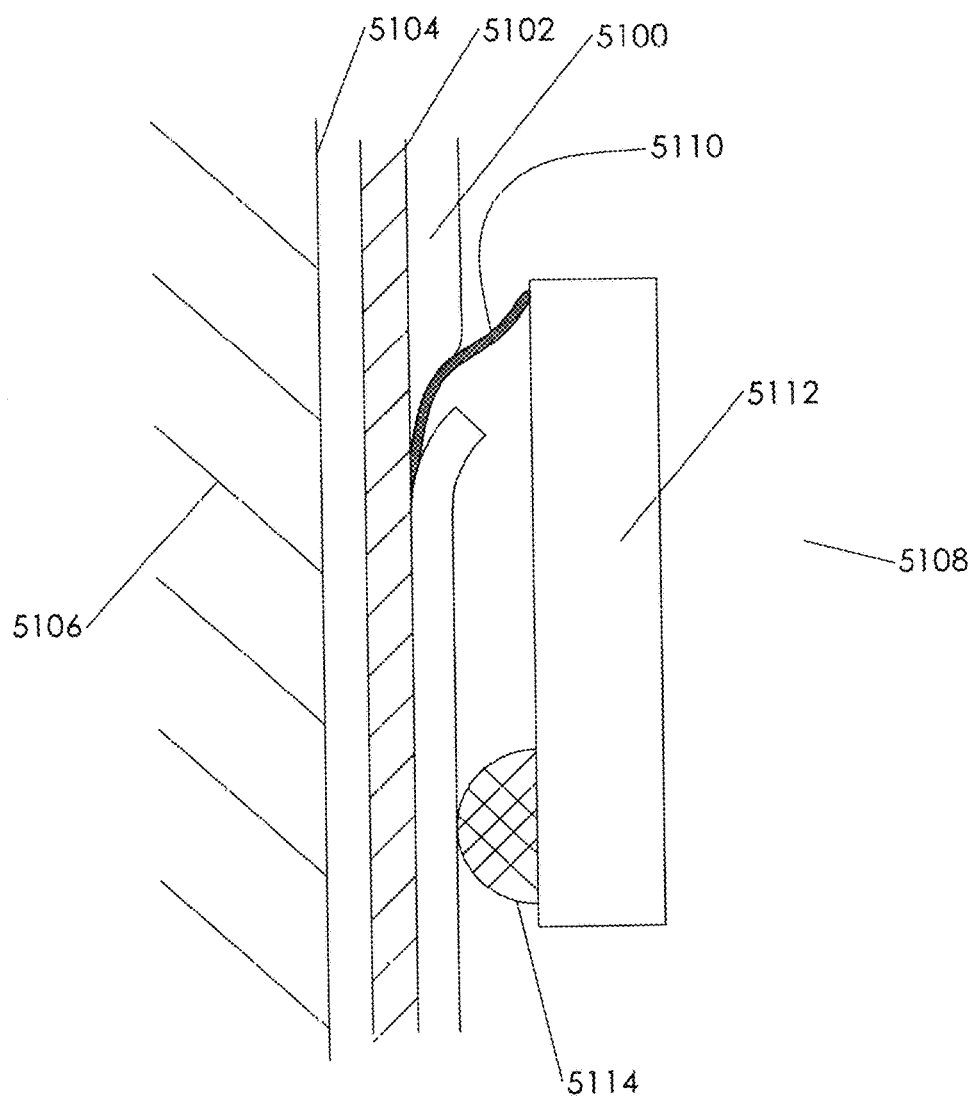
FIG. 51 depicts a side view of a self supporting panel light.

FIG. 51 depicts at least one panel light 5112 mounted to at least one modular sheathing unit consisting of an inner dielectric layer 5104, at least one inner conductor layer 5102, and at least one outer dielectric layer 5100. In this embodiment the modular sheathing unit is shown against wall, floor, or ceiling 5106. As previously stated the at least one modular sheathing unit is preferably substantially freestanding such that the power grid can be easily reconfigured, replaced, changed and moved to a new location. In the figure outer dielectric layer 5110 is pierced by contact probe 5110 to electrically connect the panel light 5112 to the inner conductor layer 5102. Multiple contact probes 5110 would be used to provide power to panel light 5112. Alternately, outer dielectric layer 5100 may be removed via mechanical, chemical, or abrasive means to expose inner conductor 5102 to enable electrical contact to panel light 5112. Alternately, inductive and capacitive means may be used to transfer power between inner conductor 5102 and the panel light 5112. In the wireless power transfer case a transmitting element would be additional incorporated into the sheating unit and receiving unit would be incorporated into the panel light 5112 as previously disclosed. Additional mounting means 5114 may include but not limited to screws, adhesive, clips, nails, tape, magnets, Velcro, or other mounting means. The light weight of the disclosed panel lights 5112 enables the use of this approach without the need for additional support via attachment walls, floor, or ceiling 5106. Additional trim, reflectors or optical elements both functional and decorative may be further attached to the outer dielectric layer 5100 and/or panel light 5112. The panel light 5112 emits both light and heat to the ambient environment 5108.

Figure 52:
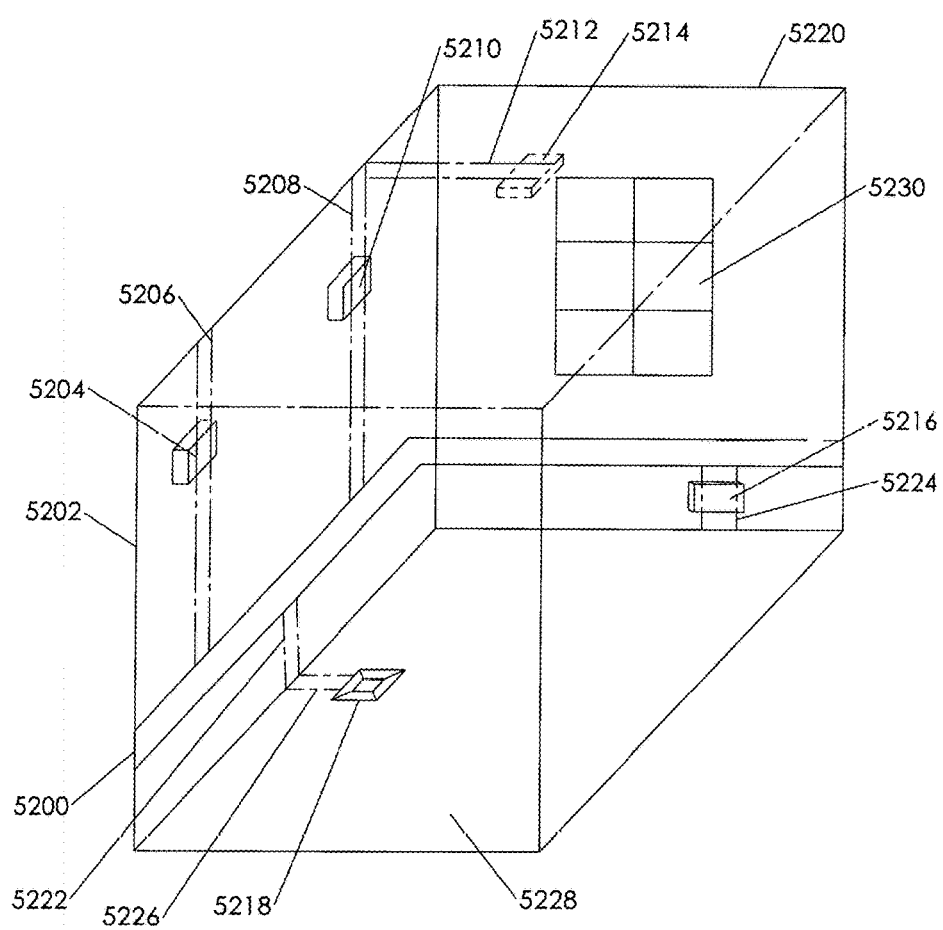
FIG. 52 depicts a perspective view of an integrated low voltage retrofittable power grid.

FIG. 52 depict a room comprising wall 5202, ceiling 5220, and floor 5228 with low voltage devices 5218, 5204, 5210, 5214, and 5216 all power using power legs 5226, 5222, 5206, 5208, 5212, and 5224 off the main low voltage power grid 5200. In some cases the power leg directly attaches the low voltage device to the low voltage power grid 5200. In other cases, multiple power legs which are 3 dimensionally oriented relative to each other are used to supply power to the low voltage device. An example is low voltage device 5218 which is connected to the main low voltage power grid 5200 via power legs 5222 and 5218. Low voltage devices 5218, 5204, 5210, 5214, and 5216 may consist of but not limited to panel lights, smoke detectors, motion sensors, light sensors, temperature sensors, DC to AC converters, DC to DC converters, data links, security sensors, RFID sensors, audio devices, video devices, entertainment devices, tools, kitchen appliances, and timers. In this embodiment sheathing units containing low voltage power grids are interconnected substantially orthogonally as shown however non-orthogonal interconnects between sheathing units is also envisioned. In general, it is disclosed that substantially freestanding modular system of sheathing units containing low voltage power grids are interconnected such that substantially only openings 5230 are not covered by the sheathing units. Openings 5230 may include windows, doors, central vacuum outlets, and HVAC openings. This box within a box allows for a high degree of flexibility and allows for HVAC, radiant heating, and cosmetic issues to be easily covered and/or hidden. As an example, an apartment with an unfinished concrete block wall can be retrofitted with wood paneling with an embedded low voltage power grid which can be removed by the tenant at the end of the lease using this approach in a manner very similar to how snap and lock floating flooring can be reused. This minimizes material waste associated with redecorating and renovation. Low voltage power grids do not require electrician installations, this coupled with light weight self cooling panel lights enables the reusable modular sheathing approach disclosed.

Figure 53A:
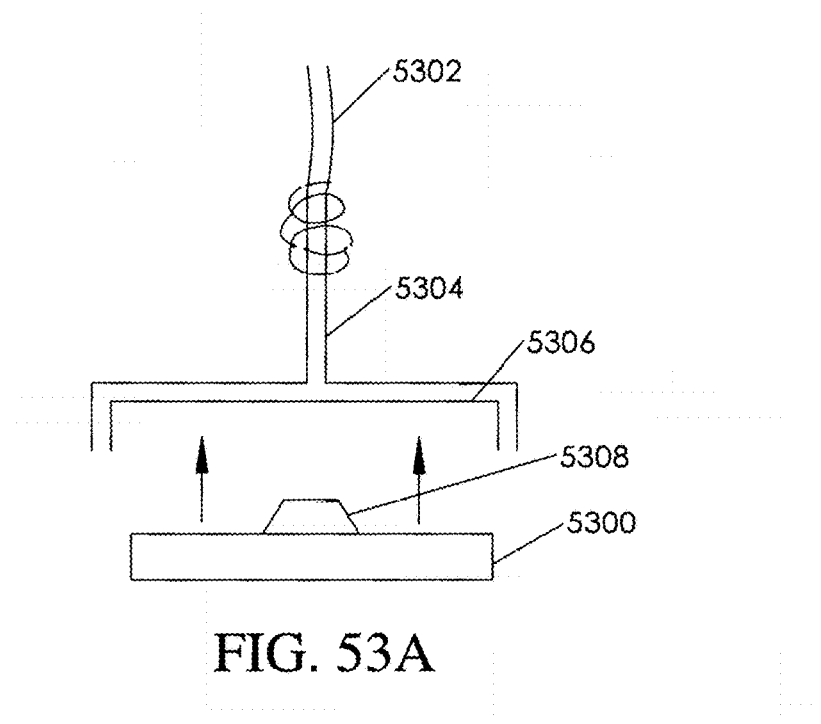
FIG. 53A depicts a side view of a light recycling cavity with an integrated reflective grid.
Figure 53B:
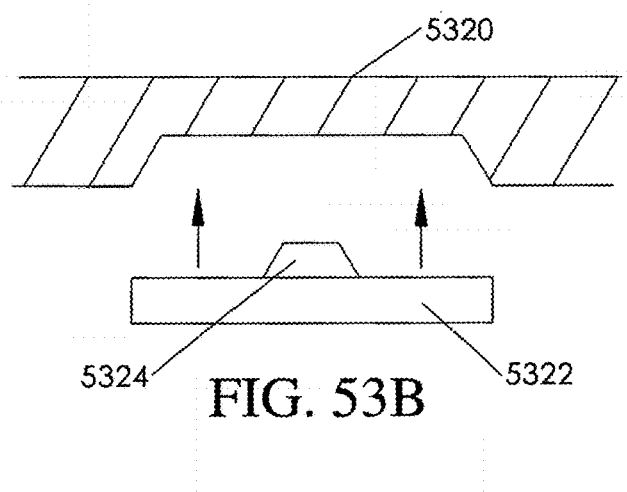
FIG. 53B depicts a side view of a light transmitting thermally conductive element with associated elements.

FIG. 53A depicts a reflective grid consisting of a grid element 5304 and reflector element 5306 which form part of the light recycling cavity. In this embodiment the end user installs the light transmitting thermally conductive element 5300. The light transmitting thermally conductive element 5300 may be attached to the grid element 5304 to form the light recycling cavity using but not limited to at least one of the following elements, clips, pins, magnets, adhesives, Velcro, or other mechanical means. The translucent thermally conductive element 5300 may further contain at least one of the following associated elements 5308, a semiconductor device, passive element, and/or light source. The translucent thermally conductive element 5300 may also be a dummy unit designed to provide a particular aesthetic look. This embodiment is enabled because the heat is removed and dissipated using the substantially only the translucent thermally conductive element 5300. This allows the reflector element 5306 be a wide range of materials including but not limited to reflective plastics, reflective metals, and other reflective coatings which may be attached or applied to the grid element 5304. This embodiment further reduces the weight of the light source which must be provided to the end user. Greater than 100 lumens per gram is possible when only the translucent thermally conductive element 5300 and any associated elements 5308 are all that is required to be shipped to the end user. This embodiment further reduces the cost of shipping and stocking. In addition this embodiment allows the end user access to the associated elements 5308 for upgrades and retrofits. As an example, wireless data links could be added or upgraded simply by replacing associated elements 5308 as required. This user adaptability is an embodiment and benefit of this invention. Given the long life (greater than 10 years) of solid state lighting this approach if standardized would allow for the end user to take their lighting to a new location as well as reconfigure the present location. FIG. 53B depicts a light transmitting thermally conductive element 5322 with associated elements 5324 which may include but not limited to light sources, active semiconductor elements, passive electronic elements, and microwave and RF elements. The light transmitting thermally conductive element 5322 forms the aperture element for a recycling cavity by attaching the light transmitting thermally conductive element 5322 to mounting surface 5320 which may include but not limited to a ceiling tile, wall, floor, ceiling, wood element, plastic element, sheetrock, painted panel, glass sheet, or other surface. The mounting surface most preferably has a reflectivity to light or radiation emitted from associated elements 5324 greater than 90%. The attachment may be via pins, wires, adhesives, mechanical means, nails, screws, clips, or other attachment means.

Figure 54A:
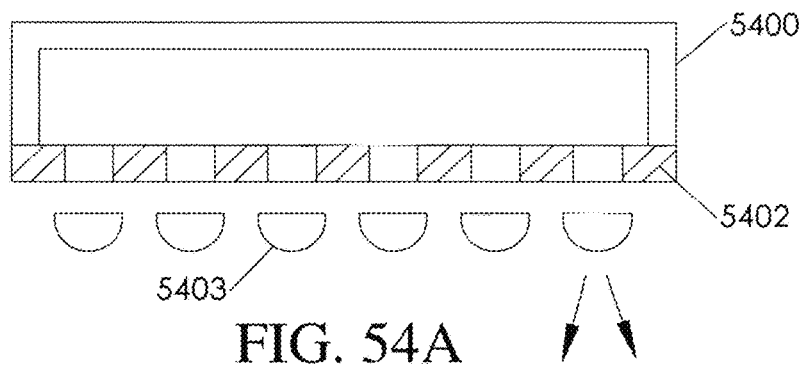
FIG. 54A depicts a side view of a recycling light source with a holey light transmitting thermally conductive element.

FIG. 54A depicts a light recycling light source with holey light transmitting thermally conductive element 5402. The reflector 5400 forms the light recycling cavity. The lens elements 5403 are aligned to the holes with the holey light transmitting thermally conductive element 5402 such that the solid angle of the light emitted from the light recycling light source is reduced to less than lambertian. This can be used to reduce glare and/or form a directive light source.

Figure 54B:
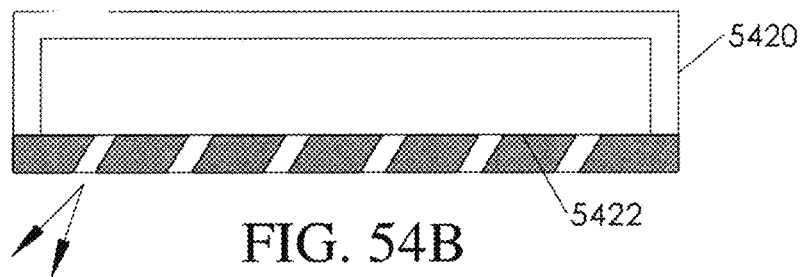
FIG. 54B depicts a side view of a recycling light source with a holey light transmitting thermally conductive element and a reflector.
Figure 54C:
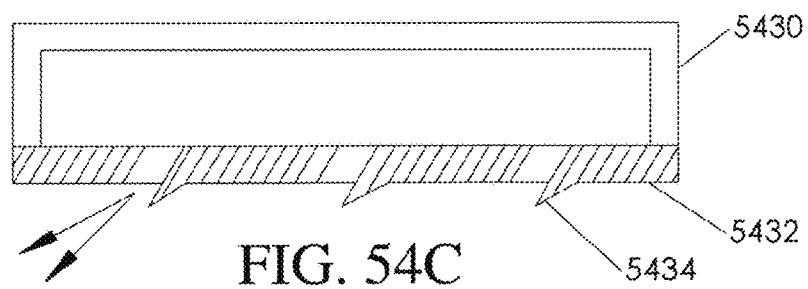
FIG. 54C depicts a side view of a recycling light source with a holey light transmitting thermally conductive element and a reflector.

FIG. 54B depicts a recycling light source consisting a holey light transmitting thermally conductive element 5422 and a reflector 5420 where the holes in the holey light transmitting thermally conductive element 5422 are not perpendicular to the light emitting surface of the holey light transmitting thermally conductive element 5422. FIG. 54C depicts a recycling light source consisting of a holey light transmitting thermally conductive element 5432 and a reflector 5430. Additional turning element 5434 may be formed when the holes are formed in the holey light transmitting thermally conductive element 5432 or be attached or adhered such that the holes within holey light transmitting thermally conductive element 5432 are substantially aligned with additional turning element 5434.

Figure 55:
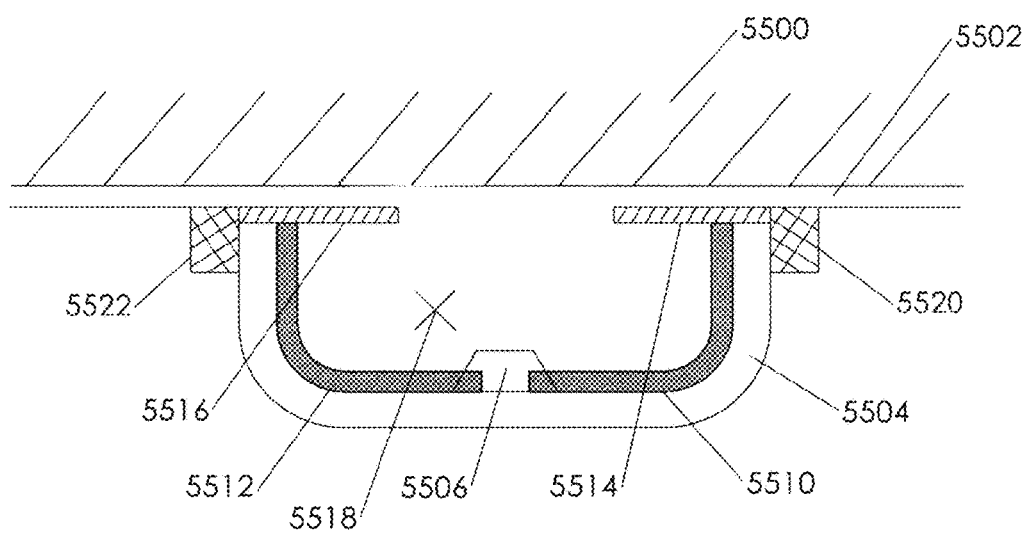
FIG. 55 depicts a side view of a shaped light transmitting thermally conductive element which can be attached to a flat or non-flat reflective mounting surface.

FIG. 55 depicts a compound shaped light transmitting thermally conductive element 5504 which can be attached to a flat or non-flat reflective mounting surface. The mounting surface 5500 may be reflective and may or may not be ferromagnetic or magnetic. Optional reflective layer 5502 may be used to enhance the efficiency of the light recycling cavity 5518. Because the shaped light transmitting thermally conductive element 5504 dissipates substantially all the heat generated by LED package 5506 there is no need for further heatsinking means. Interconnect 5510 and 5512 formed on the shaped light transmitting thermally conductive element 5504 make contact to conductors 5514 and 5516 respectively. Conductors 5514 and 5516 may be metals, TCOs, or other conductive materials. If the mounting surface 5500 is ferromagnetic or magnetic, magnetic mounts 5520 and 5522 may be used to not only bring interconnect 5510 and 5512 together with conductors 5514 and 5516 but also hold the light source physically to the mounting surface 5500. Alternately, electrical connection may be via pins, clips, conductive Velcro, springs, screws, nails or other mechanical means. A preferred material for conductor 5514 and 5516 is patterned ITO or other TCO with low optical absorption to the light emitted by LED package 5506 such that the light recycling cavity 5518. The reflective layer 5502 may be a glass sheet with patterned ITO or other TCO on the surface forming the inner surface of the light recycling cavity 5518 with a reflective coating on the glass surface against the mounting surface 5500.

Figure 56:
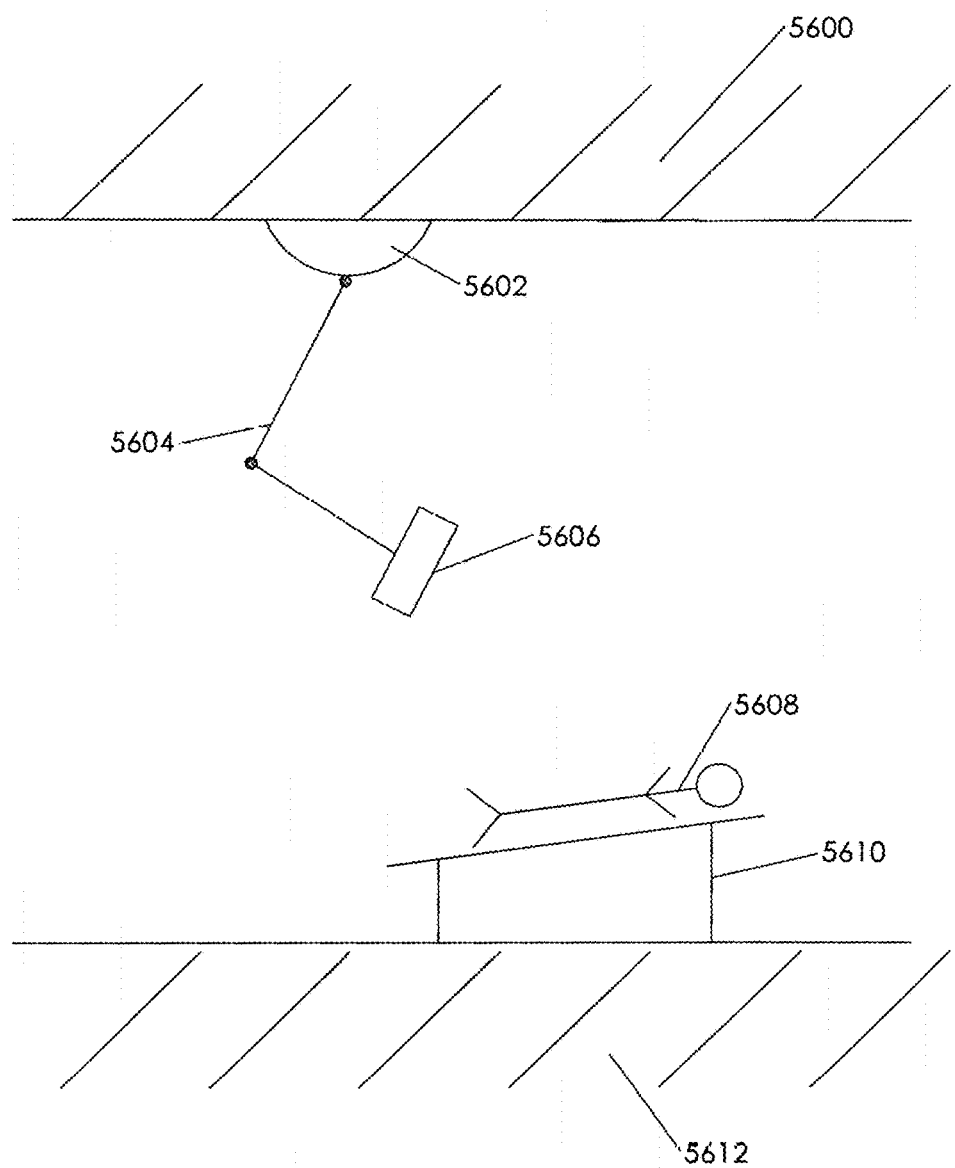
FIG. 56 depicts a side view of a gimbaled self cooling light source.

FIG. 56 depicts a gimbal 5604 supporting a self cooling lightweight recycling light source 5606 suspended from a ceiling 5600 or some other mounting surface using a mount 5602. In this case the gimbal 5604 and mount 5602 are greatly simplified and can be much lighter due the lightweight nature of the self cooling lightweight recycling light source 5606. The patient 5608 on the table 5610 can be more easily examined. The light source may be mounted to a variety of surfaces including the floor 5612. In general, the lightweight greater than 50 lumens per gram and high output level of this approach allows for the delivery of lighting into a number of weight critical lighting applications including but not limited to, mobile, aircraft, automobile, motorcycle, bicycle, and other applications in which weight is critical. The substantially inorganic construction of this approach also provides benefits associated with environmental resistance, color fastness, and non-flammability. Unlike substantially organic approaches such as troffer with large plastic diffusers and polymeric waveguides approach are intrinsically heavy and susceptible to photochemical degradation from both sunlight and the UV/blue portion of the light emitted from the LEDs themselves.

Figure 57:
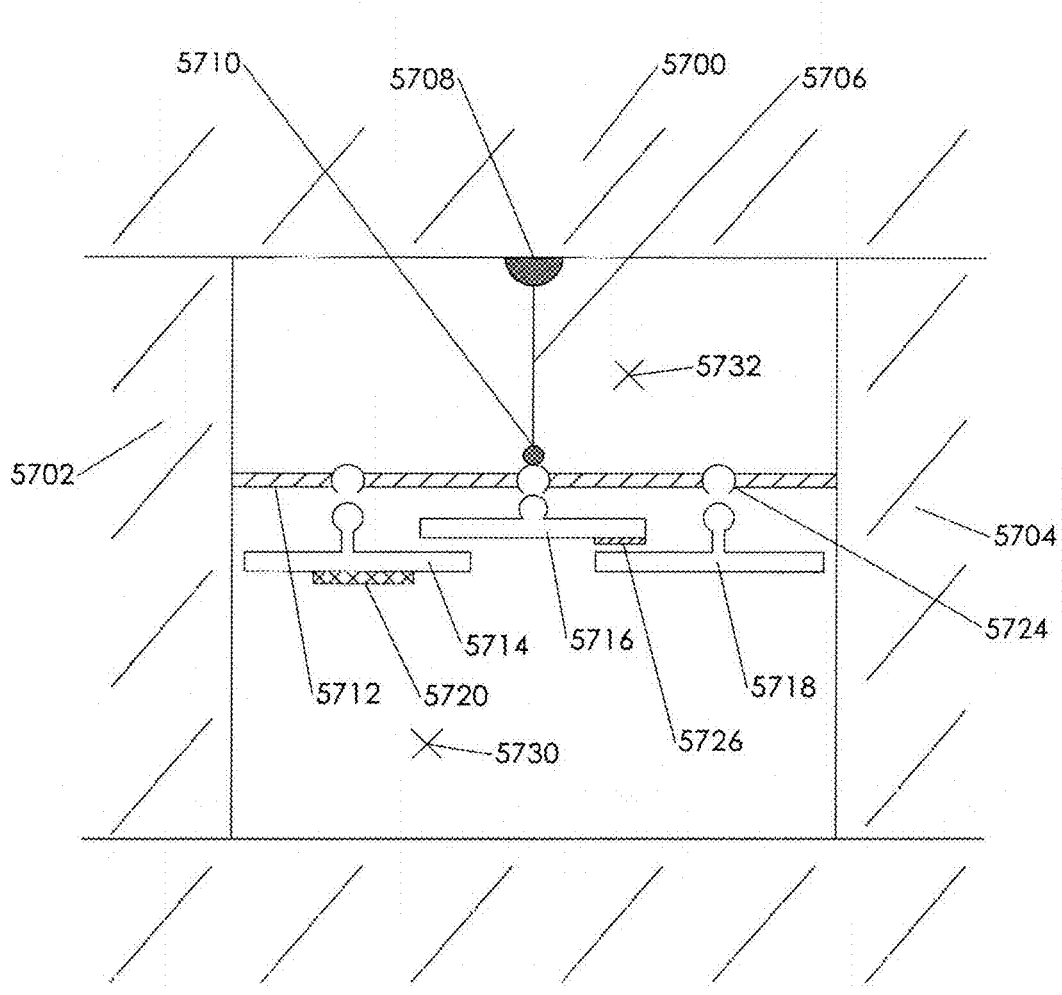
FIG. 57 depicts a side view of a centrally support barrier system with barrier elements.

FIG. 57 depicts a barrier consisting of at least one support grid element 5712 supporting at least one central attachment point devices 5724 to the walls 5702 and 5704. The at least one support grid element 5712 may alternately be attached to the deck 5700 or floor 5722 as well depending on the orientation of the barrier. The barrier assembly may additionally have support wire 5706 which is anchored to the deck 5700 using mount 5708 and attached to either a central attachment point device 5724 or a support grid element 5712. The reduced weight associated with the use of self cooling lighting sources 5720 allows for the use of substantially centrally supported barrier elements 5714. Using a substantially central mounting approach it becomes possible to layer or stack the barrier elements 5714, 5716, and 5718. Layering allows lighting to be hidden behind barrier elements as shown in barrier elements 5716 and light source 5726. The layered or stacked ceiling tiles 5714, 5716, and 5718 can be used to conceal lighting and other functions previously disclosed. As long as there is sufficient air gap allowed between barrier elements 5714, 5716, and 5718, air can flow between occupant side 5730 and plenum side 5732. The centrally supported barrier elements 5714, 5716, and 5718 may attach to central attachment point device 5724 via Velcro, mechanical means, clips, screws, snaps or locking mechanisms. Most preferably, centrally supported barrier elements 5714, 5716, and 5718 are attached using a mounting means which is not visible from occupant side 5730. This embodiment can be used as a very effective acoustical dampening ceiling due to sound waves being trapped in the plenum side 5732.

Alternately, centrally supported barrier elements 5714, 5716 and 5718 may be substantially in the same plane such that a monolithic surface is formed. The centrally supported barrier elements 5714, 5716, and 5718 may also have edges which interlock, snap together or otherwise attach to each other. In general, the lightweight nature of the self cooling light sources 5720 and 5726 enables support grid element 5712, central attachment point device 5724, and centrally supported barrier elements 5714, 5716, and 5718 to be lighter weight and lower cost materials. As previously disclosed the self cooling light sources 5720 and 5726 are light recycling cavity light sources or light recycling cavity elements which are integrated into centrally supported barrier elements 5714 and 5716 respectively.

The invention claimed is:

1. A barrier with lighting comprising:
   at least one barrier element with at least one light source wherein
   said at least one light source is comprised of:
      at least one reflector element,
      at least one light emitting diode, and
      at least one light scattering and partially reflective light transmitting thermally conductive element,
   wherein said at least one light scattering and partially reflective light transmitting thermally conductive element provides a common light emitting and cooling surface to dissipate the heat from the light source whereby most of the heat generated by the at least one LED is dissipated by the light emitting surface of the light scattering light transmitting thermally conductive element, and wherein generally the light from said at least one light emitting diode is transmitted through the said at least one light scattering and partially reflective light transmitting thermally conductive element such that said light source has a uniform and monolithic appearance.

2. The barrier of claim 1 wherein the barrier forms a substantially contiguous suspended ceiling comprised of at least one ceiling tile and at least one supporting grid which supports said at least one ceiling tile wherein said light sources are mounted directly to the supporting grid of the suspended ceiling.

3. The barrier of claim 1 wherein the barrier forms a substantially contiguous suspended ceiling comprised of at least one ceiling tile and at least one supporting grid wherein said at least one light source is integrated into the at least one ceiling tile.

4. The barrier of claim 1 wherein said light source includes at least one wavelength conversion element contained within a light recycling cavity formed by said at least one reflector element and said at least one light transmitting thermally conductive element.

5. The barrier of claim 1 wherein all components of said barrier and said light source are non-flammable whereby the entire barrier is non-flammable and forms a contiguous fire barrier.

6. The barrier of claim 1 wherein the heat generated by said light source is dissipated into one side of the barrier.

7. The barrier of claim 2 wherein the total weight of all the light sources, reflectors, and heat sink is less than one gram per square foot yet provides greater than 30 lumens per square foot of illumination throughout the illuminated area.

8. The barrier of claim 1 wherein the barrier and light sources form an acoustical barrier.

9. The barrier of claim 1 further comprising at least one thermally conductive decorative overlay in thermal contact with said light transmitting thermally conductive elements.

10. The barrier of claim 2 further comprising push pin contacts for mounting said at least one light source to the said at least one ceiling tile.

11. The barrier of claim 1 wherein the entire barrier surface is covered with a light transmitting thermally conductive scrim layer.

12. The barrier of claim 7 wherein the barrier plus lighting is seismically certifiable.

13. The barrier of claim 1 further comprising at least one of the following functions integrated into or on the said light transmitting thermally conductive element; audio emitter, camera, infrared camera, RF emitter, RF sensor, and temperature sensors.

14. The barrier of claim 2 wherein the light sources can be easily detached and reattached to the conventional and unmodified grid structure without disturbing said ceiling tiles.

* * * * *